US011656548B2

United States Patent
Tsuchimura et al.

(10) Patent No.: US 11,656,548 B2
(45) Date of Patent: May 23, 2023

(54) ACTINIC RAY-SENSITIVE OR RADIATION-SENSITIVE RESIN COMPOSITION, RESIST FILM, PATTERN FORMING METHOD, MASK BLANK WITH RESIST FILM, METHOD FOR PRODUCING PHOTOMASK, AND METHOD FOR MANUFACTURING ELECTRONIC DEVICE

(71) Applicant: FUJIFILM Corporation, Tokyo (JP)

(72) Inventors: Tomotaka Tsuchimura, Haibara-gun (JP); Takashi Kawashima, Haibara-gun (JP); Akihiro Kaneko, Haibara-gun (JP); Michihiro Ogawa, Haibara-gun (JP); Michihiro Shirakawa, Haibara-gun (JP); Hajime Furutani, Haibara-gun (JP); Kyohei Sakita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 299 days.

(21) Appl. No.: 16/905,566

(22) Filed: Jun. 18, 2020

(65) Prior Publication Data
US 2020/0319551 A1 Oct. 8, 2020

Related U.S. Application Data

(63) Continuation of application No. PCT/JP2018/040207, filed on Oct. 30, 2018.

(30) Foreign Application Priority Data

Dec. 22, 2017 (JP) .............................. JP2017-246971

(51) Int. Cl.
*G03F 7/004* (2006.01)
*C08F 220/18* (2006.01)
(Continued)

(52) U.S. Cl.
CPC .......... *G03F 7/0045* (2013.01); *C08F 212/24* (2020.02); *C08F 220/1804* (2020.02);
(Continued)

(58) Field of Classification Search
CPC .......... G03F 1/22; G03F 7/004; G03F 7/0392; G03F 7/0397; C08F 220/1807;
(Continued)

(56) References Cited

U.S. PATENT DOCUMENTS 9,996,003 B2 * 6/2018 Goto .................. G03F 7/38
10,018,913 B2 * 7/2018 Goto .................. G03F 7/004
(Continued)

FOREIGN PATENT DOCUMENTS

CN 110537148 A 12/2019
EP 1645554 A1 4/2006
(Continued)

OTHER PUBLICATIONS

Communication dated Jan. 26, 2021, from the European Patent Office in European Application No. 18893237.0.
Communication dated Mar. 11, 2022, issued by the Korean Intellectual Property Office in application No. 10-2020-7017589.
Communication dated Jan. 28, 2022 from the Taiwanese Patent Office in Taiwanese Application No. 107139608.
Communication dated May 25, 2021, from the Japanese Patent Office in application No. 2019560847.
International Search Report dated Jan. 15, 2019 from the International Searching Authority in International Application No. PCT/JP2018/040207.
(Continued)

*Primary Examiner* — Amanda C. Walke
(74) *Attorney, Agent, or Firm* — Sughrue Mion, PLLC

(57) ABSTRACT

The present invention provides an actinic ray-sensitive or radiation-sensitive resin composition that can provide a resist film with excellent sensitivity and a pattern with excellent LER performance, and can suppress pattern collapse during pattern formation. In addition, the present invention also provides a resist film, a pattern forming method, a mask blank with a resist film, a method for producing a photomask, and a method for manufacturing an electronic device, each using the actinic ray-sensitive or radiation-sensitive resin composition. The actinic ray-sensitive or radiation-sensitive resin composition of an embodiment of the present invention includes a resin X having a repeating unit A represented by General Formula (I), a repeating unit B having an acid-decomposable group, and a repeating unit C selected from a repeating unit c1 represented by General Formula (II) and the like; a compound Y which is a basic compound or ammonium salt compound whose basicity is reduced upon irradiation with actinic rays or radiation; and a photoacid generator Z which is a compound other than the compound Y.

21 Claims, No Drawings

(51) Int. Cl.
*C08F 220/28* (2006.01)
*C08F 212/14* (2006.01)
*G03F 1/22* (2012.01)
*G03F 7/038* (2006.01)
*G03F 7/039* (2006.01)
*G03F 7/20* (2006.01)

(52) U.S. Cl.
CPC .. *C08F 220/1806* (2020.02); *C08F 220/1811* (2020.02); *C08F 220/281* (2020.02); *C08F 220/282* (2020.02); *G03F 1/22* (2013.01); *G03F 7/038* (2013.01); *G03F 7/039* (2013.01); *G03F 7/2004* (2013.01); *G03F 7/2037* (2013.01)

(58) Field of Classification Search
CPC .......... C08F 220/1806; C08F 220/1805; C08F 220/1808; C08F 220/1809; C08F 220/1812
See application file for complete search history.

(56) References Cited

U.S. PATENT DOCUMENTS

| | | | |
|---|---|---|---|
| 10,023,674 B2 * | 7/2018 | Sagehashi | G03F 7/0388 |
| 10,303,052 B2 * | 5/2019 | Hatakeyama | G03F 7/0382 |
| 10,968,175 B2 * | 4/2021 | Hatakeyama | C08F 220/18 |
| 11,156,916 B2 * | 10/2021 | Hatakeyama | G03F 7/168 |
| 2005/0227173 A1 | 10/2005 | Hatakeyama et al. | |
| 2007/0184384 A1 * | 8/2007 | Kawanishi | G03F 7/0392 430/270.1 |
| 2009/0208873 A1 | 8/2009 | Harada et al. | |
| 2011/0269072 A1 | 11/2011 | Shibuya | |
| 2013/0095427 A1 * | 4/2013 | Yahagi | G03F 7/2059 430/281.1 |
| 2013/0101936 A1 | 4/2013 | Taniguchi et al. | |
| 2013/0189620 A1 | 7/2013 | Suka et al. | |
| 2017/0210836 A1 * | 7/2017 | Domon | G03F 7/0045 |
| 2017/0355795 A1 * | 12/2017 | Hatakeyama | G03F 7/0382 |
| 2018/0039173 A1 * | 2/2018 | Hatakeyama | C07C 309/17 |
| 2020/0050106 A1 | 2/2020 | Shirakawa et al. | |

FOREIGN PATENT DOCUMENTS

| | | | |
|---|---|---|---|
| EP | 3081988 A1 * | 10/2016 | ........... C07C 381/12 |
| EP | 3614206 A1 | 2/2020 | |
| JP | 2005-321765 A | 11/2005 | |
| JP | 2009-191151 A | 8/2009 | |
| JP | 2009-223294 A | 10/2009 | |
| JP | 2011-203646 A | 10/2011 | |
| JP | 2012-137686 A | 7/2012 | |
| JP | 2013-088572 A | 5/2013 | |
| JP | 2013-092590 A | 5/2013 | |
| JP | 2013-151592 A | 8/2013 | |
| TW | 201207557 A1 | 2/2012 | |

OTHER PUBLICATIONS

International Preliminary Report on Patentability dated Jun. 23, 2020 from the International Bureau in International Application No. PCT/JP2018/040207.
Written Opinion dated Jan. 15, 2019 from the International Bureau in International Application No. PCT/JP2018/040207.
Notice of Reasons for Refusal dated Dec. 14, 2021 from the Japanese Patent Office in JP Application No. 2019-560847.
Office Action dated Sep. 2, 2022 issued by the Taiwanese Patent Office in Taiwanese Application No. 107139608.
Office Action dated Sep. 23, 2022 issued by the Korean Patent Office in Korean Application No. 10-2020-7017589.
Office Action dated Jul. 19, 2022 issued by the Japanese Patent Office in Japanese Application No. 2019-560847.
Office Action dated Jan. 25, 2023 from the Korean Intellectual Property Office in KR Application No. 10-2020-7017589.
Office Action dated Dec. 21, 2022 in Chinese Application No. 201880082630.4.

* cited by examiner

ACTINIC RAY-SENSITIVE OR RADIATION-SENSITIVE RESIN COMPOSITION, RESIST FILM, PATTERN FORMING METHOD, MASK BLANK WITH RESIST FILM, METHOD FOR PRODUCING PHOTOMASK, AND METHOD FOR MANUFACTURING ELECTRONIC DEVICE

CROSS-REFERENCE TO RELATED APPLICATIONS

This application is a Continuation of PCT International Application No. PCT/JP2018/040207 filed on Oct. 30, 2018, which claims priority under 35 U.S.C. § 119(a) to Japanese Patent Application No. 2017-246971 filed on Dec. 22, 2017. The above application is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, a mask blank with a resist film, a method for producing a photomask, and a method for manufacturing an electronic device.

2. Description of the Related Art

In processes for manufacturing semiconductor devices such as an integrated circuit (IC) and a large scale integrated circuit (LSI) in the related art, microfabrication by lithography using an actinic ray-sensitive or radiation-sensitive resin composition has been performed. In recent years, formation of an ultrafine pattern in a submicron region or a quarter-micron region has been demanded in accordance with realization of a high degree of integration for integrated circuits. With such a demand, an exposure wavelength has been shifted from g-rays to i-rays, and further, as with KrF excimer laser light, the exposure wavelength becomes shorter. Moreover, developments in lithography with electron beams, X-rays, or extreme ultraviolet rays (EUV), in addition to the excimer laser light, have also been currently proceeding.

As an actinic ray-sensitive or radiation-sensitive resin composition, for example, a resist material containing a polymer compound having each of repeating units represented by General Formulae (1a), (2a), and (1b) is disclosed in JP2005-321765A.

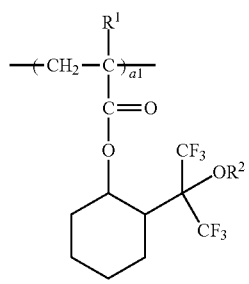

(1a)

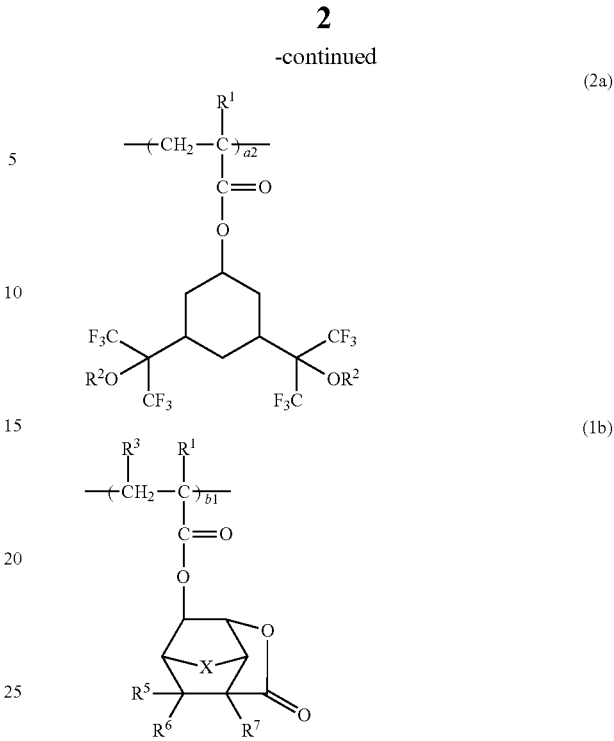

SUMMARY OF THE INVENTION

The present inventors have studied the technology disclosed in JP 2005-321765A, and as a result, a sensitivity of a resist film obtained to exposure has not reached a standard currently required. Further, improvement of line edge roughness (LER) performance of a pattern thus obtained and pattern collapse suppressing performance during pattern formation have also been needed.

Therefore, the present invention has an object to provide an actinic ray-sensitive or radiation-sensitive resin composition that can provide a resist film with excellent sensitivity and a pattern with excellent LER performance, and can suppress pattern collapse during pattern formation.

In addition, the present invention has another object to provide a resist film, a pattern forming method, a mask blank with a resist film, a method for producing a photomask, and a method for manufacturing an electronic device, each using the actinic ray-sensitive or radiation-sensitive resin composition.

The present inventors have conducted intensive studies to achieve the objects, and as a result, they have found that by incorporating a resin X having a predetermined repeating unit, a compound Y which is a basic compound or ammonium salt compound whose basicity is reduced upon irradiation with actinic rays or radiation, and a photoacid generator Z which is a compound other than the compound Y into an actinic ray-sensitive or radiation-sensitive resin composition, the problems can be solved, thereby completing the present invention.

More specifically, the present inventors have found that the above-described objects can be achieved with the following configurations.

[1] An actinic ray-sensitive or radiation-sensitive resin composition comprising a resin X having a repeating unit A represented by General Formula (I), a repeating unit B having an acid-decomposable group, and a repeating unit C selected from the group consisting of a repeating unit c1 represented by General Formula (II), a repeating unit c2 represented by General Formula (III), a repeating unit c3 having a carbonate ring group, and a repeating unit c4 having an anhydride ring group; a compound Y which is a basic compound or ammonium salt compound whose basicity is reduced upon irradiation with actinic rays or radiation; and a photoacid generator Z which is a compound other than the compound Y.

[2] The actinic ray-sensitive or radiation-sensitive resin composition as described in [1], in which in General Formula (I) described later, n represents an integer of 2 or greater.

[3] The actinic ray-sensitive or radiation-sensitive resin composition as described in [1] or [2], in which in General Formula (I) described later, J represents an (n+1)-valent group having an alicyclic group.

[4] The actinic ray-sensitive or radiation-sensitive resin composition as described in any one of [1] to [3], in which the repeating unit A is a repeating unit represented by General Formula (I-a) described later.

[5] The actinic ray-sensitive or radiation-sensitive resin composition as described in any one of [1] to [4], in which a content of the repeating unit A is 20% by mass or more with respect to a total mass of the resin X.

[6] The actinic ray-sensitive or radiation-sensitive resin composition as described in any one of [1] to [5], in which the repeating unit B has a group represented by any of General Formulae (B-a) to (B-c) described later.

[7] The actinic ray-sensitive or radiation-sensitive resin composition as described in any one of [1] to [6], in which in General Formula (II) described later, T represents a group represented by any of General Formula (II-a) to (II-c) described later.

[8] The actinic ray-sensitive or radiation-sensitive resin composition as described in any one of [1] to [7], in which the resin X has a repeating unit selected from the group consisting of a repeating unit represented by General Formula (II-1) described later and a repeating unit represented by General Formula (II-2) in General Formula (I) described later.

[9] The actinic ray-sensitive or radiation-sensitive resin composition as described in any one of [1] to [8], in which the resin X has a dispersity of 1.0 to 1.5.

[10] The actinic ray-sensitive or radiation-sensitive resin composition as described in any one of [1] to [9], in which a total content of the repeating unit A, the repeating unit B, and the repeating unit C is more than 90% by mass with respect to a total mass of the resin X.

[11] The actinic ray-sensitive or radiation-sensitive resin composition as described in any one of [1] to [10], in which the compound Y generates an acid with a pka of 1.00 to 4.50 upon irradiation with actinic rays or radiation.

[12] The actinic ray-sensitive or radiation-sensitive resin composition as described in any one of [1] to [11], in which the actinic ray-sensitive or radiation-sensitive resin composition comprises two or more kinds of the photoacid generators Z.

[13] The actinic ray-sensitive or radiation-sensitive resin composition as described in any one of [1] to [12], in which a content of the photoacid generator Z whose volume of the generated acid is 240 Å$^3$ or more is 60% to 100% by mass with respect to a total mass of the photoacid generator Z in the actinic ray-sensitive or radiation-sensitive resin composition.

[14] The actinic ray-sensitive or radiation-sensitive resin composition as described in any one of [1] to [13], in which the compound Y generates an acid upon irradiation with actinic rays or radiation, and a difference between a pka of an acid generated by the compound Y and a pka of an acid generated by the photoacid generator Z is 3.00 or greater.

[15] The actinic ray-sensitive or radiation-sensitive resin composition as described in any one of [1] to [14], in which the actinic ray-sensitive or radiation-sensitive resin composition is used for electron beam or extreme ultraviolet exposure.

[16] A resist film formed using the actinic ray-sensitive or radiation-sensitive resin composition as described in any one of [1] to [15].

[17] The resist film as described in [16], in which the resist film has a film thickness of 10 to 100 nm.

[18] A pattern forming method comprising a step of forming a resist film using the actinic ray-sensitive or radiation-sensitive resin composition as described in any one of [1] to [15]; a step of exposing the resist film; and a step of developing the exposed resist film using a developer.

[19] The pattern forming method as described in [18], in which the exposure is performed using electron beams or extreme ultraviolet rays.

[20] A mask blank with a resist film, comprising a mask blank; and the resist film as described in [16] or [17] disposed on the mask blank.

[21] A method for producing a photomask, comprising: a step of exposing the mask blank with a resist film as described in [20]; and a step of developing the exposed mask blank with a resist film using a developer.

[22] A method for manufacturing an electronic device, comprising the pattern forming method as described in [18] or [19].

According to the present invention, it is possible to provide an actinic ray-sensitive or radiation-sensitive resin composition which can provide a resist film having excellent sensitivity and a pattern having excellent LER performance, and can suppress pattern collapse during pattern formation.

Furthermore, the present invention can provide a resist film, a pattern forming method, a mask blank with a resist film, a method for producing a photomask, and a method for manufacturing an electronic device, each using the actinic ray-sensitive or radiation-sensitive resin composition.

DESCRIPTION OF THE PREFERRED
EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV rays), X-rays, electron beams (EB), or the like. "Light" in the present specification means actinic rays or radiation.

"Exposure" in the present specification encompasses, unless otherwise specified, not only exposure by a bright line spectrum of a mercury lamp, far ultraviolet rays typified by an excimer laser, X-rays, EUV, or the like, but also writing by particle rays such as electron beams and ion beams.

In the present specification, a numerical value range expressed using "to" is used to mean a range that includes the preceding and succeeding numerical values of "to" as the lower limit value and the upper limit value, respectively.

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

In the present specification, in a case where there are a plurality of substituents, linking groups, and the like (hereinafter referred to as a substituent and the like) represented by specific symbols, or in a case where a plurality of substituents and the like are simultaneously defined, such the case means that the respective substituents may be the same as or different from each other. The same also applies to the definition of the number of substituents and the like.

An acid dissociation constant pka indicates an acid dissociation constant pka in an aqueous solution and is defined, for example, in Chemical Handbook (II) (4th revised edition, 1993, edited by The Chemical Society of Japan, Maruzen Co., Ltd.). A lower value of the acid dissociation constant pka indicates higher acid strength. Specifically, the acid dissociation constant pka in an aqueous solution can be determined by measurement at 25° C. using an infinite-dilution aqueous solution and measuring the acid dissociation constant. Alternatively, a value based on a database of Hammett's substituent constants and known literature values can be determined by calculation using the following software package 1. Any of the values of a pka described in the present specification represent values determined by calculation using the software package.

Software package 1: Advanced Chemistry Development (ACD/Labs) Software V11.02 (1994-2013 ACD/Labs).

In the present specification, a weight-average molecular weight (Mw), a number-average molecular weight (Mn), and a dispersity (also referred to as a molecular weight distribution) (Mw/Mn) of a resin are defined as values in terms of polystyrene by means of gel permeation chromatography (GPC) measurement (solvent: tetrahydrofuran, flow amount (amount of a sample injected): 10 µL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

1 Å is $1 \times 10^{-10}$ m.

Furthermore, in the present specification, in a case of referring to an expression that "a substituent may be contained" or of "having a substituent", the types of substituents, the positions of the substituents, and the number of the substituents are not particularly limited. The number of the substituents may be, for example, one, two, three, or more. Examples of the substituent include a monovalent non-metal atomic group except for a hydrogen atom, and the substituent can be selected from, for example, the following substituent T.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

[Resist Composition]

The actinic ray-sensitive or radiation-sensitive resin composition of the embodiment of the present invention (hereinafter also referred to as a "resist composition") may include a resin X having predetermined repeating units A to C, a compound Y which is a basic compound or ammonium salt compound whose basicity is reduced upon irradiation with actinic rays or radiation, and a photoacid generator Z which is a compound other than the compound Y.

A mechanism by which the problems of the present invention have been solved by using such a resist composition is not always clear, but the present inventors have presumed that the sensitivity to exposure and the solubility in a developer of a resist film formed with the resist composition of the embodiment of the present invention are excellent in a good balance, and as a result, the problems of the present invention can be solved.

Hereinafter, the components included in the resist composition of the embodiment of the present invention will be described in detail. Furthermore, the resist composition of the embodiment of the present invention may be either a positive-tone resist composition or a negative-tone resist composition. In addition, the resist composition of the embodiment of the present invention may be either a resist composition for alkali development or a resist composition for organic solvent development. Among those, the positive-tone resist composition which is the resist composition for alkali development is preferable.

The resist composition of the embodiment of the present invention is typically a chemically amplified resist composition.

The resist composition of the embodiment of the present invention is preferably used for electron beam (EB) or extreme ultraviolet (EUV) exposure.

<Resin X>

The resist composition of the embodiment of the present invention includes a resin X.

The resin X is a resin having a repeating unit A represented by General Formula (I), a repeating unit B having an acid-decomposable group, and a repeating unit C selected from the group consisting of a repeating unit c1 represented by General Formula (II), a repeating unit c2 represented by General Formula (III), a repeating unit c3 having a carbonate ring group, and a repeating unit c4 having an anhydride ring group.

(Repeating Unit A)

The resin X has a repeating unit A represented by General Formula (I).

The repeating unit A has a hexafluoro-2-propanol group ($-C(CF_3)_2OH$).

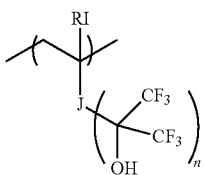

(I)

In General Formula (I), R represents a hydrogen atom or a monovalent organic group.

As the monovalent organic group represented by RI, $CH_3$, $CF_3$, or $CH_2OH$ is preferable, and $CH_3$ is more preferable.

n represents an integer of 1 or greater.

n preferably represents an integer of 2 or greater, more preferably represents an integer of 2 to 5, and still more preferably represents 2.

J represents a (n+1)-valent linking group.

J preferably represents, for example, an (n+1)-valent group having an alicyclic group.

Furthermore, J is preferably a linking group represented by $*1\text{-}J^a\text{-}J^b(\text{-}J^c\text{-}*2)_n$.

In $*1\text{-}J^a\text{-}J^b(\text{-}J^c\text{-}*2)_n$, n has the same meaning as n described above.

*1 represents a bonding position to a carbon atom to which R in General Formula (I) is bonded.

*2 represents a bonding position with the hexafluoro-2-propanol group in General Formula (I).

$J^a$ represents a single bond or a divalent linking group.

Examples of the divalent linking group include an ester group (—COO—), an ether group (—O—), a carbonyl group (—CO—), a thioether group (—S—), —$SO_2$—, —$NR^N$— ($R^N$ represents a hydrogen atom or an alkyl group), a divalent hydrocarbon group (preferably having 1 to 10 carbon atoms, with examples thereof including an alkylene group, an alkenylene group (for example, —CH=CH—), and an alkynylene group (for example, —C≡C—)), and a group formed by combining these groups.

Among those, $J^a$ is preferably the single bond or the ester group.

$J^b$ represents a (n+1)-valent linking group.

Examples of the (n+1)-valent linking group include, in addition to the groups listed as the divalent linking group, an (n+1)-valent aromatic hydrocarbon group (which preferably has 6 to 15 carbon atoms and may be a monocycle or a polycycle), an (n+1)-valent alicyclic group (which preferably has 5 to 15 carbon atoms and may be a monocycle or a polycycle), an (n+1)-valent aromatic heterocyclic group, and an (n+1)-valent non-aromatic heterocyclic group.

Among those, $J^b$ is preferably the (n+1)-valent benzene ring group or the (n+1)-valent alicyclic group, and more preferably the alicyclic group (preferably having 5 to 7 carbon atoms).

$J^c$ represents a single bond or a divalent linking group.

Examples of the divalent linking group represented by $J^c$ include the same groups as the examples of the divalent linking group represented by $J^a$.

Among those, $J^c$ is preferably the single bond or an alkylene group (preferably having 1 carbon atom).

Among those, J is preferably a group represented by the following formula.

In the formula, the meanings of n, *1, and *2 are as described above.

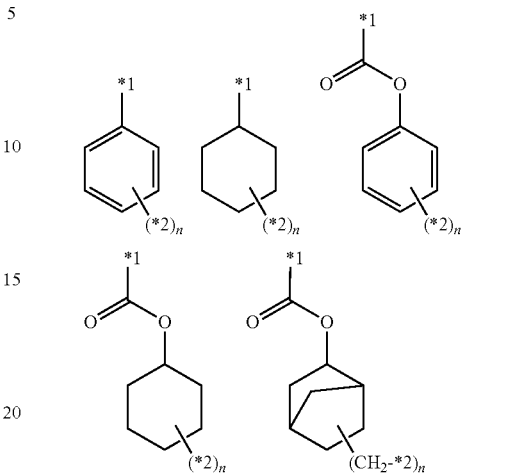

Among those, the repeating unit A is preferably a repeating unit represented by General Formula (I-a).

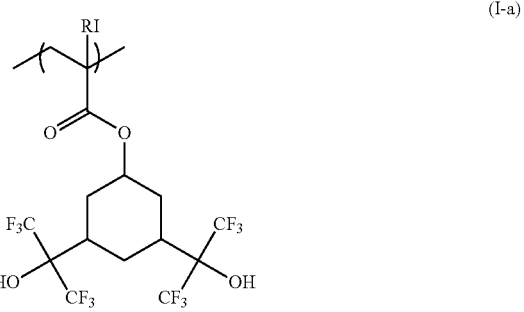

(I-a)

In General Formula (I-a), RI represents a hydrogen atom or a monovalent organic group.

As the monovalent organic group represented by RI, $CH_3$, $CF_3$, or $CH_2OH$ is preferable, and $CH_3$ is more preferable.

Hereinafter, the repeating unit A or a monomer corresponding to the repeating unit A will be exemplified.

In the following examples, Rc represents a hydrogen atom, $CH_3$, $CF_3$, or $CH_2OH$.

In the monomers in the following examples, a methyl group bonded to a vinyl group may be substituted with a hydrogen atom, $CF_3$, or $CH_2OH$.

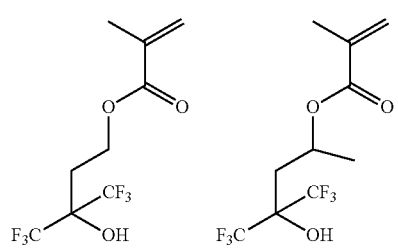

-continued
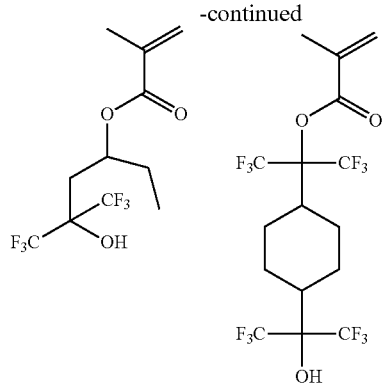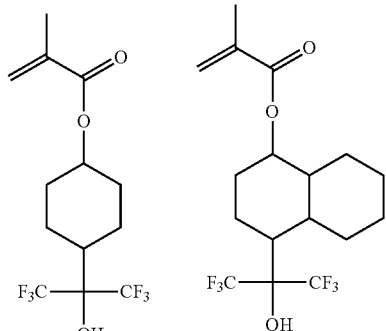
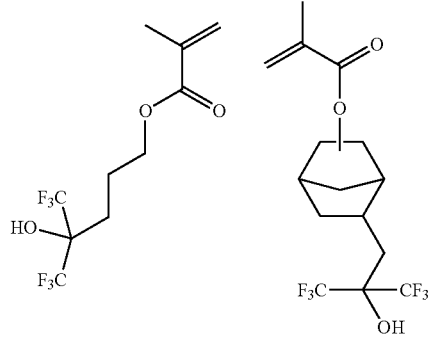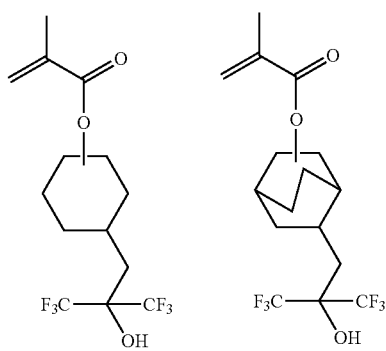
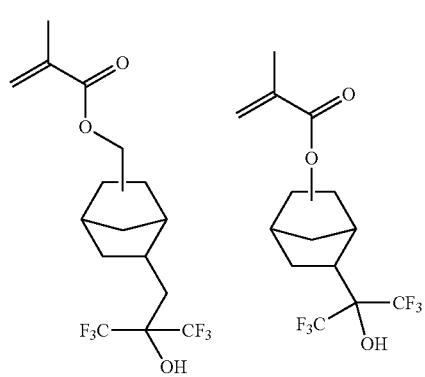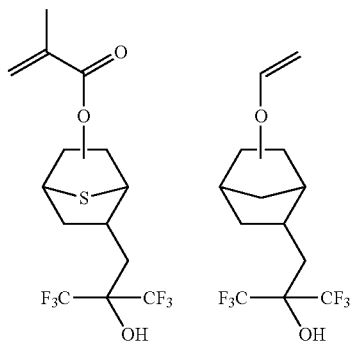
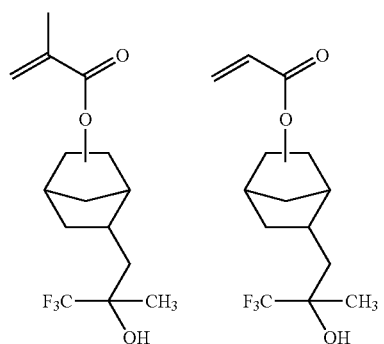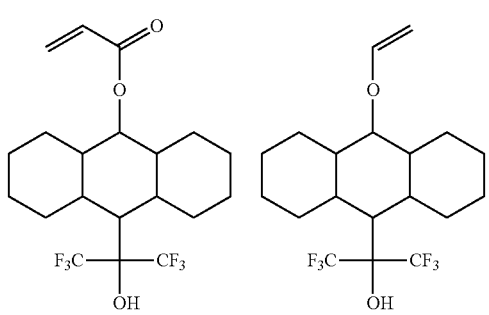

-continued
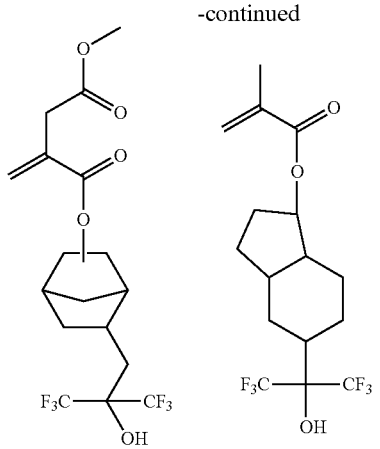
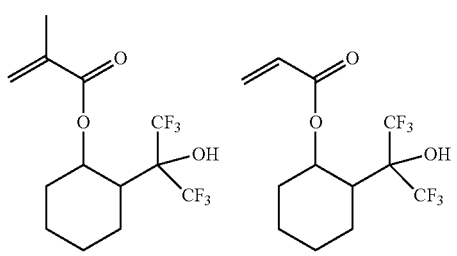
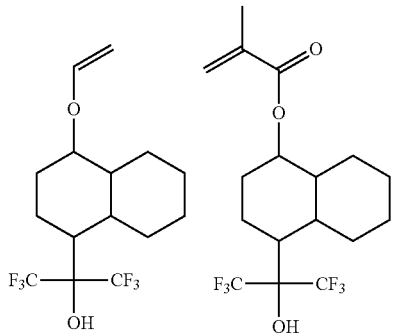
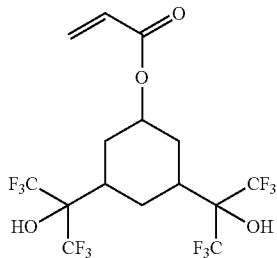
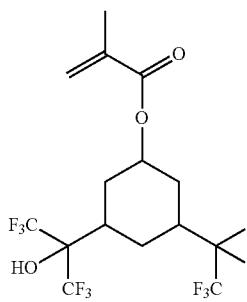
-continued
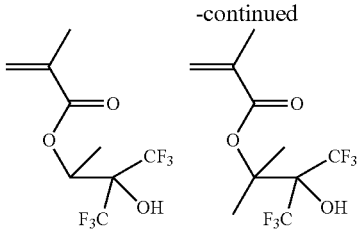
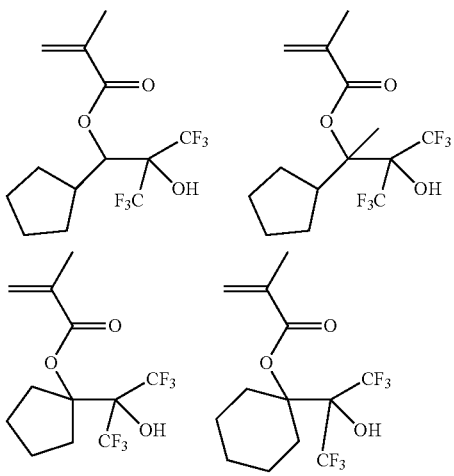
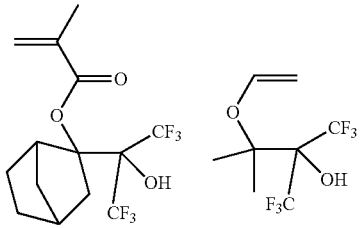
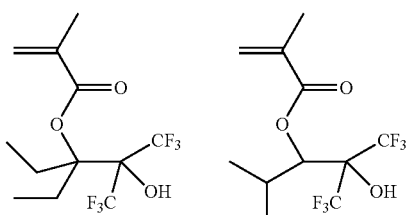
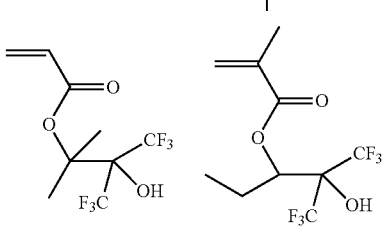
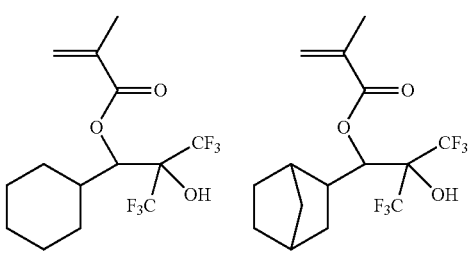

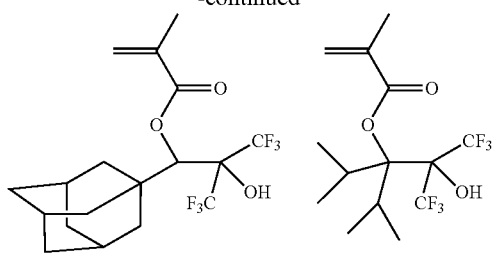
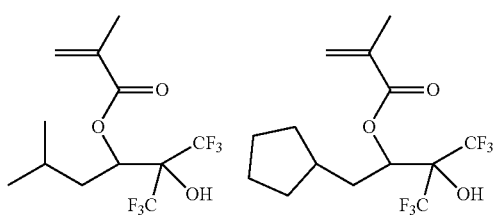
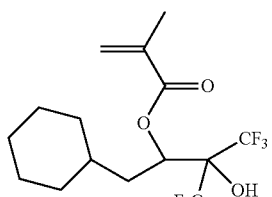
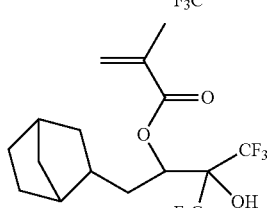
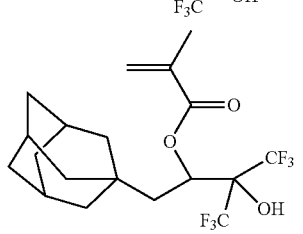
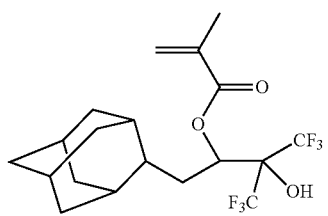
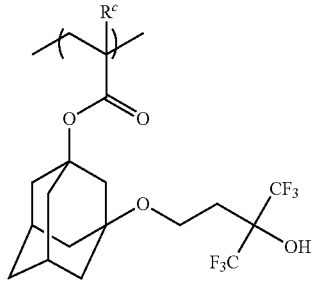

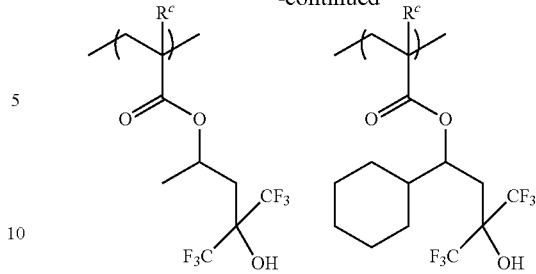
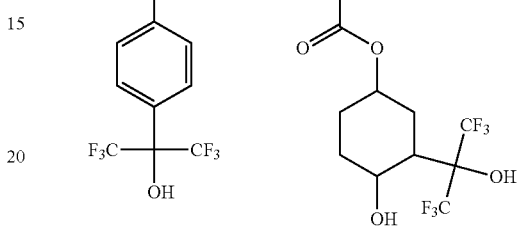
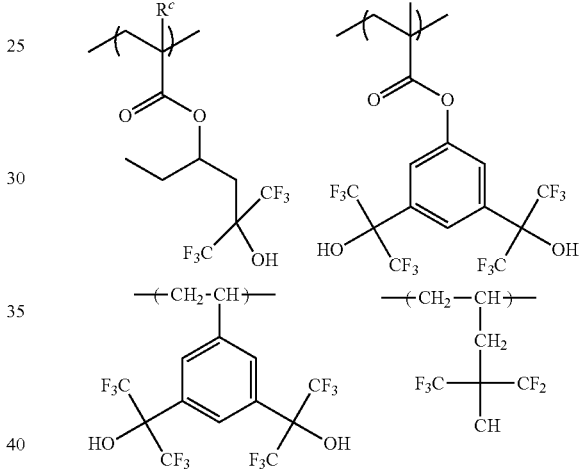
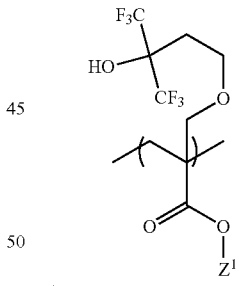

$Z^1 = CH_3, C_2H_5$

The repeating unit A may be used alone or in combination of two or more kinds thereof.

A content of the repeating unit A is preferably 20% by mass or more, more preferably 25% to 50% by mass, and still more preferably 30% to 40% by mass, with respect to the total mass of the resin X.

(Repeating Unit B)

The resin X has a repeating unit B having an acid-decomposable group as a repeating unit different from the repeating unit A.

The acid-decomposable group is a group having a structure in which a polar group is protected with a leaving group which leaves by the action of an acid. That is, the repeating unit B is a repeating unit having a group that decomposes by the action of an acid to generate a polar group. The resin X having such a repeating unit has a polarity that increases by the action of an acid, and thus, has an increased solubility in an alkali developer and a decreased solubility in an organic solvent.

As the polar group in the acid-decomposable group (group having a structure in which the polar group is protected with a leaving group that leaves by the action of an acid), an alkali-soluble group is preferable, and examples thereof include acid groups such as a carboxyl group, a phenolic hydroxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Among those, the carboxyl group, the phenolic hydroxyl group, the fluorinated alcohol group (preferably a hexafluoro-2-propanol group), or the sulfonic acid group is preferable as the polar group.

Examples of the leaving group that leaves by the action of an acid include groups represented by Formulae (Y1) to (Y4).

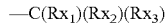  Formula (Y1):

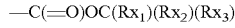  Formula (Y2):

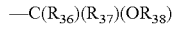  Formula (Y3):

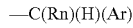  Formula (Y4):

In Formulae (Y1) and (Y2), $Rx_1$ to $Rx_3$ each independently represent an (linear or branched) alkyl group or a (monocyclic or polycyclic) cycloalkyl group. Furthermore, in a case where all of $Rx_1$ to $Rx_3$ are (linear or branched) alkyl groups, it is preferable that at least two of $Rx_1, \ldots,$ or $Rx_3$ are methyl groups.

Among those, $Rx_1$ to $Rx_3$ preferably each independently represent the linear or branched alkyl group, and $Rx_1$ to $Rx_3$ more preferably each independently represent the linear alkyl group.

Two of $Rx_1$ to $Rx_3$ may be bonded to each other to form a monocycle or a polycycle. As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable, and the monocyclic cycloalkyl group having 5 to 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include a group represented by Formula (Y1) and an alkyl group other than the group represented by Formula (Y1) (which may be linear or branched and may have a cyclic structure, and is, for example, a methyl group, an ethyl group, an n-propyl group, an isopropyl group, an n-butyl group, an isobutyl group, and a 1-adamantyl group), an aryl group, an aralkyl group, and an alkenyl group. $R_{36}$ is also preferably the hydrogen atom.

As the substituent of the aryl group, a fluoroalkyl group is preferable, and a perfluoroalkyl group having 1 or 2 carbon atoms is more preferable.

The aryl group preferably has 6 to 15 carbon atoms, and is more preferably a phenyl group.

Furthermore, $R_{38}$ may be bonded to another group other than the group represented by Formula (Y3) in the repeating unit. For example, $R_{38}$ may be bonded to the main chain in the repeating unit directly or via a linking group. In a case where $R_{38}$ is bonded to another group in the repeating unit, $R_{38}$ may be a single bond. In addition, in a case where $R_{38}$ is bonded to another group in the repeating unit, the repeating unit forms a ring including the group represented by Formula (Y3).

As Formula (Y3), a group represented by Formula (Y3-1) is also preferable.

Here, $L_1$ and $L_2$ each independently represent a hydrogen atom, an alkyl group, a cycloalkyl group, an aryl group, or a combination thereof (for example, a combination of the alkyl group and the aryl group).

M represents a single bond or a divalent linking group.

Q is an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combining these groups (for example, a group formed by combining the alkyl group and the cycloalkyl group).

In the alkyl group and the cycloalkyl group, for example, one of the methylene groups may be substituted with a heteroatom such as an oxygen atom or a group having a heteroatom, such as a carbonyl group.

In addition, it is preferable that one of $L_1$ and $L_2$ is a hydrogen atom and the other is an alkyl group, a cycloalkyl group, an aryl group, or a group formed by combining the alkylene group and the aryl group.

At least two of Q, M, or $L_1$ may be bonded to each other to form a ring (preferably a 5- or 6-membered ring).

From the viewpoint of miniaturization of the pattern, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane group. In these aspects, since the glass transition temperature (Tg) and the activation energy increase, fogging can be suppressed, in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably an aryl group.

Among those, the leaving group is preferably bonded to another group to form a group having a group represented by any of General Formulae (B-a) to (B-c). In other words, the repeating unit B preferably has a group represented by any of General Formulae (B-a) to (B-c). In addition, the resin X preferably has the repeating unit B having a group represented by any of General Formulae (B-a) to (B-c).

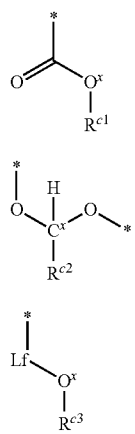

In General Formula (B-a), O^x represents an oxygen atom.

R^{c1} represents a substituent in which the atom directly bonded to O^x is a tertiary carbon atom.

R^{c1} is preferably, for example, a group represented by Formula (Y1).

* represents a bonding position.

In General Formula (B-b), C^x represents a carbon atom.

R^{c2} represents a substituent in which the atom directly bonded to C^x is a tertiary carbon atom.

R^{c2} is, for example, a monovalent organic group represented by $R_{36}$ in Formula (Y3), examples thereof include the group in which the atom directly bonded to C^x is a tertiary carbon atom, and specific examples of the group include a group represented by Formula (Y1), a 1-adamantyl group, and an aryl group (preferably having a fluoroalkyl group (preferably a perfluoroalkyl group having 1 or 2 carbon atoms) as a substituent).

* represents a bonding position.

In General Formula (B-c), O^x represents an oxygen atom.

R^{c3} represents a substituent in which the atom directly bonded to O^x is a tertiary carbon atom.

R^{c3} is preferably, for example, a group represented by Formula (Y1).

Lf represents an aromatic ring group (preferably an arylene group having 6 to 15 carbon atoms, and more preferably a phenylene group) or a perfluoroalkylene group (preferably a perfluoroalkylene group having 2 to 5 carbon atoms, and more preferably a group represented by —C(CF$_3$)$_2$—).

* represents a bonding position.

As the repeating unit A, a repeating unit represented by Formula (XA) is preferable.

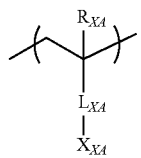

In General Formula (XA), $R_{XA}$ represents a hydrogen atom, a methyl group, or a trifluoromethyl group.

$L_{XA}$ represents a single bond or a divalent linking group. Examples of the divalent linking group include an ester group (—COO—), an ether group (—O—), a carbonyl group (—CO—), a thioether group (—S—), —SO$_2$—, —NR$^N$— (R$^N$ represents a hydrogen atom or an alkyl group), a divalent hydrocarbon group (preferably having 1 to 10 carbon atoms, with examples thereof including an alkylene group, an alkenylene group (for example, —CH=CH—), and an alkynylene group (for example, —C≡C—)), an arylene group (preferably having 6 to 16 carbon atoms), and a group formed by combining these groups.

Among those, $L_{XA}$ is preferably the single bond, a carbonyl group, an arylene group (preferably a phenylene group), or an ester group.

$X_{XA}$ represents an acid-decomposable group. As the acid-decomposable group, for example, a group in which a carboxyl group whose hydrogen atom is substituted with any of the above-mentioned groups represented by Formulae (Y1) to (Y4), a group in which a phenolic hydroxyl group (for example, a hydroxyl group directly linked to $L_{XA}$ which is an arylene group) whose hydrogen atom is substituted with any of the above-mentioned groups represented by Formulae (Y1) to (Y4), or a group in which a fluorinated alcohol group (preferably a hexafluoro-2-propanol group) whose hydrogen atom in the hydroxyl group is substituted with any of the above-mentioned groups represented by Formulae (Y1) to (Y4) is preferable.

Among those, $X_{XA}$ is preferably a group having the group represented by General Formula (B-a) or the group represented by General Formula (B-b) as mentioned above.

Specific aspects in a case where $X_{XA}$ is a group having the group represented by General Formula (B-b) include a carboxyl group, a phenolic hydroxyl group, and a fluorinated alcohol group (preferably a hexafluoro-2-propanol group), in which a hydrogen atom of a group selected from the group consisting of the hydroxyl groups included is substituted with the above-mentioned group represented by Formula (Y3). It should be noted that in this case, it is preferable that in Formula (Y3), $R_{36}$ has a group represented by Formula (Y1), a 1-adamantyl group, or an aryl group (a fluoroalkyl group (preferably a perfluoroalkyl group having 1 or 2 carbon atoms) as a substituent, and $R_{37}$ is a hydrogen atom.

Moreover, $X_{XA}$ and $R_{XA}$ may be bonded to each other to form a ring. For example, $X_{XA}$ and $R_{XA}$ may be bonded to each other to form a group having the group represented by General Formula (B-b). In this case, as the group having the group represented by General Formula (B-b) formed by mutual bonding of $X_{XA}$ and $R_{XA}$, for example, a group represented by "-group represented by General Formula (B-b)-" or "-carbonyl group-group represented by General Formula (B-b)-" is preferable.

The repeating unit B may be used alone or in combination of two or more kinds thereof.

A content of the repeating unit B is preferably 15% to 80% by mass, more preferably 20% to 70% by mass, and still more preferably 25% to 60% by mass, with respect to the total mass of the resin X.

(Repeating Unit C)

The resin X has a repeating unit C selected from the group consisting of a repeating unit c1 represented by General Formula (II), a repeating unit c2 represented by General Formula (III), a repeating unit c3 having a carbonate ring group, and a repeating unit c4 having an anhydride ring group, in addition to the above-mentioned repeating unit A and repeating unit B.

Repeating Unit c1

The repeating unit c1 is a repeating unit represented by General Formula (II).

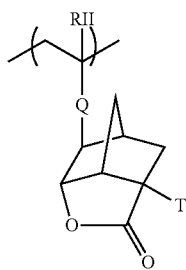

(II)

In General Formula (II), RII represents a hydrogen atom or a monovalent organic group.

As the monovalent organic group represented by RII, an alkyl group having 1 to 5 carbon atoms or a halogenated alkyl group having 1 to 5 carbon atoms is preferable.

The alkyl group having 1 to 5 carbon atoms is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms is the "alkyl group having 1 to 5 carbon atoms in RII" whose some or all of the hydrogen atoms are substituted with halogen atoms (preferably fluorine atoms).

As RII, a hydrogen atom, an alkyl group having 1 to 5 carbon atoms or a fluorinated alkyl group having 1 to 5 carbon atoms is preferable, and the hydrogen atom or the methyl group is more preferable.

Q represents a divalent linking group. Examples of the divalent linking group include an ester group (—COO—), an ether group (—O—), a carbonyl group (—CO—), a thioether group (—S—), —SO$_2$—, and —NR$^N$— (R$^N$ represents a hydrogen atom or an alkyl group), and a divalent hydrocarbon group which may have a heteroatom (preferably having 1 to 10 carbon atoms, with examples thereof including an alkylene group, an alkenylene group (for example, —CH=CH—), and an alkynylene group (for example, —C≡C—)), an arylene group (preferably having 6 to 16 carbon atoms), and a group formed by combining these groups.

Among those, Q is preferably "-ester group-(alkylene group having 1 to 3 carbon atoms-ester group)$_m$-".

m represents an integer of 0 to 2.

The divalent hydrocarbon group may be a divalent aliphatic hydrocarbon group or a divalent aromatic hydrocarbon group. The divalent aliphatic hydrocarbon group may be saturated or unsaturated, and is preferably saturated.

More specific examples of the aliphatic hydrocarbon group include a linear or branched aliphatic hydrocarbon group and an aliphatic hydrocarbon group including a ring in the structure.

The linear aliphatic hydrocarbon group preferably has 1 to 10 carbon atoms, more preferably has 1 to 6 carbon atoms, still more preferably has 1 to 4 carbon atoms, and particularly preferably has 1 to 3 carbon atoms.

The branched aliphatic hydrocarbon group preferably has 2 to 10 carbon atoms, more preferably has 2 to 6 carbon atoms, still more preferably has 2 to 4 carbon atoms, and particularly preferably has 2 or 3 carbon atoms.

Examples of the aliphatic hydrocarbon group including a ring in the structure include an alicyclic hydrocarbon group (a group obtained by removing two hydrogen atoms from an aliphatic hydrocarbon ring), a group in which an alicyclic hydrocarbon group is bonded to a terminal of a linear or branched aliphatic hydrocarbon group, and a group in which an alicyclic hydrocarbon group is interposed in a linear or branched aliphatic hydrocarbon group. Examples of the linear or branched aliphatic hydrocarbon group include the same as those described above.

The alicyclic hydrocarbon group preferably has 3 to 20 carbon atoms, and more preferably has 3 to 12 carbon atoms.

The aromatic hydrocarbon group is a hydrocarbon group having at least one aromatic ring. This aromatic ring may be a monocycle or a polycycle. The aromatic ring preferably has 5 to 30 carbon atoms, more preferably has 5 to 20 carbon atoms, still more preferably has 6 to 15 carbon atoms, and particularly preferably has 6 to 12 carbon atoms.

In the aromatic hydrocarbon ring, a part of carbon atoms constituting the ring may be substituted with heteroatoms to form an aromatic heterocycle. Examples of the heteroatom in the aromatic heterocycle include an oxygen atom, a sulfur atom, and a nitrogen atom. Specific examples of the aromatic heterocycle include a pyridine ring and a thiophene ring.

The hydrocarbon group is preferably an aliphatic hydrocarbon group, more preferably a linear or branched aliphatic hydrocarbon group, still more preferably a linear aliphatic hydrocarbon group, and particularly preferably a linear alkylene group.

T represents a monovalent organic group.

Examples of the monovalent organic group include a group represented by General Formula (a0-r-1), a cyano group, a halogenated alkyl group (preferably a linear or branched fluoroalkyl group having 1 to 5 carbon atoms), —C(=O)ORa$^5$, —OC(=O)Ra$^5$, —CON(Ra$^6$)(Ra$^7$), —SO$_2$N(Ra$^8$)(Ra$^9$), and —SO$_2$Ra$^0$.

Ra$^0$ to Ra$^9$ each independently represent a hydrogen atom or an alkyl group (preferably a linear or branched alkyl group having 1 to 5 carbon atoms, with the substituent being preferably a halogen atom (preferably a fluorine atom)). It should be noted that at least one of Ra$^6$ or Ra$^7$ is an alkyl group, and at least one of Ra$^8$ or Ra$^9$ is an alkyl group.

Ra$^0$ is an alkyl group (preferably a linear or branched alkyl group having 1 to 5 carbon atoms).

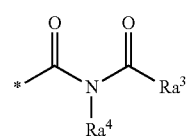

(a0-r-1)

In Formula (a0-r-1), $Ra^3$ and $Ra^4$ are each independently a hydrogen atom or a non-aromatic hydrocarbon group. It should be noted that at least one of $Ra^3$ or $Ra^4$ is a non-aromatic hydrocarbon group.

Examples of the non-aromatic hydrocarbon group include a linear or branched aliphatic hydrocarbon group and an aliphatic hydrocarbon group including a ring in the structure.

Examples of the linear or branched aliphatic hydrocarbon group include an alkyl group (preferably having 1 to 20 carbon atoms), an alkenyl group (preferably having 2 to 20 carbon atoms), and an alkynyl group (preferably having 2 to 20 carbon atoms).

Examples of the aliphatic hydrocarbon group including a ring in the structure include an alicyclic group, a group in which an alicyclic group is bonded to a terminal of a linear or branched aliphatic hydrocarbon group, and a group in which an alicyclic group is a group interposed in a linear or branched aliphatic hydrocarbon group.

Examples of the linear or branched aliphatic hydrocarbon group herein include the same groups as the linear or branched aliphatic hydrocarbon groups in $Ra^3$ and $Ra^4$.

Examples of the substituent of the non-aromatic hydrocarbon group in $Ra^3$ and $Ra^4$ include a halogen atom such as a fluorine atom, an alkoxy group (for example, an alkoxy group having 1 to 6 carbon atoms) such as a hydroxy group and a methoxy group, an alkoxycarbonyl group (for example, an alkoxycarbonyl group having 1 to 6 carbon atoms) such as a carboxyl group and a methoxycarbonyl group, an acyl group (for example, an acyl group having 1 to 6 carbon atoms) such as an acetyl group, an aryl group (for example, an aryl group having 6 to 14 carbon atoms) such as a cyano group and a phenyl group, an alkyl group (for example, an alkyl group having 1 to 20 carbon atoms, preferably an alkyl group having 1 to 10 carbon atoms, and more preferably an alkyl group having 1 to 6 carbon atoms) such as a methyl group, an alkenyl group (for example, an alkenyl group having 2 to 6 carbon atoms) such as a vinyl group, a cycloalkyl group (for example, such as a cycloalkyl group having 3 to 12 carbon atoms) such as a cyclohexyl group, and a nitro group.

$Ra^3$ and $Ra^4$ may be bonded to each other to form a ring, and examples of a ring thus formed include a non-aromatic nitrogen-containing heterocycle having 4 to 12 members (preferably 5 or 6 members), such as a β-lactam ring (4-membered ring), a γ-lactam ring (5-membered ring), and a δ-lactam ring (6-membered ring).

* represents a bonding position.

Among those, T preferably represents a group represented by any of General Formulae (II-a) to (II-c).

*—CN  (II-a)

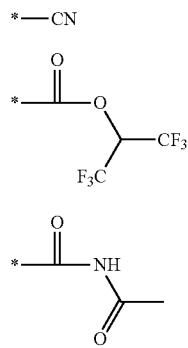

(II-b)

(II-c)

In General Formulae (II-a) to (II-c), * represents a bonding position.

Among those, T is preferably a group represented by General Formula (II-a).

Among those, the repeating unit c1 is preferably a repeating unit represented by General Formula (II-1) or (II-2). That is, the resin X preferably has a repeating unit selected from the group consisting of a repeating unit represented by General Formula (II-1) and a repeating unit represented by General Formula (II-2).

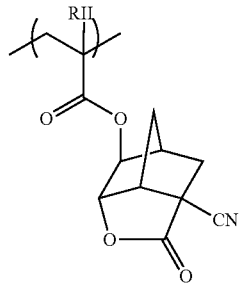

(II-1)

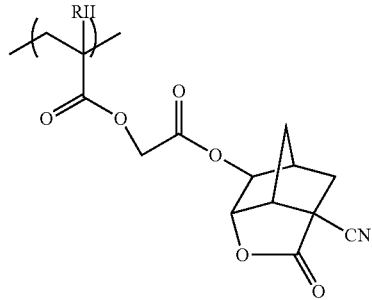

(II-2)

In General Formulae (II-1) and (II-2), RII represents a hydrogen atom or a monovalent organic group, and has the same meaning as RII in General Formula (II).

Repeating Unit c2

The repeating unit c2 is a repeating unit represented by General Formula (III).

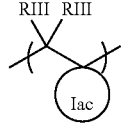

(III)

In General Formula (III), RIII's each independently represent a hydrogen atom or a substituent.

RIII is preferably a hydrogen atom.

lac represents a lactone ring group.

The lactone ring group in lac is a group obtained by removing two hydrogen atoms from one methylene group constituting a lactone structure.

The methylene group constituting a lactone structure is a group having two hydrogen atoms.

The lactone structure preferably includes a 5- to 7-membered lactone ring, and another ring may be fused with the 5- to 7-membered lactone ring to form a bicyclo ring or a spiro ring. Further, in this specification, in a case where another ring is fused with the lactone ring, the whole rings including the other fused ring is referred to as a lactone structure.

The lactone structure is preferably a lactone structure represented by any of General Formulae (LC1-1) to (LC1-22).

In other words, lac in General Formula (III) is preferably a group formed by removing two hydrogen atoms from one methylene group constituting a lactone structure represented by any of General Formulae (LC1-1) to (LC1-22).

Among those, the lactone structure is preferably a lactone structure represented by General Formula (LC1-1) or (LC1-22).

LC1-1
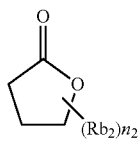

LC1-2
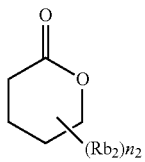

LC1-3
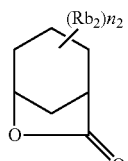

LC1-4
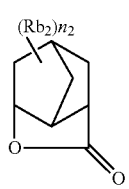

LC1-5
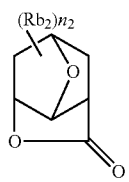

LC1-6
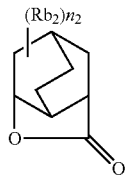

LC1-7
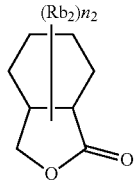

-continued

LC1-8
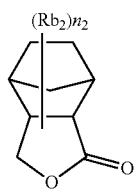

LC1-9
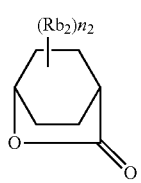

LC1-10
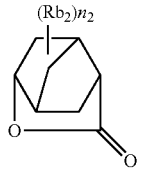

LC1-11
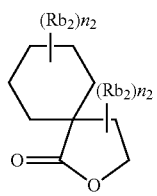

LC1-12
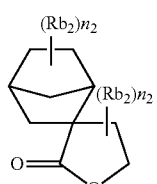

LC1-13
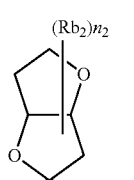

LC1-14
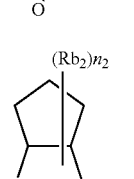

LC1-15
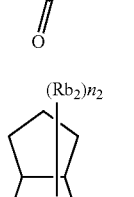

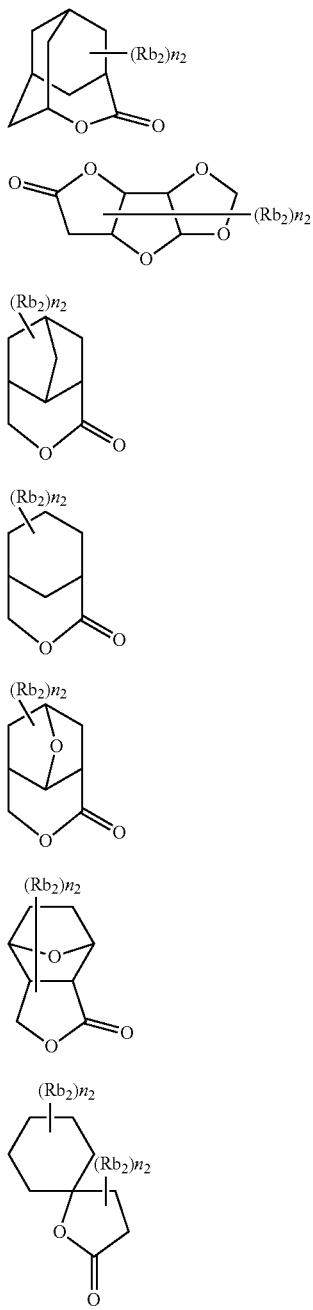

In General Formulae (LC1-1) to (LC1-22), $Rb_2$ represents a substituent.

As the substituent ($Rb_2$), an alkyl group having 1 to 8 carbon atoms, a hydroxyl group, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a cyano group, or an acid-decomposable group is preferable.

In a case where these substituents further have a substituent, the substituent is preferably a fluorine atom. For example, the alkyl group having 1 to 8 carbon atoms is preferably a fluoroalkyl group having 1 to 8 carbon atoms (preferably a perfluoroalkyl group).

n2 represents an integer of 0 to 4. In a case where n2 is 2 or greater, a plurality of $Rb_2$'s may be different from each other, and the plurality of $Rb_2$'s may be bonded to each other to form a ring.

In addition, in a case where a lactone ring group represented by lac is formed by removing two hydrogen atoms from one methylene group in the lactone structure represented by any one of General Formulae (LC1-1) to (LC1-22) (preferably General Formula (LC1-1) or (LC1-22)) to form a lactone ring group represented by lac, the one methylene group from which two hydrogen atoms are to be removed is not the methylene group included in the substituent ($Rb_2$). In addition, the one methylene group from which two hydrogen atoms are to be removed is preferably a methylene group included in a lactone ring.

Repeating Unit c3

The repeating unit c3 is a repeating unit having a carbonate ring group.

The carbonate ring group is a group formed by removing a hydrogen atom from a carbonate ring.

The carbonate ring is a ring including a carbonate group, and is, for example, a ring represented by General Formula (CBN).

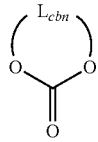  (CBN)

In General Formula (CBN), $L_{cbn}$ represents a divalent linking group having at least one hydrogen atom.

Examples of the divalent linking group include a divalent hydrocarbon group (preferably having 1 to 10 carbon atoms, with examples thereof including an alkylene group, an alkenylene group (for example, —CH=CH—), and an alkynylene group (for example, —C≡C—)), an arylene group (preferably having 6 to 16 carbon atoms), and a group formed by combining these groups.

In addition, the divalent linking group only needs to have at least one hydrogen atom, and may include a group selected from the group consisting of an ester group (—COO—), an ether group (—O—), a carbonyl group (—CO—), a thioether group (—S—), —$SO_2$—, and —$NR^N$— ($R^N$ represents a hydrogen atom or an alkyl group).

Among those, $L_{cbn}$ is preferably an alkylene group. The alkylene group preferably has 1 to 5 carbon atoms, more preferably has 1 to 3 carbon atoms, and still more preferably has 2 carbon atoms.

The repeating unit c3 is preferably a repeating unit having a carbonate ring group formed by removing one or more hydrogen atoms from the carbonate ring represented by General Formula (CBN).

The repeating unit c3 may have a carbonate ring group in a side chain and the main chain may have a carbonate ring group.

The expression that the main chain has a carbonate ring group means that an atom constituting the carbonate ring group is simultaneously an atom constituting the main chain of the repeating unit. The number of atoms constituting the main chain in such a carbonate ring group may be one or may be two or more.

Among those, the repeating unit c3 preferably has a carbonate ring group in a side chain.

The repeating unit c3 is preferably a repeating unit represented by General Formula (c3-1).

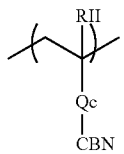

(c3-1)

In General Formula (c3-1), RII represents a hydrogen atom or a monovalent organic group, and has the same meaning as RII in Formula (II).

Qc represents a divalent linking group. Examples of the divalent linking group include an ester group (—COO—), an ether group (—O—), a carbonyl group (—CO—), a thioether group (—S—), —SO$_2$—, —NR$^N$— (R$^N$ represents a hydrogen atom or an alkyl group), a divalent hydrocarbon group (preferably having 1 to 10 carbon atoms, with examples thereof including an alkylene group, an alkenylene group (for example, —CH=CH—), and an alkynylene group (for example, —C≡C—)), an arylene group (preferably having 6 to 16 carbon atoms), and a group formed by combining these groups.

Among those, Qc is preferably an ester group or an -ester group-alkylene group (preferably having 1 to 3 carbon atoms).

CBN represents a carbonate ring group, and represents a group obtained by removing one hydrogen atom from the carbonate ring represented by General Formula (CBN).

Repeating Unit c4

The repeating unit c4 is a repeating unit having an anhydride ring group.

The anhydride ring group is a group formed by removing a hydrogen atom from an anhydride ring.

The anhydride ring is not particularly limited, but is preferably a ring including a group represented by —CO—O—CO— in which one water molecule is dehydrated from two carboxyl groups.

For example, the anhydride ring is preferably a ring represented by General Formula (AHD).

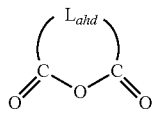

(AHD)

In General Formula (AHD), L$_{ahd}$ represents a divalent linking group having two or more hydrogen atoms. As an aspect having two or more hydrogen atoms, an aspect satisfying at least one condition of:

(a) an aspect in which at least one of the atoms constituting the ring has two or more hydrogen atoms, and (b) an aspect in which two or more of the atoms constituting the ring each have one or more hydrogen atoms is preferable.

Examples of the divalent linking group include a divalent hydrocarbon group (preferably having 1 to 10 carbon atoms, with examples thereof including an alkylene group, an alkenylene group (for example, —CH=CH—), and an alkynylene group (for example, —C≡C—)), an arylene group (preferably having 6 to 16 carbon atoms), and a group formed by combining these groups.

In addition, the divalent linking group only needs to have one or more hydrogen atoms, and may include, for example, a group selected from the group consisting of an ester group (—COO—), an ether group (—O—), a carbonyl group (—CO—), a thioether group (—S—), —SO$_2$—, and —NR$^N$— (R$^N$ represents a hydrogen atom or an alkyl group).

Among those, L$_{ahd}$ is preferably an alkylene group. The alkylene group preferably has 1 to 5 carbon atoms, more preferably has 1 to 3 carbon atoms, and still more preferably has 2 carbon atoms.

The ring represented by General Formula (AHD) is preferably a ring represented by General Formula (AHD-2).

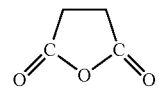

(AHD-2)

The repeating unit c4 is preferably a repeating unit having a group formed by removing one or more hydrogen atoms from the anhydride ring represented by General Formula (AHD).

The anhydride ring group may be present in a side chain of the repeating unit or may be present in the form of the main chain. Among those, the anhydride ring is preferably present in the form of the main chain.

The expression that the main chain has an anhydride ring group means that an atom constituting the anhydride ring group is simultaneously an atom constituting the main chain of the repeating unit. The number of atoms constituting the main chain in such an anhydride ring may be one or may be two or more.

The repeating unit c4 is preferably a repeating unit represented by General Formula (c4-1) or (c4-2).

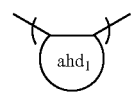

(c4-1)

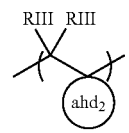

(c4-2)

In General Formula (c4-1), ahd$_1$ represents a group obtained by removing one hydrogen atom from each of two different atoms (preferably two different carbon atoms, and more preferably two adjacent carbon atoms) constituting a ring in an anhydride ring represented by General Formula (AHD) (preferably a ring represented by General Formula (AHD-2)).

It should be noted that the anhydride ring represented by General Formula (AHD) in this case satisfies at least the condition of the above-described aspect (b) as an aspect having two or more hydrogen atoms.

In General Formula (c4-2), RIII's each independently represent a hydrogen atom or a substituent.

RIII is preferably a hydrogen atom.

ahd$_2$ represents a group obtained by removing two hydrogen atoms from atoms (preferably carbon atoms constituting the methylene group) constituting a ring and having two or more hydrogen atoms in the anhydride ring represented by General Formula (AHD) (preferably the ring represented by General Formula (AHD-2)).

It should be noted that the anhydride ring represented by General Formula (AHD) in this case satisfies at least the condition of the above-described aspect (a) as an aspect having two or more hydrogen atoms.

The repeating unit C may be used alone or in combination of two or more kinds thereof.

A content of the repeating unit C is preferably 5% to 60% by mass, more preferably 7% to 45% by mass, and still more preferably 10% to 30% by mass, with respect to the total mass of the resin X.

(Other Repeating Units)

The repeating unit contained in the resin X is not limited to the above-mentioned repeating units A to C, and may have other repeating units.

It should be noted that from the viewpoint that the effect of the present invention is more excellent, a total content of the repeating unit A, the repeating unit B, and the repeating unit C is preferably 60% by mass or more, more preferably 75% by mass or more, even more preferably 90% by mass or more, and particularly preferably 95% by mass or more, with respect to the total mass of the resin X. An upper limit of the total content is not particularly limited, and is usually 100% or less.

Other examples of the repeating units are shown below.

Repeating Unit Having Phenolic Hydroxyl Group.

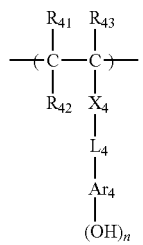

(I)

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to Ara to form a ring, and in this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

Ara represents a (n+1)-valent aromatic ring group, and in a case where Ara is bonded to $R_{42}$ to form a ring, it represents an (n+2)-valent aromatic ring group.

n represents an integer of 1 to 5.

As the alkyl group of each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in General Formula (I) may be a monocycle or a polycycle. Among those, a monocyclic cycloalkyl group having 3 to 8 carbon atoms, such as a cyclopropyl group, a cyclopentyl group and a cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

Preferred examples of the substituents in each of the groups include an alkyl group, a cycloalkyl group, an aryl group, an amino group, an amide group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The substituent preferably has 8 or less carbon atoms.

Ara represents an (n+1)-valent aromatic ring group. The divalent aromatic ring group in a case where n is 1 may have a substituent, and is preferably, for example, an arylene group having 6 to 18 carbon atoms, such as a phenylene group, a tolylene group, a naphthylene group, and an anthracenylene group, or an aromatic ring group including a heterocycle, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

Specific examples of the (n+1)-valent aromatic ring group in a case where n is an integer of 2 or greater include a group obtained by removing any (n−1) hydrogen atoms from the above-described specific examples of the divalent aromatic ring group.

The (n+1)-valent aromatic ring group may further have a substituent.

Examples of the substituent which can be contained in the above-mentioned alkyl group, cycloalkyl group, alkoxycarbonyl group, alkylene group, and (n+1)-valent aromatic ring group include the alkyl groups, the alkoxy groups such as a methoxy group, an ethoxy group, a hydroxyethoxy group, a propoxy group, a hydroxypropoxy group, and a butoxy group; and the aryl groups such as a phenyl group, as mentioned for $R_{41}$, $R_{42}$, and $R_{43}$ in General Formula (I).

Examples of the alkyl group of $R_{64}$ in —CONR$_{64}$— ($R_{64}$ represents a hydrogen atom or an alkyl group) represented by $X_4$ include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms is more preferable.

As $X_4$, the single bond, —COO—, or —CONH— is preferable, and the single bond or —COO— is more preferable.

As the alkylene group as $L_4$, an alkylene group having 1 to 8 carbon atoms, such as a methylene group, an ethylene group, a propylene group, a butylene group, a hexylene group, and an octylene group, is preferable.

As Ar₄, an aromatic ring group having 6 to 18 carbon atoms is preferable, and a benzene ring group, a naphthalene ring group, and a biphenylene ring group are more preferable.

The repeating unit represented by General Formula (I) preferably has a hydroxystyrene structure. That is, Ar₄ is preferably a benzene ring group.

As the repeating unit represented by General Formula (I), a repeating unit represented by General Formula (1) is also preferable.

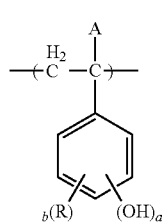

(1)

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group or an aryloxycarbonyl group, and in a case where a plurality of R's are present, they may be the same as or different from each other. In a case where the plurality of R's are present, they may be combined with each other to form a ring.

a represents an integer of 1 to 3.

b represents an integer of 0 to (3-a).

Specific examples of the repeating unit represented by General Formula (I) are shown below, but the present invention is not limited thereto. In the formulae, a represents 1 to 3.

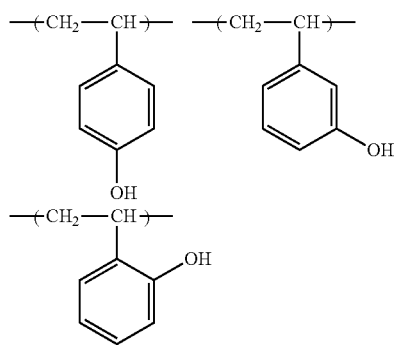

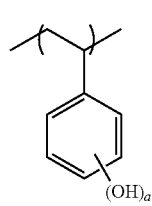

(B-1)

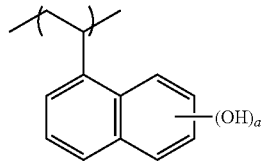

(B-2)

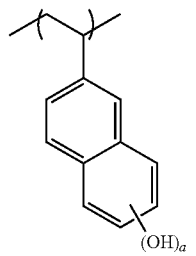

(B-3)

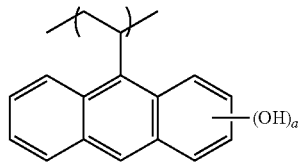

(B-4)

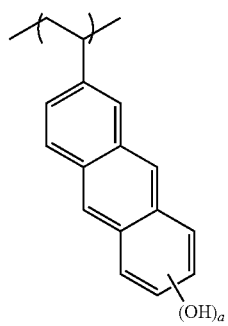

(B-5)

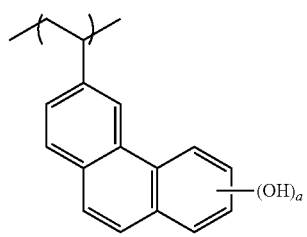

(B-6)

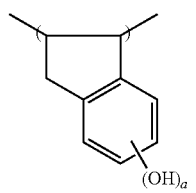

(B-7)

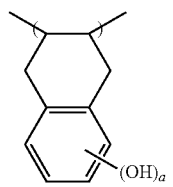

(B-8)

(B-9) 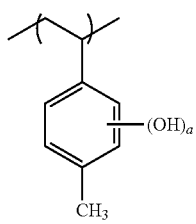
(B-10) 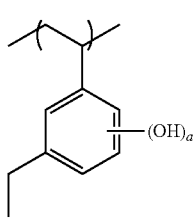
(B-11) 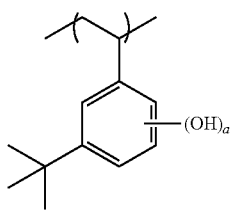
(B-12) 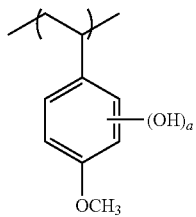
(B-13) 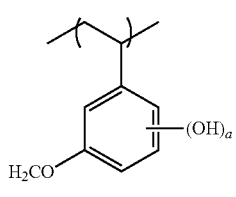
(B-14) 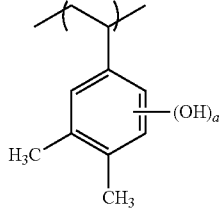
(B-15) 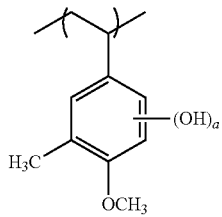
(B-16) 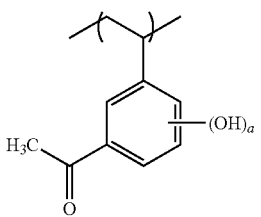
(B-17) 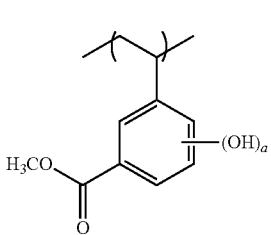
(B-18) 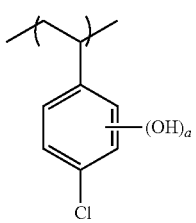
(B-19) 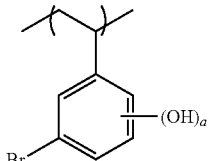
(B-20) 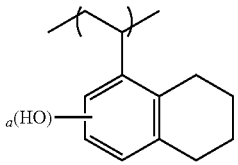
(B-21) 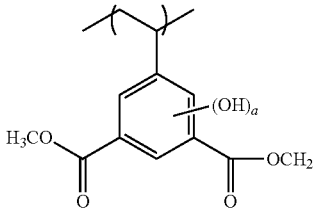
(B-22) 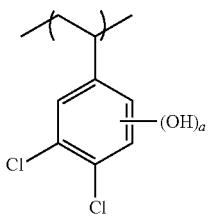

(B-23) 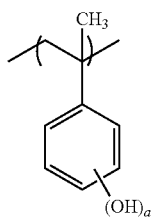
(B-24) 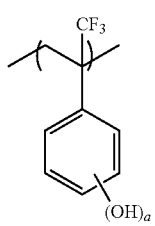
(B-25) 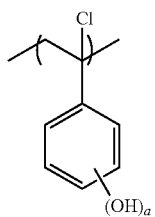
(B-26) 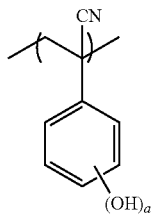
(B-27) 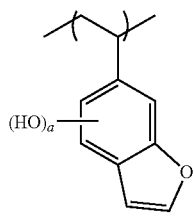
(B-28) 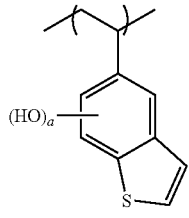
(B-29) 
(B-30) 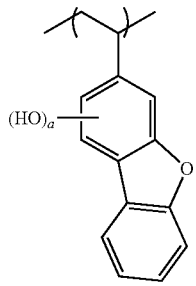
(B-31) 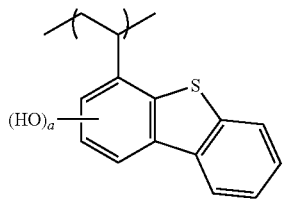
(B-32) 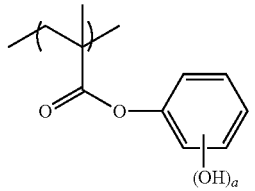
(B-33) 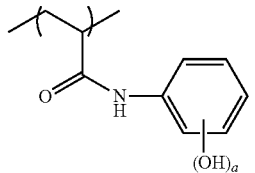
(B-34) 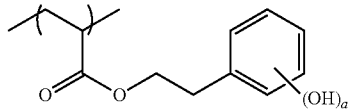
(B-35) 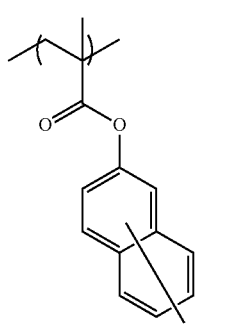
(B-36) 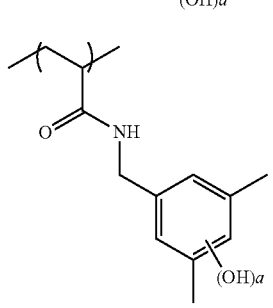

-continued

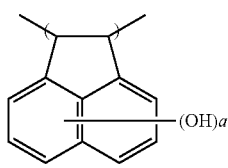
(B-37)

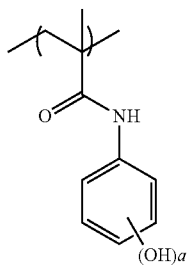
(B-38)

Moreover, among those repeating units, repeating units specifically described below are preferable. In the formulae, R represents a hydrogen atom or a methyl group, and a represents 1 to 3.

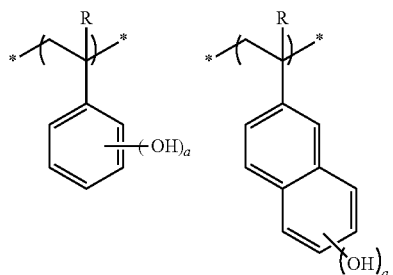

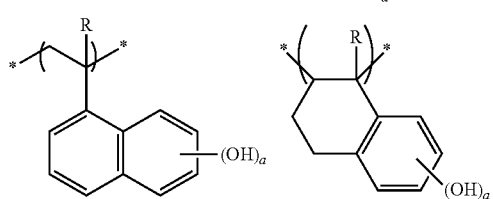

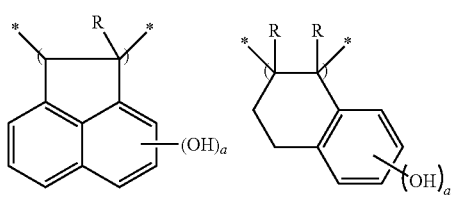

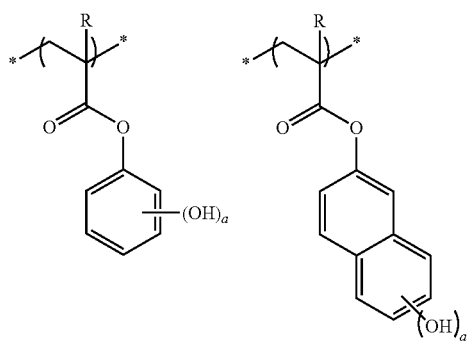

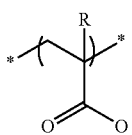

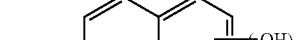

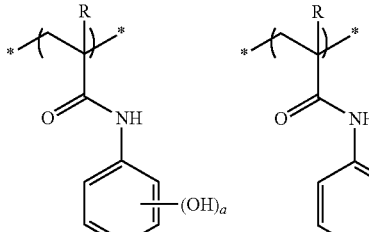

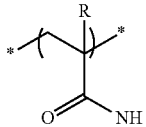

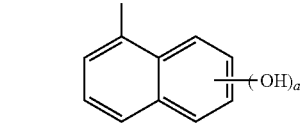

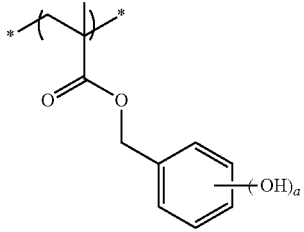

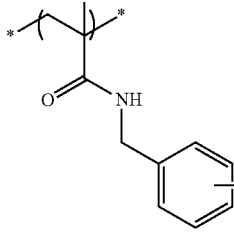

In a case where the resin X has a repeating unit having a phenolic hydroxyl group, a content of the repeating unit having a phenolic hydroxyl group is preferably 1% to 10% by mass, and more preferably 1% to 9% by mass, with respect to the total mass of the resin X.

The resin X can be synthesized in accordance with an ordinary method (for example, radical polymerization).

The weight-average molecular weight of the resin X as a value in terms of polystyrene by a GPC method is preferably 1,000 to 200,000, more preferably 3,000 to 20,000, and still more preferably 4,000 to 15,000. By setting the weight-average molecular weight of the resin X to 1,000 to 200,000, deterioration of heat resistance and dry etching resistance can be prevented, and further, deterioration of developability and deterioration of the film forming property due to increased viscosity can be prevented.

The dispersity (molecular weight distribution, Mw/Mn) of the resin X is preferably 1.0 to 5.0, more preferably 1.0 to 3.0, and still more preferably 1.0 to 1.5, from the viewpoint that pattern collapse during pattern formation can be further suppressed.

The resin X may be used alone or in combination of two or more kinds thereof.

A content of the resin X is preferably 50% to 99.9% by mass, and more preferably 60% to 99.0% by mass, with respect to a total solid content of the resist composition.

<Compound Y>

The resist composition of the embodiment of the present invention includes a compound Y.

The compound Y is a basic compound or ammonium salt compound whose basicity is reduced upon irradiation (exposure) with actinic rays or radiation.

The molecular weight of the compound Y is preferably 500 to 1,000.

The compound Y decomposes upon irradiation (exposure) with actinic rays or radiation to generate a compound (acid) having a reduced basicity. The compound whose basicity is reduced is, for example, a conjugate acid of the compound Y.

A pka of the acid generated from the compound Y (the conjugate acid of the compound Y) is preferably −1.00 to 4.50, and more preferably 1.00 to 4.50.

The compound Y preferably exhibits basicity in an unexposed state and functions as a so-called acid diffusion control agent. The acid diffusion control agent suppresses the progress of a reaction of the acid-decomposable group of the resin X in the unexposed area by excessive generated acids by trapping the acids generated from a photoacid generator or the like upon exposure.

(Conjugate Acid)

First, an acid (conjugate acid) generated from the compound Y will be described.

The acid generated by the compound Y is preferably an acid represented by General Formula (d1).

$Rd^1$-COOH (d1)

In General Formula (d1), $Rd^1$ represents a ring group which may have a substituent, a chained alkyl group which may have a substituent, or an alkenyl group which may have a substituent.

The ring group in the ring group which may have a substituent represented by $Rd^1$ is preferably a cyclic hydrocarbon group, and the cyclic hydrocarbon group may be an aromatic hydrocarbon group or may also be a cyclic aliphatic hydrocarbon group.

The cyclic aliphatic hydrocarbon group means a cyclic hydrocarbon group having no aromaticity. Further, the cyclic aliphatic hydrocarbon group may be saturated or unsaturated, and is usually preferably saturated.

The aromatic hydrocarbon group for $Rd^1$ is a hydrocarbon group having an aromatic ring. The aromatic hydrocarbon group preferably has 3 to 30 carbon atoms, more preferably has 5 to 30 carbon atoms, still more preferably has 5 to 20 carbon atoms, particularly preferably has 6 to 15 carbon atoms, and most preferably has 6 to 10 carbon atoms. It should be noted that the number of carbon atoms does not include the number of carbon atoms in the substituent.

Specific examples of the aromatic ring of the aromatic hydrocarbon group in $Rd^1$ include benzene, fluorene, naphthalene, anthracene, phenanthrene, biphenyl, or an aromatic heterocycle in which some of the carbon atoms constituting the aromatic ring are substituted with heteroatoms.

Examples of the heteroatom in the aromatic heterocycle include an oxygen atom, a sulfur atom, a nitrogen atom and the like.

Specific examples of the aromatic hydrocarbon group for $Rd^1$ include a group (an aryl group: for example, a phenyl group and a naphthyl group) formed by removing one hydrogen atom from the aromatic ring, and a group (for example, an arylalkyl group such as a benzyl group, a phenethyl group, a 1-naphthylmethyl group, a 2-naphthylmethyl group, a 1-naphthylethyl group, and a 2-naphthylethyl group) in which one hydrogen atom in the aromatic ring is substituted with an alkylene group. The alkylene group (the alkyl chain in the arylalkyl group) preferably has 1 to 4 carbon atoms, more preferably has 1 or 2 carbon atoms, and still more preferably has 1 carbon atom.

Among those, as the aromatic hydrocarbon group for $Rd^1$, a phenyl group or a naphthyl group is preferable.

Examples of the cyclic aliphatic hydrocarbon group for $Rd^1$ include an aliphatic hydrocarbon group including a ring in the structure.

Examples of the aliphatic hydrocarbon group including a ring in this structure include an alicyclic hydrocarbon group (a group formed by removing one hydrogen atom from an aliphatic hydrocarbon ring), a group in which an alicyclic hydrocarbon group is bonded to a terminal of a linear or branched aliphatic hydrocarbon group, and a group in which an alicyclic hydrocarbon group is a group interposed in a linear or branched aliphatic hydrocarbon group.

The alicyclic hydrocarbon group preferably has 3 to 20 carbon atoms, and more preferably has 3 to 12 carbon atoms.

The alicyclic hydrocarbon group may be a polycyclic group or a monocyclic group. As the monocyclic alicyclic hydrocarbon group, a group formed by removing one or more hydrogen atoms from a monocycloalkane is preferable. The monocycloalkane preferably has 3 to 6 carbon atoms, and specific examples thereof include cyclopentane and cyclohexane. The polycyclic alicyclic hydrocarbon group is preferably a group formed by removing one or more hydrogen atoms from a polycycloalkane, and the polycycloalkane preferably has 7 to 30 carbon atoms. Among these, as the polycycloalkane, a polycycloalkane having a polycyclic skeleton of a bridged ring system, such as adamantane, norbornane, isobornane, tricyclodecane, and tetracyclododecane; a polycycloalkane having a polycyclic skeleton of a fused ring system, such as a ring group having a steroid skeleton is more preferable.

Among those, as the cyclic aliphatic hydrocarbon group for $Rd^1$, a group formed by removing one or more hydrogen atoms from the monocycloalkane or the polycycloalkane is preferable, a group formed by removing one hydrogen atom from the polycycloalkane is more preferable, an adamantyl group or a norbornyl group is still more preferable, and the adamantyl group is particularly preferable.

The linear or branched aliphatic hydrocarbon group which may be bonded to the alicyclic hydrocarbon group preferably has 1 to 10 carbon atoms, more preferably has 1 to 6 carbon atoms, still more preferably has 1 to 4 carbon atoms, and particularly preferably 1 to 3 carbon atoms.

As the linear aliphatic hydrocarbon group, a linear alkylene group is preferable, and specific examples thereof include a methylene group, an ethylene group, a trimethylene group, a tetramethylene group, and a pentamethylene group.

As the branched aliphatic hydrocarbon group, a branched alkylene group is preferable, and specific examples thereof include alkylalkylene groups such as an alkyl methylene group such as —CH(CH$_3$)—, —CH(CH$_2$CH$_3$)—, —C(CH₃)₂—, —C(CH₃)(CH₂CH₃)—, —C(CH₃)(CH₂CH₂CH₃)—, and —C(CH₂CH₃)₂—; an alkyl ethylene group such as —CH(CH₃)CH₂—, —CH(CH₃)CH(CH₃)—, —C(CH₃)₂CH₂—, —CH(CH₂CH₃)CH₂—, and —C(CH₂CH₃)₂—CH₂—; an alkyltrimethylene group such as —CH(CH₃)CH₂CH₂— and —CH₂CH(CH₃)CH₂—; and an alkyltetramethylene group such as —CH(CH₃)CH₂CH₂CH₂— and —CH₂CH(CH₃)CH₂CH₂—. As the alkyl group in the alkylalkylene group, a linear alkyl group having 1 to 5 carbon atoms is preferable.

Furthermore, the cyclic hydrocarbon group for $Rd^1$ may include a heteroatom, as in the heterocycle. Specific examples thereof include lactone ring groups each represented by General Formulae (a2-r-1) and (a2-r-3) to (a2-r-7), —SO₂-containing ring groups each represented by General Formulae (a5-r-1) to (a5-r-4), and heterocyclic groups each represented by General Formulae (r-hr-1) to (r-hr-16).

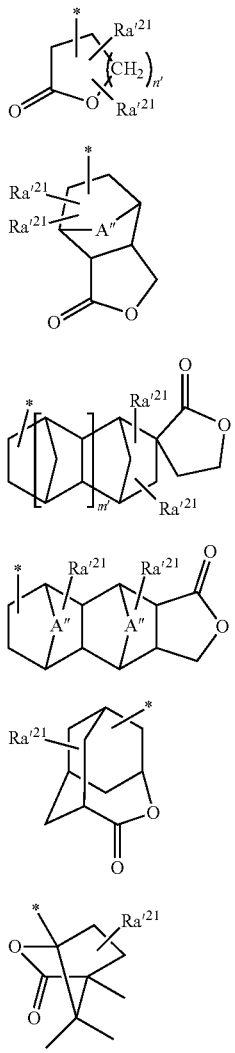

In General Formulae (a2-r-1) and (a2-r-3) to (a2-r-7), $Ra'^{21}$'s are each independently a hydrogen atom, an alkyl group, an alkoxy group, a halogen atom, a halogenated alkyl group, a hydroxyl group, —COOR", —OC(=O)R", a hydroxyalkyl group, or a cyano group; R" is a hydrogen atom, an alkyl group, a lactone ring group, a carbonate ring group, or a —SO₂-ring group; and A" is an alkylene group having 1 to 5 carbon atoms, which may include an oxygen atom (—O—) or a sulfur atom (—S—), an oxygen atom, or a sulfur atom, n' is an integer of 0 to 2, and m' is 0 or 1.

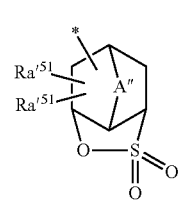

(a5-r-1)

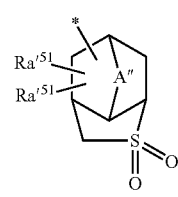

(a5-r-2)

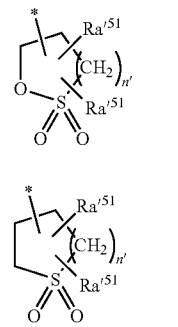

(a5-r-3)

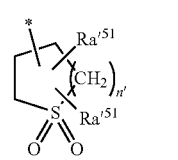

(a5-r-4)

In General Formulae (a5-r-1) to (a5-r-4), $Ra'^{51}$'s each independently represent a hydrogen atom, an alkyl group, an alkoxy group, a halogen atom, a halogenated alkyl group, a hydroxyl group, —COOR", —OC(=O)R", a hydroxyalkyl group, or a cyano group; R" is a hydrogen atom, an alkyl group, a lactone ring group, a carbonate ring group, or an —SO₂-containing ring group; and A" is an oxygen atom or It is an alkylene group having 1 to 5 carbon atoms, which may include a sulfur atom, an oxygen atom or a sulfur atom, and n' is an integer of 0 to 2.

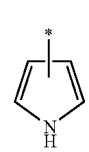

(r-hr-1)

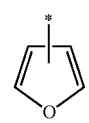

(r-hr-2)

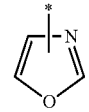

(r-hr-3)

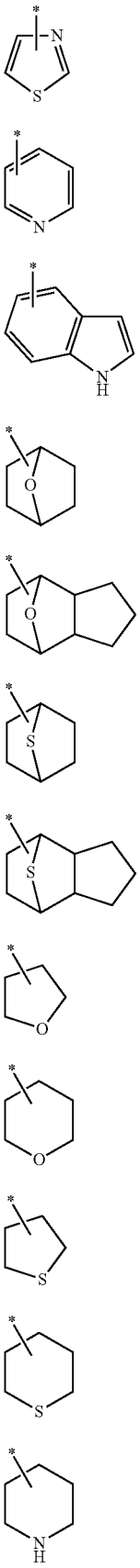

Examples of the substituent in the ring group of $Rd^1$ include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and more preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and still more preferably the methoxy group or the ethoxy group.

Examples of the halogen atom as the substituent include a fluorine atom, a chlorine atom, a bromine atom, and an iodine atom, and the fluorine atom is preferable.

Examples of the halogenated alkyl group as the substituent include an alkyl group having 1 to 5 carbon atoms, for example, such as a methyl group, an ethyl group, a propyl group, an n-butyl group, and a tert-butyl group, each of which has some or all of hydrogen atoms substituted with the halogen atoms.

A carbonyl group as the substituent is a group which substitutes a methylene group (—$CH_2$—) constituting a cyclic hydrocarbon group.

The chained alkyl group in the chained alkyl group which may have a substituent represented by $Rd^1$ may be linear or branched.

The linear alkyl group preferably has 1 to 20 carbon atoms, more preferably has 1 to 15 carbon atoms, still more preferably has 1 to 11 carbon atoms, and particularly preferably has 1 to 5 carbon atoms. Specific examples of the linear alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henycosyl group, and a docosyl group.

The branched alkyl group preferably has 3 to 20 carbon atoms, more preferably has 3 to 15 carbon atoms, and still more preferably has 3 to 10 carbon atoms. Specific examples of the branched alkyl group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Among those, the chained alkyl group in $Rd^1$ preferably has 1 to 10 carbon atoms, and specifically, a linear alkyl group such as a methyl group, an ethyl group, a propyl group, a butyl group, a pentyl group, a hexyl group, a heptyl group, an octyl group, a nonyl group, and a decyl group; or a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group is preferable.

The chained alkenyl group in the chained alkenyl group which may have a substituent represented by $Rd^1$ may be linear or branched.

The chained alkenyl group preferably has 2 to 10 carbon atoms, more preferably has 2 to 5 carbon atoms, more preferably has 2 to 4 carbon atoms, and particularly preferably has 3 carbon atoms.

Examples of the linear alkenyl group include a vinyl group, a propenyl group (allyl group), and a butynyl group. Examples of the branched alkenyl group include a 1-methylvinyl group, a 2-methylvinyl group, a 1-methylpropenyl group, and a 2-methylpropenyl group.

Among those, as the chained alkenyl group for $Rd^1$, a linear alkenyl group is preferable, a vinyl group or a propenyl group is more preferable, and the vinyl group is still more preferable.

Examples of the substituent in the chained alkyl group or alkenyl group of $Rd^1$ include an alkoxy group, a halogen atom, a halogenated alkyl group, a hydroxy group, a carbonyl group, and the ring group in $Rd^1$.

Among those, as $Rd^1$, an aromatic hydrocarbon group which may have a substituent, an aliphatic ring group which may have a substituent, or a chained alkyl group which may have a substituent is preferable, and the aromatic hydrocarbon group which may have a substituent or the chained alkyl group which may have a substituent is more preferable.

Examples of the substituent which may be contained in such the groups include a hydroxy group, an oxo group, an alkyl group, an aryl group, a fluorine atom, a fluorinated alkyl group, lactone ring groups, each represented by General Formulae (a2-r-1) and (a2-r-3) to (a2-r-7), and combinations thereof. Incidentally, the substituent may include an ether group and/or an ester group, and in a case where the substituent has the ether group and/or the ester group, the substituent preferably has any of linking groups each represented by General Formulae (y-a1-1) to (y-a1-5).

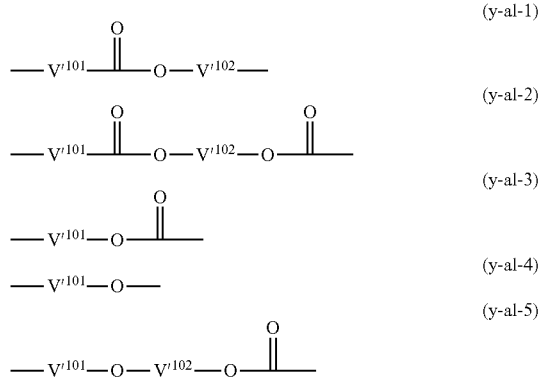

In General Formulae (y-a1-1) to (y-a1-5), $V'^{101}$ is a single bond or an alkylene group having 1 to 5 carbon atoms, and $V'^{102}$ is a divalent saturated hydrocarbon group having 1 to 30 carbon atoms.

As the acid represented by General Formula (d1), for example, an acid represented by General Formula (d1-a) is preferable.

In a case where the acid represented by General Formula has a hydroxyl group (—OH) (that is, in a case where and is 1), the bonding positions of —COOH and —OH bonded to the benzene ring may be in any of the ortho position, the meta position, and the para position, and the ortho position is preferable.

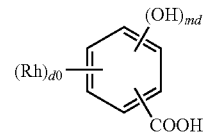

In General Formula (d1-a), md represents 0 or 1.

d0 represents an integer of 0 to 5.

However, $0 \leq (md+d0) \leq 5$ is satisfied.

Rh represents a halogen atom or an alkyl group which may have a halogen atom.

The alkyl group which may have a halogen atom preferably has 1 to 5 carbon atoms. The halogen atom contained in the alkyl group is preferably a fluorine atom. That is, the alkyl group may be either a fluoroalkyl group or a perfluoroalkyl group.

As the acid represented by General Formula (d1), an acid in which $Rd^1$ is a linear alkyl group and at least one hydrogen atom contained in the alkyl group is substituted with a group having a halogen atom is also preferable.

The linear alkyl group in $Rd^1$ preferably has 1 to 11 carbon atoms, more preferably has 1 to 8 carbon atoms, and still more preferably has 1 to 4 carbon atoms.

Examples of the "group having a halogen atom" which substitutes the hydrogen atom contained in the alkyl group include a halogen atom and a halogenated alkyl group.

Examples of the halogen atom include a fluorine atom, a chlorine atom, a bromine atom, and an iodine atom, and among these, the fluorine atom is preferable from the viewpoint of hydrophobicity.

The halogenated alkyl group is the alkyl group in which some or all of the hydrogen atoms are substituted with halogen atoms, examples of the halogen atom include a fluorine atom, a chlorine atom, a bromine atom, and an iodine atom, and the fluorine atom is preferable. The alkyl group herein is preferably an alkyl group having 1 to 5 carbon atoms, and more preferably a linear or branched alkyl group having 1 to 5 carbon atoms.

Examples of the acid in which $Rd^1$ is a linear alkyl group and at least one of the hydrogen atoms contained in the alkyl group is substituted with a group having a halogen atom include an acid in which at least one of the hydrogen atoms contained in a linear alkyl group having 1 to 11 carbon atoms in $Rd^1$ is substituted with a fluorine atom, the alkyl group preferably has 1 to 7 carbon atoms, and the acid in which the alkyl group is a fluorinated alkyl group (linear perfluoroalkyl group) in which all of the hydrogen atoms contained in the alkyl group are substituted with fluorine atoms are particularly preferred.

Moreover, the conjugate acid of the compound Y may be an acid represented by General Formula (d2) in which COOH in the acid represented by General Formula (d1) is substituted with $SO_3H$ as long as the acid is an acid (conjugate acid) generated from a basic compound or ammonium salt compound whose basicity is reduced upon irradiation with actinic rays or radiation.

$Rd^1$-$SO_3H$     (d2)

In General Formula (d2), $Rd^1$ has the same meaning as $Rd^1$ in General Formula (d1).

The acid represented by General Formula (d2) is preferably, for example, an acid represented by General Formula (d2-a) in which COOH in the acid represented by General Formula (d1-a) is substituted with $SO_3H$

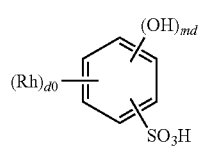

(d2-a)

Each symbol in General Formula (d2-a) has the same meaning as the corresponding symbol in General Formula (d1-a).

Examples of the acid generated from the compound Y include compounds represented by General Formulae (PA-I), (PA-II), and (PA-III).

The compound represented by General Formula (PA-I) is a compound having a sulfonic acid group or a carboxylic acid group together with a basic functional group or an ammonium group, whose basicity is reduced or lost, or changed to acidity, as compared with the compound Y.

The compound represented by General Formula (PA-II) or (PA-III) has an organic sulfonylimino group or an organic carbonylimino group together with a basic functional group, so that the basicity is reduced or eliminated as compared with the compound Y. Or a compound changed from basic to acidic.

First, the compound represented by General Formula (PA-I) will be described.

In General Formula (PA-I), $A_1$ represents a single bond or a divalent linking group.

Q represents —$SO_3H$ or —COOH.

X represents —$SO_2$— or —CO—.

n represents 0 or 1.

B represents a single bond, an oxygen atom, or —N(Rx)-.

Rx represents a hydrogen atom or a monovalent organic group.

R represents a monovalent organic group having a basic functional group or a monovalent organic group having an ammonium group.

As the divalent linking group for $A_1$, a divalent linking group having 2 to 12 carbon atoms is preferable, and examples thereof include an alkylene group and a phenylene group. Among those, an alkylene group having at least one fluorine atom is preferable, and preferably has 2 to 6 carbon atoms, and more preferably 2 to 4 carbon atoms. The alkylene chain may have a linking group such as an oxygen atom and a sulfur atom. The alkylene group is preferably an alkylene group in which 30% to 100% of the hydrogen atoms are substituted with fluorine atoms, and more preferably an alkylene group in which the carbon atom bonded to the Q site has a fluorine atom. Among those, the divalent linking group in $A_1$ is preferably a perfluoroalkylene group, and more preferably a perfluoroethylene group, a perfluoropropylene group, or a perfluorobutylene group.

The monovalent organic group in Rx preferably has 4 to 30 carbon atoms, and examples thereof include an alkyl group, a cycloalkyl group, an aryl group, an aralkyl group, and an alkenyl group.

The alkyl group in Rx may have a substituent and is preferably a linear or branched alkyl group having 1 to 20 carbon atoms, and an oxygen atom, a sulfur atom, and/or a nitrogen atom in the alkyl chain may be provided.

Furthermore, examples of the alkyl group having a substituent include groups in which a linear or branched alkyl group is substituted with a cycloalkyl group (for example, an adamantylmethyl group, an adamantylethyl group, a cyclohexylethyl group, and a camphor residue).

The cycloalkyl group in Rx may have a substituent, is preferably a cycloalkyl group having 3 to 20 carbon atoms, and may have an oxygen atom in the ring.

The aryl group in Rx may have a substituent and is preferably an aryl group having 6 to 14 carbon atoms.

The aralkyl group in Rx may have a substituent and is preferably an aralkyl group having 7 to 20 carbon atoms.

The alkenyl group in Rx may have a substituent and examples thereof include a group having a double bond at any position of the alkyl group described as Rx.

Examples of a preferred partial structure of the basic functional group include structures of crown ethers, primary to tertiary amines, and nitrogen-containing heterocycles (pyridine, imidazole, pyrazine, and the like).

Examples of a preferred partial structure of the ammonium group include structures of primary to tertiary ammonium, pyridinium, imidazolinium, and pyrazinium.

Furthermore, as the basic functional group, a functional group having a nitrogen atom is preferable, and structure having primary to tertiary amino groups or a nitrogen-containing heterocyclic structure is more preferable. In these structures, it is preferable that all of the atoms adjacent to the nitrogen atom included in the structure are carbon atoms or hydrogen atoms from the viewpoint of improving basicity. In addition, it is preferable that an electron-withdrawing functional group (such as a carbonyl group, a sulfonyl group, a cyano group, and a halogen atom) is not directly linked to the nitrogen atom from the viewpoint of improving basicity.

The monovalent organic group in the monovalent organic group (group R) including such a structure preferably has 4 to 30 carbon atoms, examples thereof include an alkyl group, a cycloalkyl group, an aryl group, an aralkyl group, and an alkenyl group, and each group may have a substituent.

With regard to the alkyl group, the cycloalkyl group, the aryl group, the aralkyl group, and the alkenyl group, including the basic functional group or the ammonium group in R, the alkyl group, the cycloalkyl group, the aryl group, the aralkyl group, and the alkenyl group are the same as the alkyl group, the cycloalkyl group, the aryl group, the aralkyl group, and the alkenyl group, each mentioned as Rx.

Examples of the substituent which each of the groups may have include a halogen atom, a hydroxyl group, a nitro group, a cyano group, a carboxyl group, and a cycloalkyl group (preferably having 3 to 10 carbon atom; a part of the alkyl cycloalkyl group may be substituted with a heteroatom or a group (an ester group or the like) having a heteroatom), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). With regard to the cyclic structure in the aryl group, the cycloalkyl group and the like, examples of the substituent further include an alkyl group (preferably having 1 to 20 carbon atoms). With regard to the aminoacyl group, examples of the substituent further include one or two alkyl groups (preferably having 1 to 20 carbon atoms).

In a case where B is —N(Rx)-, R and Rx be preferably bonded to each other to form a ring. By forming a ring structure, the stability is improved, and the storage stability of a composition using the same is improved. The number of carbon atoms that form a ring is preferably 4 to 20, may be a monocycle or a polycycle, and may further include an oxygen atom, a sulfur atom, and/or a nitrogen atom in the ring.

Examples of the monocyclic structure include a 4- to 8-membered ring including a nitrogen atom. Examples of the polycyclic structure include a structure composed of a combination of two or more monocyclic structures.

Examples of such a ring structure include a piperazine ring and a piperidine ring.

The monocyclic structure and the polycyclic structure may have a substituent, and for example, a halogen atom, a hydroxyl group, a cyano group, a carboxyl group, a carbonyl group, a cycloalkyl group (preferably having 3 to 10 carbon atoms; a part of the cycloalkyl group may be substituted with a heteroatom or a group having a heteroatom (an ester group or the like)), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), an aminoacyl group (preferably having 2 to 20 carbon atoms), and the like is preferable. With regard to the cyclic structure in the aryl group, the cycloalkyl group and the like, examples of the substituent further include an alkyl group (preferably having 1 to 15 carbon atoms). With regard to the aminoacyl group, examples of the substituent include one or two alkyl groups (preferably having 1 to 15 carbon atoms).

Next, the acid represented by General Formula (PA-11) will be described.

$$Q_1\text{-}X_1\text{—}NH\text{—}X_2\text{-}Q_2 \qquad (PA\text{-}II)$$

In General Formula (PA-II), $Q_1$ and $Q_2$ each independently represent a monovalent organic group. It should be noted that any one of $Q_1$ or $Q_2$ has a basic functional group. $Q_1$ and $Q_2$ may be bonded to each other to form a ring, and the ring thus formed may have a basic functional group.

$X_1$ and $X_2$ each independently represent —CO— or —SO$_2$—.

In General Formula (PA-II), the monovalent organic group as each of $Q_1$ and $Q_2$ preferably has 1 to 40 carbon atoms and examples thereof include an alkyl group, a cycloalkyl group, an aryl group, an aralkyl group, and an alkenyl group.

The alkyl group in each of $Q_1$ and $Q_2$ may have a substituent, is preferably a linear or branched alkyl group having 1 to 30 carbon atoms, and may have an oxygen atom, a sulfur atom, and/or a nitrogen atom in the alkyl chain.

The cycloalkyl group in each of $Q_1$ and $Q_2$ may have a substituent, is preferably a cycloalkyl group having 3 to 20 carbon atoms, and may have an oxygen atom and/or a nitrogen atom in the ring.

The aryl group in each of $Q_1$ and $Q_2$ may have a substituent and is preferably an aryl group having 6 to 14 carbon atoms.

The aralkyl group in each of $Q_1$ and $Q_2$ may have a substituent and is preferably an aralkyl group having 7 to 20 carbon atoms.

The alkenyl group in each of $Q_1$ and $Q_2$ may have a substituent, and examples thereof include a group having a double bond at any position of the alkyl group.

Examples of the substituent which may be contained in each of the groups include a halogen atom, a hydroxyl group, a nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 10 carbon atoms). With regard to the cyclic structure in the aryl group, cycloalkyl group and the like, examples of the substituent further include an alkyl group (preferably having 1 to 10 carbon atoms). With regard to the aminoacyl group, examples of the substituent further include an alkyl group (preferably having 1 to 10 carbon atoms). Examples of the alkyl group having a substituent include a perfluoroalkyl group such as a perfluoromethyl group, a perfluoroethyl group, a perfluoropropyl group, and a perfluorobutyl group.

Examples of a preferred partial structure of the basic functional group of at least one of $Q_1$ or $Q_2$ include the same as those described as the basic functional group of R in General Formula (PA-I).

Examples of the structure in which $Q_1$ and $Q_2$ may be bonded to each other to form a ring and the ring thus formed has a basic functional group include a structure in which an organic group of $Q_1$ and $Q_2$ is further bonded with an alkylene group, an oxy group, an imino group, or the like.

In General Formula (PA-II), at least one of $X_1$ or $X_2$ is preferably —SO$_2$—.

Next, the acid represented by General Formula (PA-III) will be described.

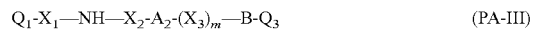
$$Q_1\text{-}X_1\text{—}NH\text{—}X_2\text{-}A_2\text{-}(X_3)_m\text{—}B\text{-}Q_3 \qquad (PA\text{-}III)$$

In General Formula (PA-III), $Q_1$ and $Q_3$ each independently represent a monovalent organic group. It should be noted that any one of $Q_1$ or $Q_3$ has a basic functional group. $Q_1$ and $Q_3$ may be bonded to each other to form a ring and the ring thus formed may have a basic functional group.

$X_1$, $X_2$, and $X_3$ each independently represent —CO— or —SO$_2^-$.

A2 represents a divalent linking group.

B represents a single bond, an oxygen atom or —N(Qx)-.

Qx represents a hydrogen atom or a monovalent organic group.

In a case where B is —N(Qx)-, $Q_3$ and Qx may be bonded to each other to form a ring.

m represents 0 or 1.

$Q_1$ has the same meaning as $Q_1$ in General Formula (PA-II).

Examples of the organic group for $Q_3$ include the same ones as the organic groups for $Q_1$ and $Q_2$ in General Formula (PA-II).

In addition, examples of a structure in which $Q_1$ and $Q_3$ are bonded to each other to form a ring and the ring thus formed has a basic functional group include a structure in which the organic group of $Q_1$ and $Q_3$ is further bonded with an alkylene group, an oxy group, an imino group, or the like.

The divalent linking group in A2 is preferably a divalent linking group having a fluorine atom, which has 1 to 8 carbon atoms, and examples thereof include an alkylene group having a fluorine atom, which has 1 to 8 carbon atoms, and a phenylene group having a fluorine atom. The divalent linking group is more preferably an alkylene group having a fluorine atom, and preferably has 2 to 6 carbon atoms, and more preferably has 2 to 4 carbon atoms. The alkylene chain may have a linking group such as an oxygen atom and/or a sulfur atom. The alkylene group is preferably an alkylene group in which 30% to 100% of the hydrogen atoms are substituted with fluorine atoms, more preferably a perfluoroalkylene group, and particularly preferably a perfluoroalkylene group having 2 to 4 carbon atoms.

The monovalent organic group in Qx is preferably an organic group having 4 to 30 carbon atoms, and examples thereof include an alkyl group, a cycloalkyl group, an aryl group, an aralkyl group, and an alkenyl group. Examples of the alkyl group, the cycloalkyl group, the aryl group, the aralkyl group, and the alkenyl group include the same ones as those of Rx in Formula (PA-I).

In General Formula (PA-III), $X_1$, $X_2$, and $X_3$ are each preferably —$SO_2$—.

(Anion)

The compound Y is preferably an onium salt compound formed of an anion and a cation.

Examples of the anion in the compound Y include anions formed by removing hydrogen atoms from —COOH, —$SO_3$H, and —NH— specified in General Formula (d1), General Formula (d2), General Formula (PA-I), General Formula (PA-II), or General Formula (PA-III) to provide -COO$^-$, —$SO_3^-$, and —N$^-$—.

Specific examples thereof include an anion represented by General Formula (d1a), General Formula (d2a), General Formula (PA-Ia), General Formula (PA-IIa), or General Formula (PA-IIIa).

$$Rd^1\text{-COO}^- \quad (d1a)$$

$$Rd^1\text{-}SO_3^- \quad (d2a)$$

$$Q_a\text{-}A_1\text{-}(X)_n\text{—}B\text{—}R \quad (PA\text{-}Ia)$$

$$Q_1\text{-}X_1\text{—}N^-\text{—}X_2\text{-}Q_2 \quad (PA\text{-}IIa)$$

$$Q_1\text{-}X_1\text{—}N^-\text{—}X_2\text{-}A_2\text{-}(X_3)_m\text{—}B\text{-}Q_3 \quad (PA\text{-}IIIc)$$

Each symbol in each formula has the same meaning as the corresponding symbol in the corresponding formula.

It should be noted that in General Formula (PA-Ia), $Q_a$ represents —$SO_3^-$ or —COO$^-$.

Furthermore, the anions represented by General Formulae (d1a) and (d2a) are obtained by removing a hydrogen atom from —COOH and —$SO_3$H of the acids represented by General Formula (d1-a) and (d2-a), respectively. The anion is preferably an anion represented by General Formulae (d1-aa) and (d2-aa).

(d1-aa)

(d2-aa)

Each symbol in each formula has the same meaning as the corresponding symbol in the corresponding formula.

The anion represented by General Formula (d1a) is exemplified.

In addition, a pka for the conjugate acid calculated using "Software V11.02 (1994-2013 ACD/Labs)" (trade name, manufactured Advanced Chemistry Development) is shown.

(d1-a1)
pKa2.45

(d1-a2)
pKa2.85

(d1-a3)
pKa2.68

(d1-a4)
pKa2.68

(d1-a5)
pKa1.53

(d1-a6)
pKa1.99

-continued
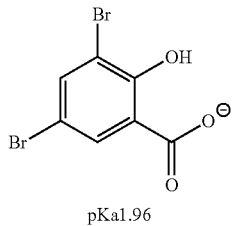
pKa1.96
(d1-a7)
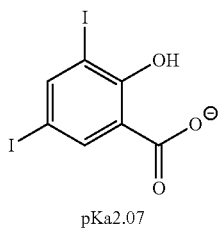
pKa2.07
(d1-a8)
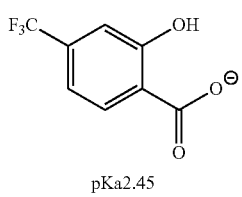
pKa2.45
(d1-a9)
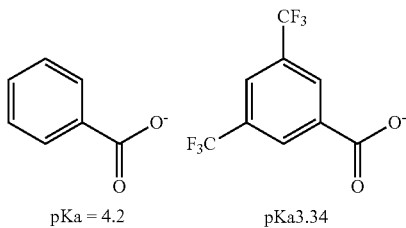
pKa = 4.2    pKa3.34
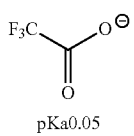
pKa0.05
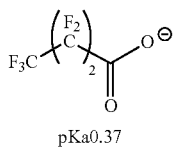
pKa0.37
(d1-a12)
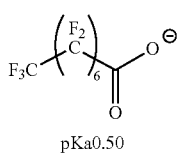
pKa0.50
(d1-a13)
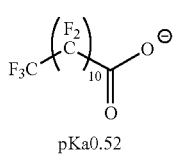
pKa0.52
(d1-a14)
-continued
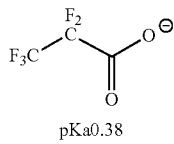
pKa0.38
(d1-a15)
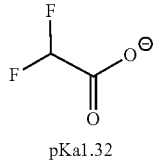
pKa1.32
(d1-a16)
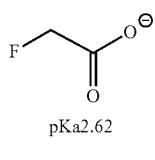
pKa2.62
(d1-a17)
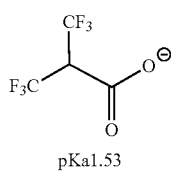
pKa1.53
(d1-a18)
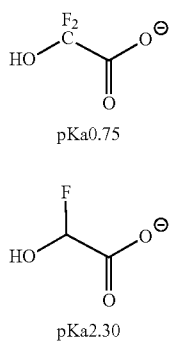
pKa0.75
(d1-a19)
pKa2.30
(d1-a20)
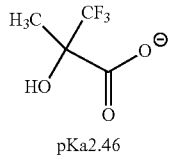
pKa2.46
(d1-a21)
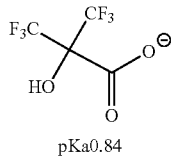
pKa0.84
(d1-a22)
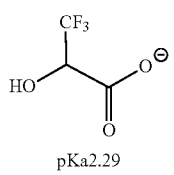
pKa2.29
(d1-a23)

-continued

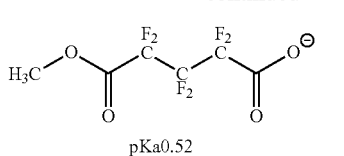
(d1-a24)
pKa0.52

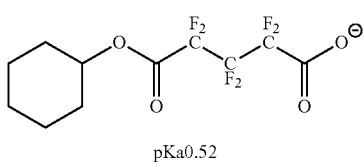
(d1-a25)
pKa0.52

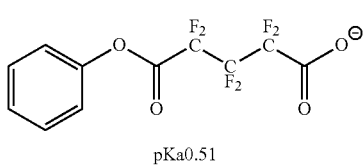
(d1-a26)
pKa0.51

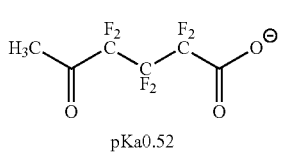
(d1-a27)
pKa0.52

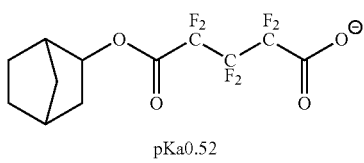
(d1-a28)
pKa0.52

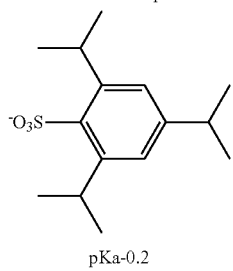
pKa-0.2

(Cation)

The compound Y is preferably the onium salt compound, and more preferably a sulfonium salt compound of the anion represented by General Formula (d1a), General Formula (d2a), General Formula (PA-Ia), General Formula (PA-IIa), or General Formula (PA-IIIa) with a sulfonium cation, or an iodonium salt compound of the anion represented by General Formula (d1a), General Formula (d2a), General Formula (PA-Ia), General Formula (PA-IIa), or General Formula (PA-IIIa) with an iodonium cation.

The sulfonium cation of the sulfonium salt compound is preferably represented by General Formula (ZI) and the iodonium cation of the iodonium salt compound is preferably represented by General Formula (ZII).

In General Formula (ZI), $R_{201}$, $R_{202}$, and $R_{203}$ each independently represent an organic group.

The organic group as each of $R_{201}$, $R_{202}$, and $R_{203}$ preferably has 1 to 30 carbon atoms, and more preferably has 1 to 20 carbon atoms.

In addition, two of $R_{201}$ to $R_{203}$ may be bonded to each other to form a ring structure and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group).

Examples of the organic group of each of $R_{201}$, $R_{202}$, and $R_{203}$ include an aryl group, an alkyl group, and a cycloalkyl group.

It is preferable that at least one of $R_{201}$, $R_{202}$, or 8203 is an aryl group, and it is more preferable that all of $R_{201}$, $R_{202}$, and $R_{203}$ represent an aryl group. As the aryl group, not only a phenyl group, a naphthyl group, or the like but also a heteroaryl group such as an indole residue and a pyrrole residue can also be used.

As the alkyl group of each of $R_{201}$ to $R_{203}$, a linear or branched alkyl group having 1 to 10 carbon atoms is preferable, and a methyl group, an ethyl group, an n-propyl group, an i-propyl group, an n-butyl group, or the like is more preferable.

As the cycloalkyl group of each of $R_{201}$ to $R_{203}$, a cycloalkyl group having 3 to 10 carbon atoms is preferable, and a cyclopropyl group, a cyclobutyl group, a cyclopentyl group, a cyclohexyl group, or a cycloheptyl group is more preferable.

Examples of the substituent which may be contained in such the groups include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably 6 to 14 carbon atoms), an alkoxycarbonyl group (preferably 2 to 7 carbon atoms), an acyl group (preferably 2 to 12 carbon atoms), an arylcarbonyl group (preferably having 7 to 15 carbon atoms), an alkylarylcarbonyl group (preferably having 8 to 18 carbon atoms), a cycloalkylsulfonyl group, and an alkoxycarbonyloxy group (preferably having 2 to 7 carbon atoms). Further, the substituent may have an acid-decomposable group.

In General Formula (ZII), $R_{204}$ to $R_{205}$ each independently represent an aryl group, an alkyl group, or a cycloalkyl group.

The aryl group, the alkyl group, and the cycloalkyl group of each of $R_{204}$ and $R_{205}$ are the same as the groups described as the aryl group, the alkyl group, and the cycloalkyl group of each of $R_{201}$ to $R_{203}$, respectively, in General Formula (ZI).

Examples of the substituents which may be contained in the aryl group, the alkyl group, and the cycloalkyl group of each of $R_{204}$ and $R_{205}$ include the substituents which may be contained in the aryl group, the alkyl group, and the cycloalkyl group of each of $R_{201}$ to $R_{203}$ in the above-mentioned General Formula (ZI).

As the compound Y, a compound represented by General Formula (PA1) or (PA2) is preferable.

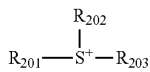 (ZI)

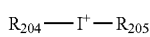 (ZII)

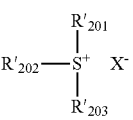 (PA1)

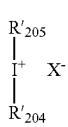
(PA2)

In General Formula (PA1),

R'$_{201}$, R'$_{202}$, and R'$_{203}$ each independently represent an organic group, and specifically, are the same as R$_{201}$, R$_{202}$, and R$_{203}$ in Formula (ZI).

X$^-$ represents an anion. The anion is preferably an anion represented by General Formula (d1a), (d2a), (PA-Ia), (PA-II), or (PA-IIIa).

In General Formula (PA2),

R'$_{204}$ and R'$_{205}$ each independently represent an aryl group, an alkyl group, or a cycloalkyl group, and specifically, they are the same as R$_{204}$ and R$_{205}$ in Formula (ZII).

X$^-$ represents an anion. The anion is preferably an anion represented by General Formula (d1a), (d2a), (PA-Ia), (PA-IIa), or (PA-IIIa).

The compound Y is exemplified below. A compound obtained by appropriately modifying the combination of an anion and a cation in the following exemplified compounds may be used as the compound Y as long as it is a basic compound or ammonium salt compound whose basicity is reduced upon irradiation with actinic rays or radiation.

Furthermore, similarly, a compound obtained by appropriately combining the anion exemplified in the upper part as the anion represented by General Formula (d1a) and the cation in the following exemplified compounds may be used as the compound Y.

(PA-1)

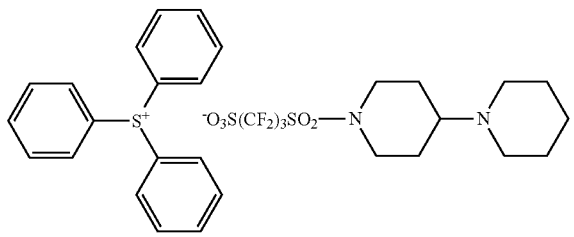

(PA-2)

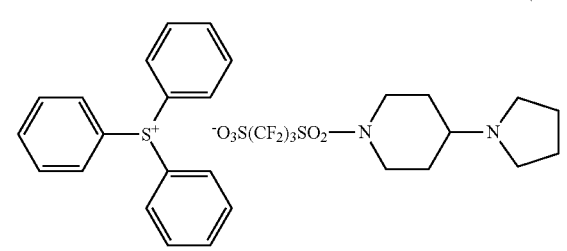

(PA-3)

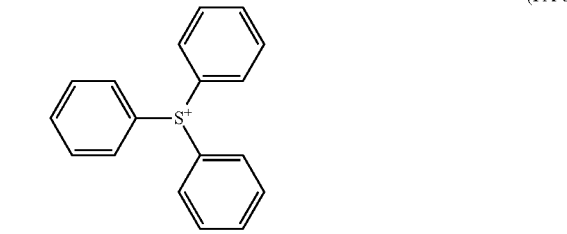

(PA-4)

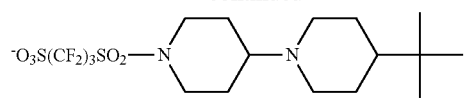

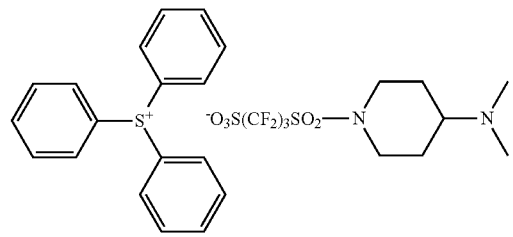

(PA-5)

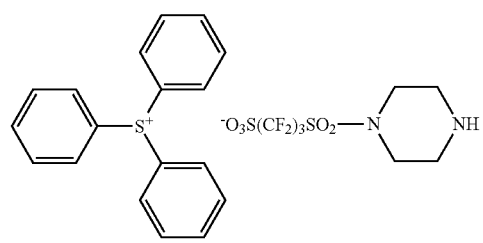

(PA-6)

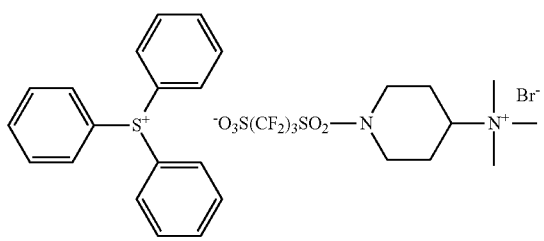

(PA-7)

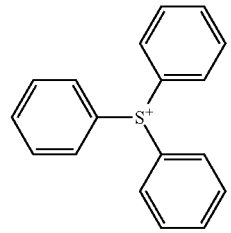

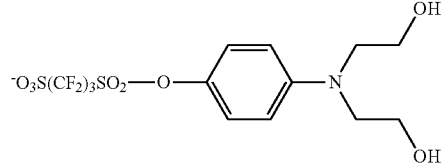

(PA-8)

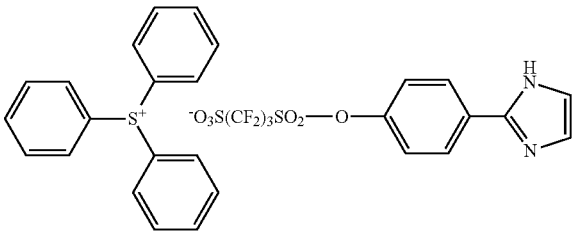

(PA-9)
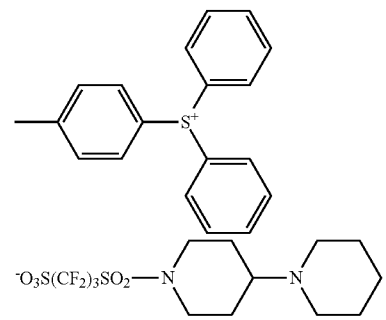
(PA-10)
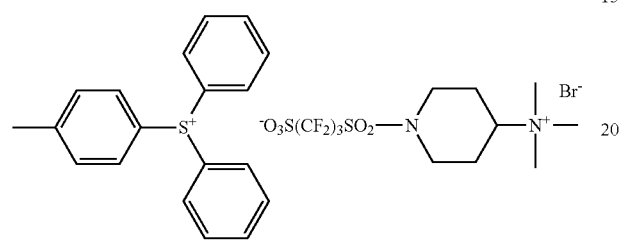
(PA-11)
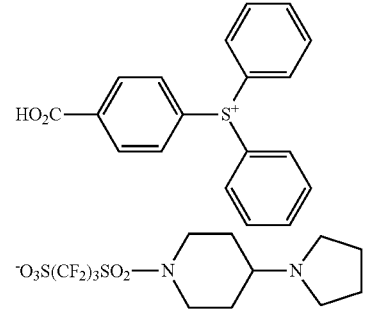
(PA-12)
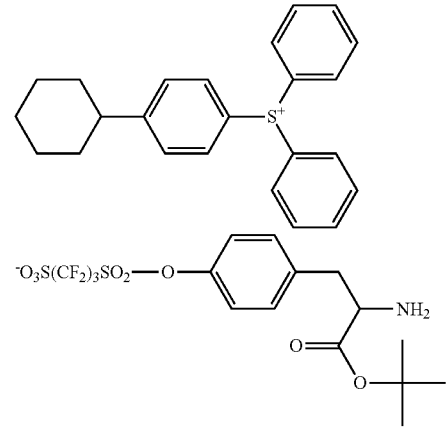
(PA-13)
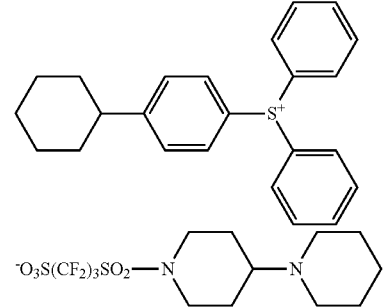
(PA-14)
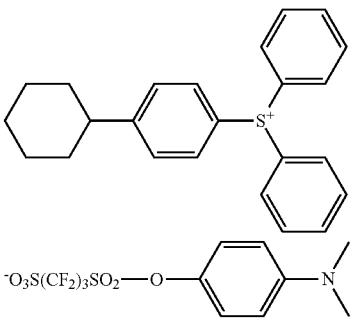
(PA-15)
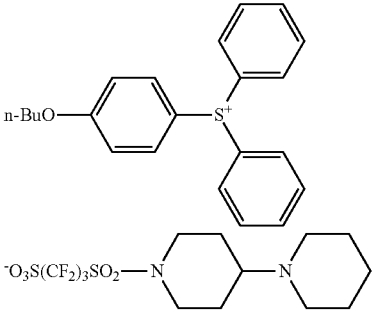
(PA-16)
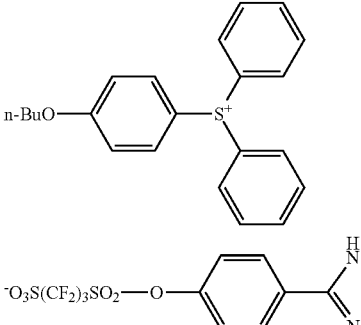
(PA-17)
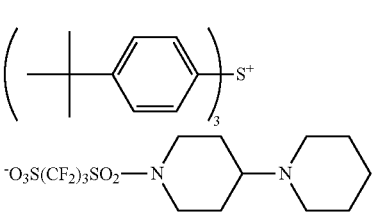
(PA-18)
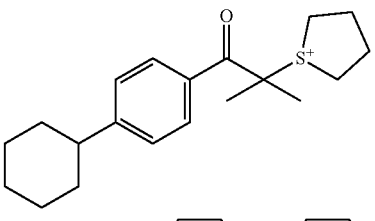
(PA-19)
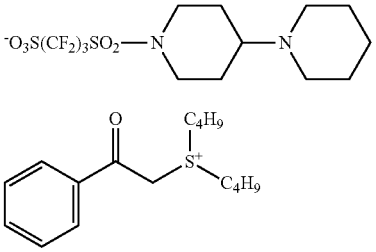

-continued
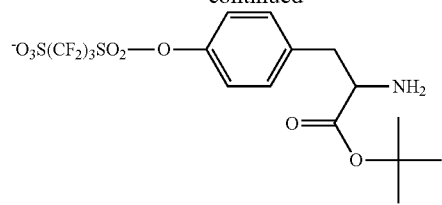
(PA-20)
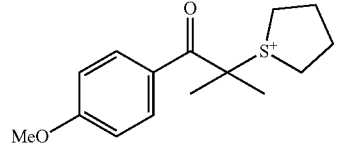
(PA-21)
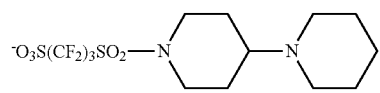
(PA-22)
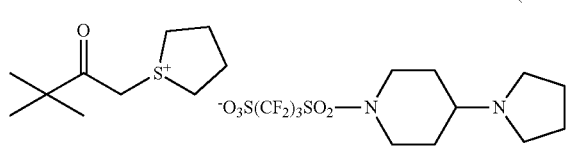
(PA-23)
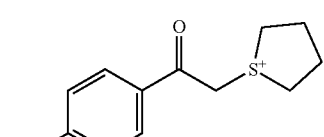
(PA-24)
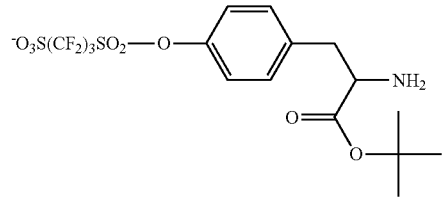
(PA-25)
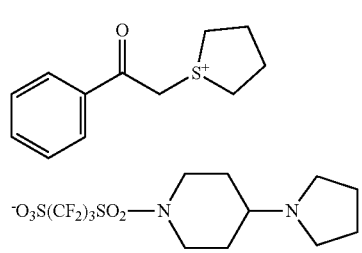
-continued
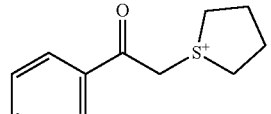
(PA-26)
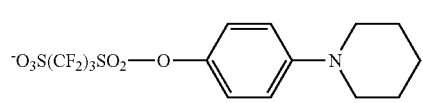
(PA-27)
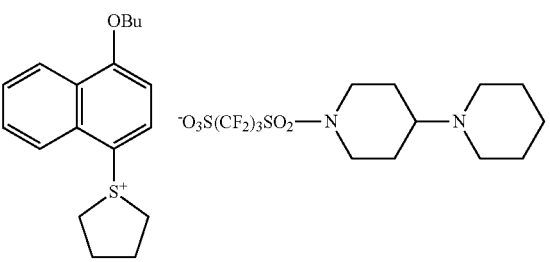
(PA-28)
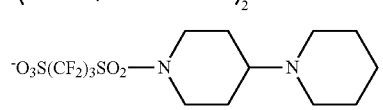
(PA-29)
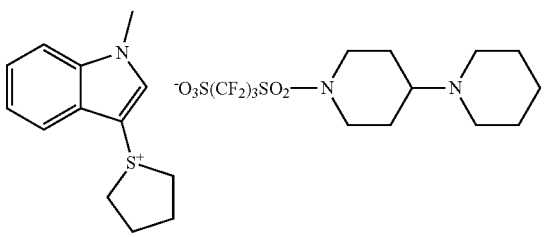
(PA-30)
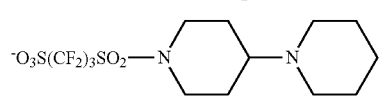
(PA-31)
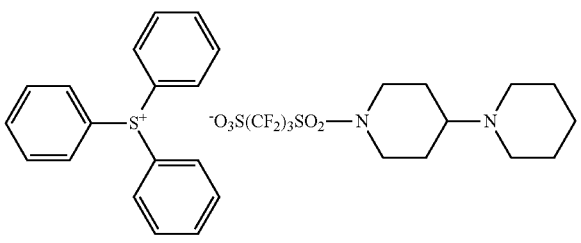

-continued
(PA-32)
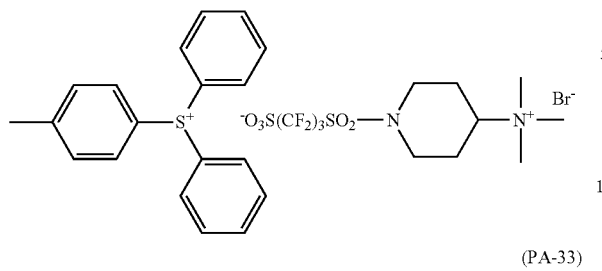
(PA-33)
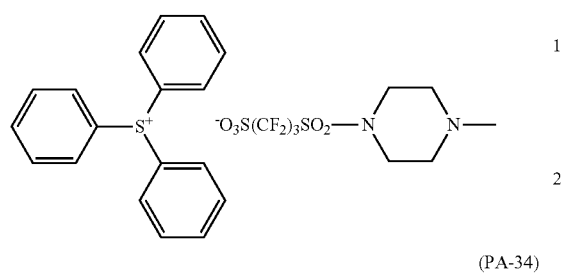
(PA-34)
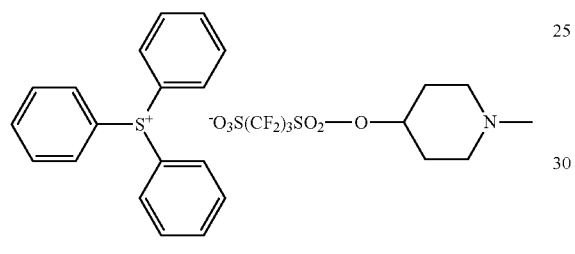
(PA-35)
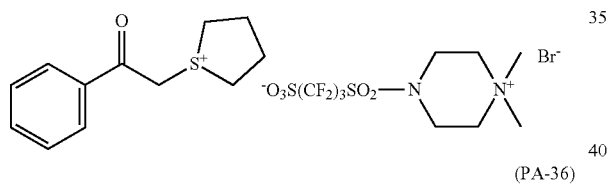
(PA-36)
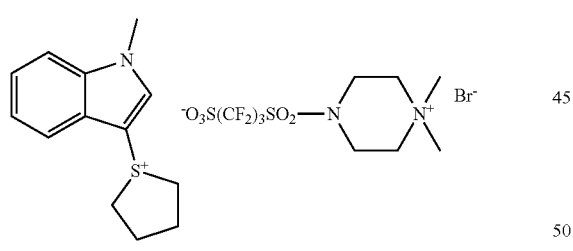
(PA-37)
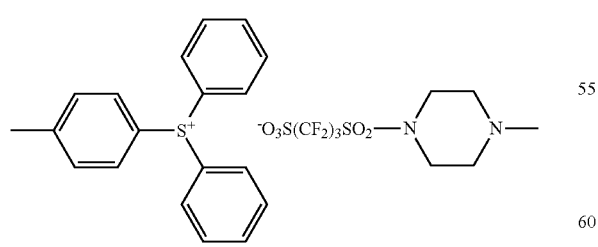
(PA-38)
-continued
(PA-39)
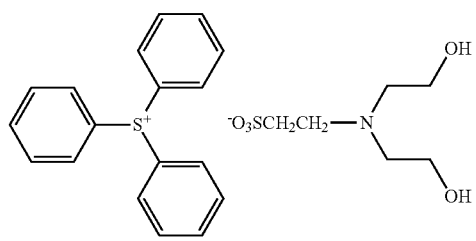
(PA-40)
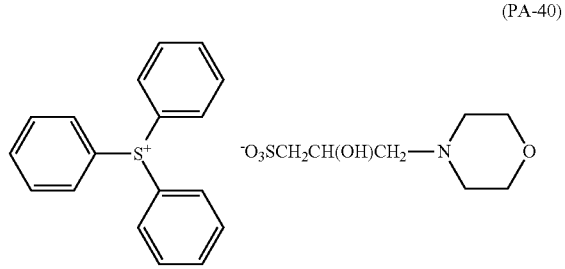
(PA-41)
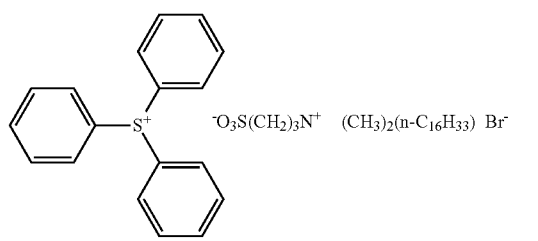
(PA-42)
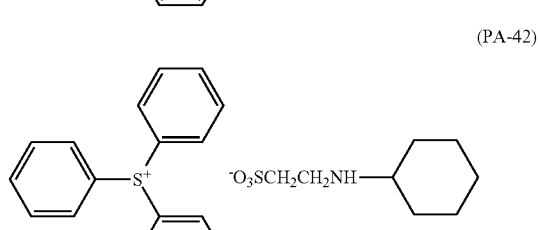
(PA-43)
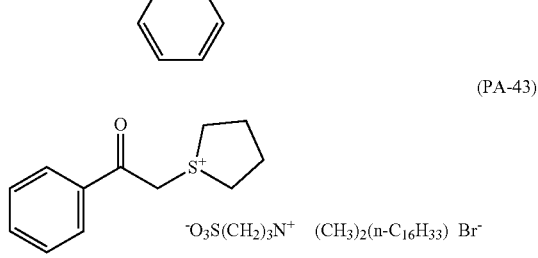
(PA-44)
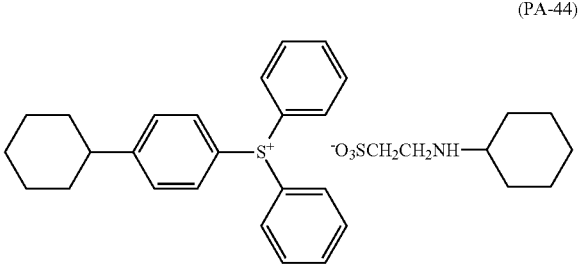

(PA-45)
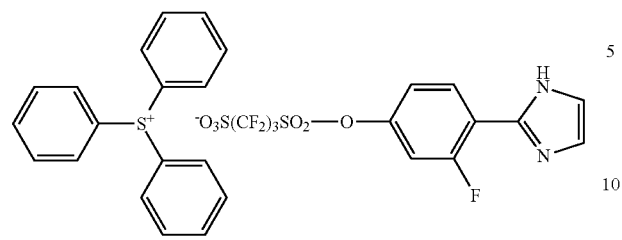
(PA-46)
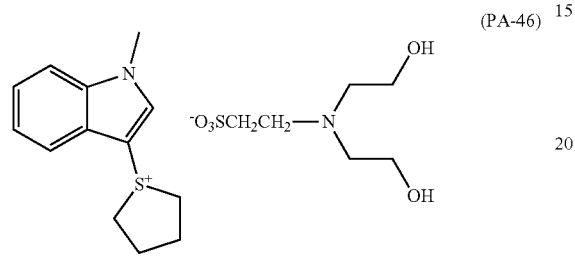
(PA-47)
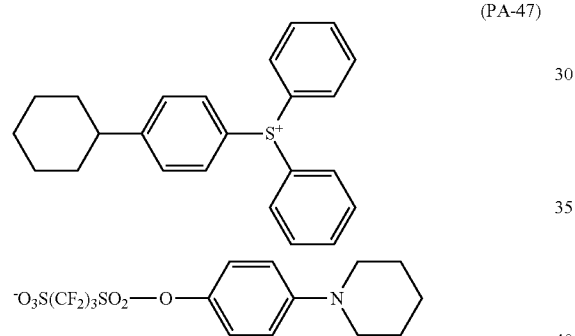
(PA-48)
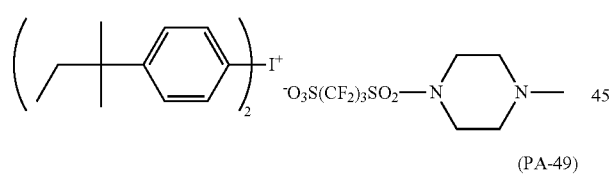
(PA-49)
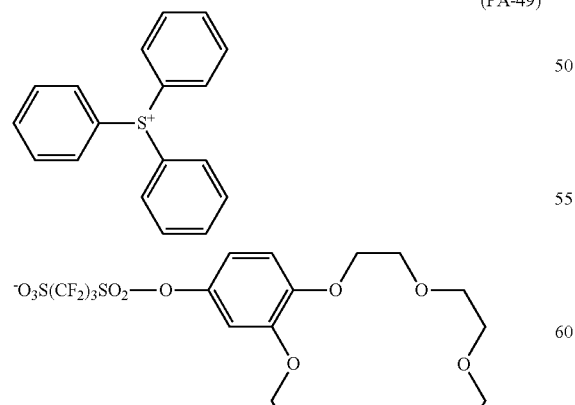
(PA-50)
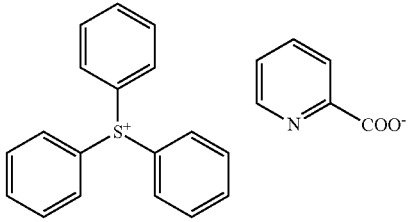
(PA-51)
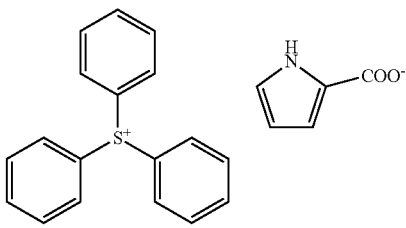
(PA-52)
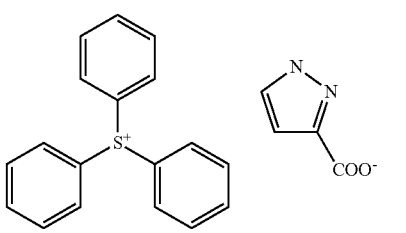
(PA-53)
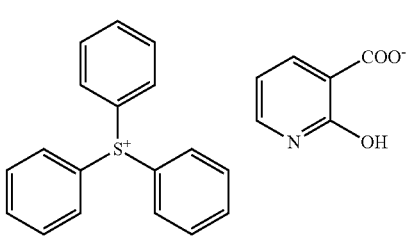
(PA-54)
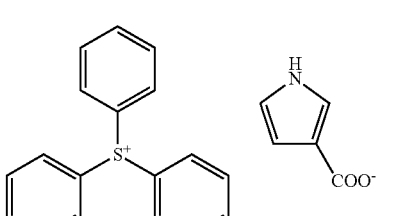
(PA-55)
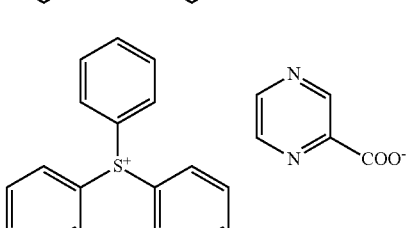
(PA-56)
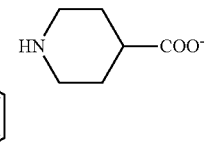

(PA-57)
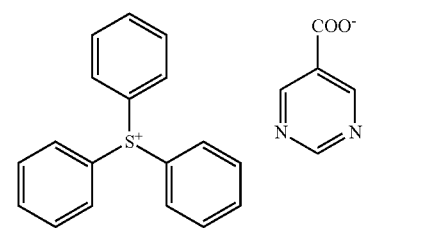
(PA-58)
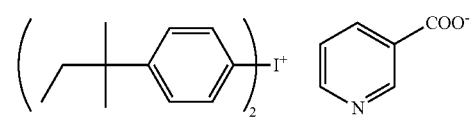
(PA-59)
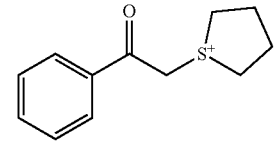
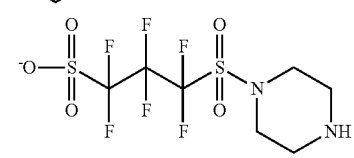
(PA-60)
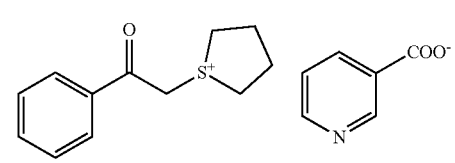
(PA-61)
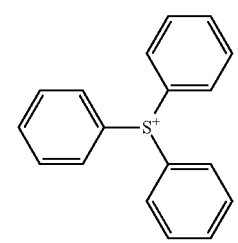
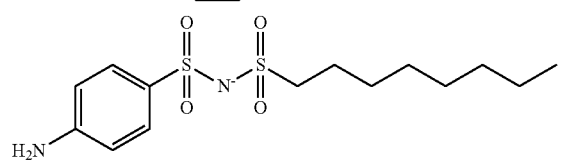
(PA-62)
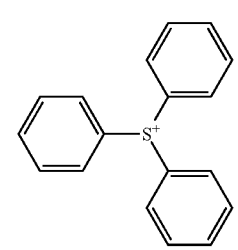 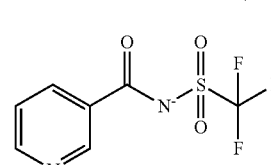
(PA-63)
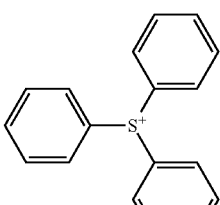
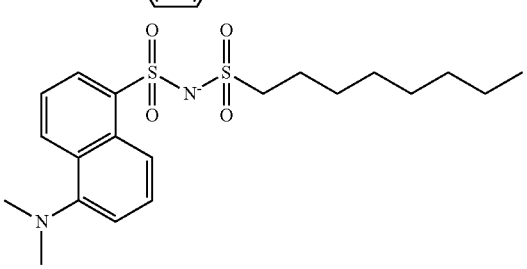
(PA-64)
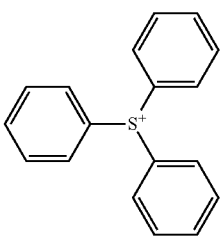
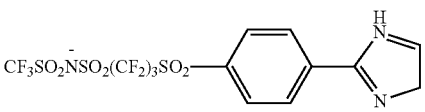
(PA-65)
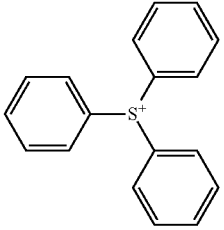
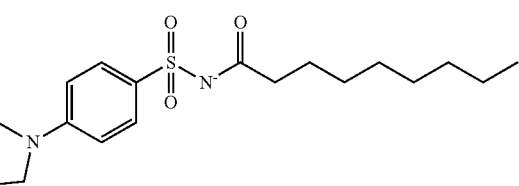
(PA-66)
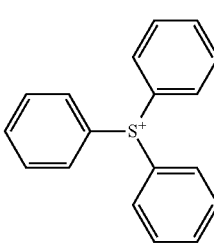 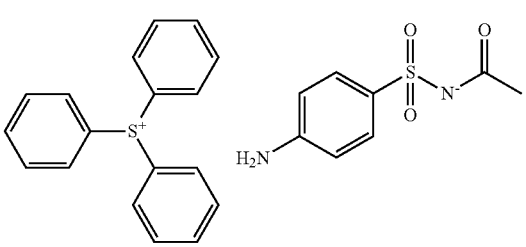

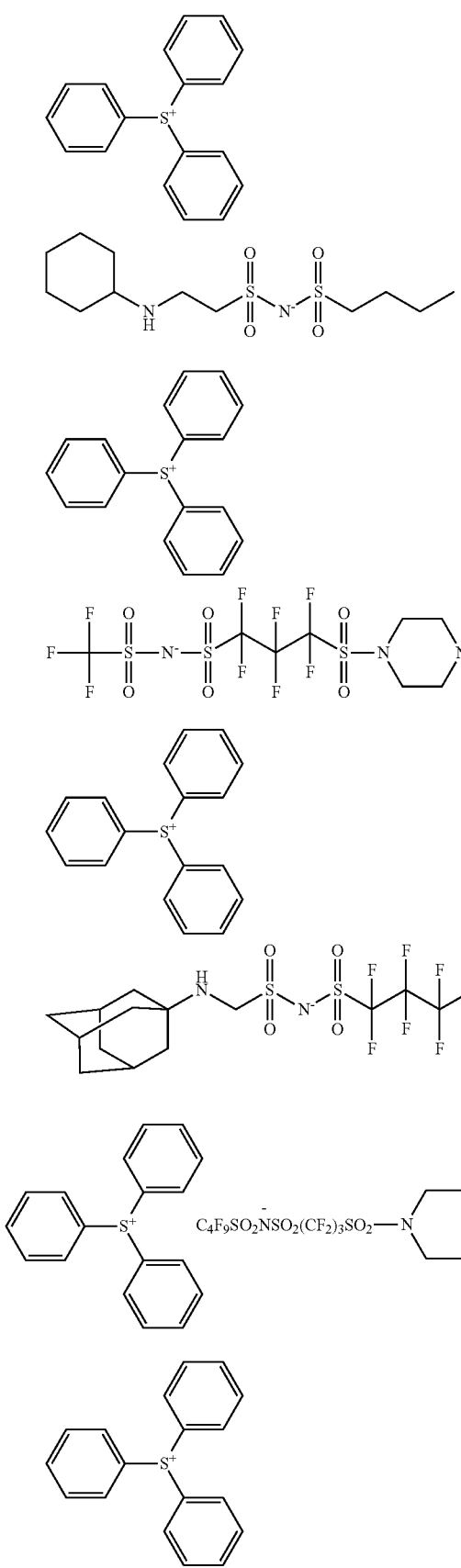

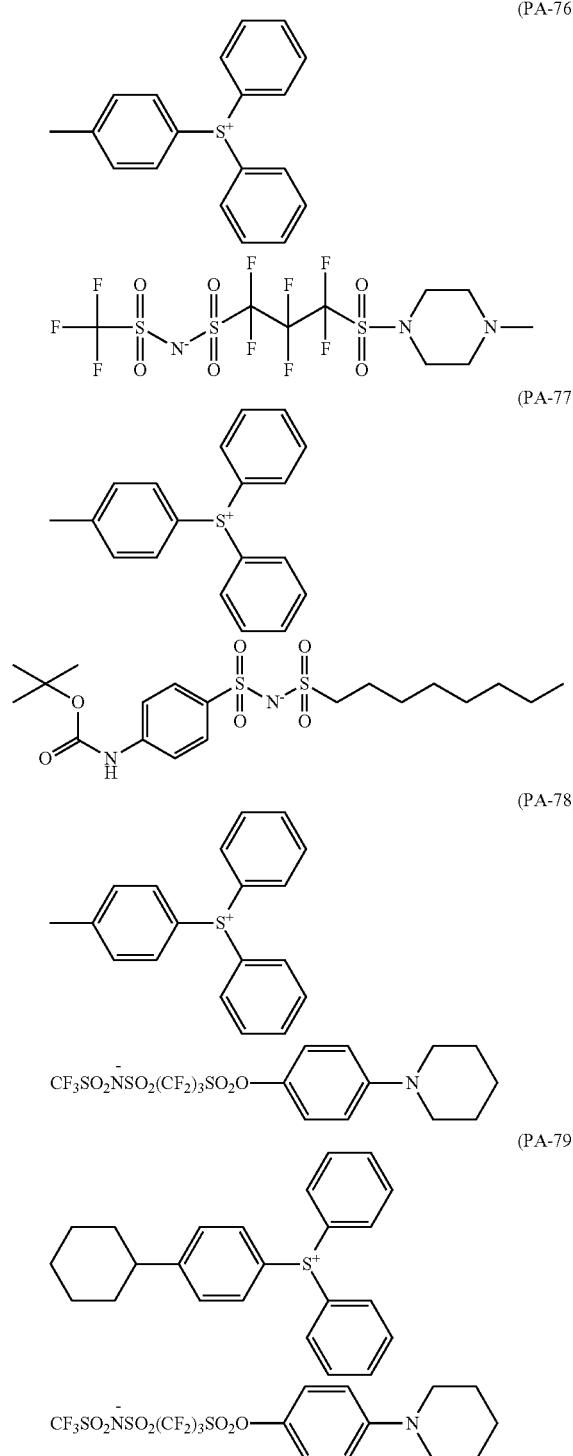

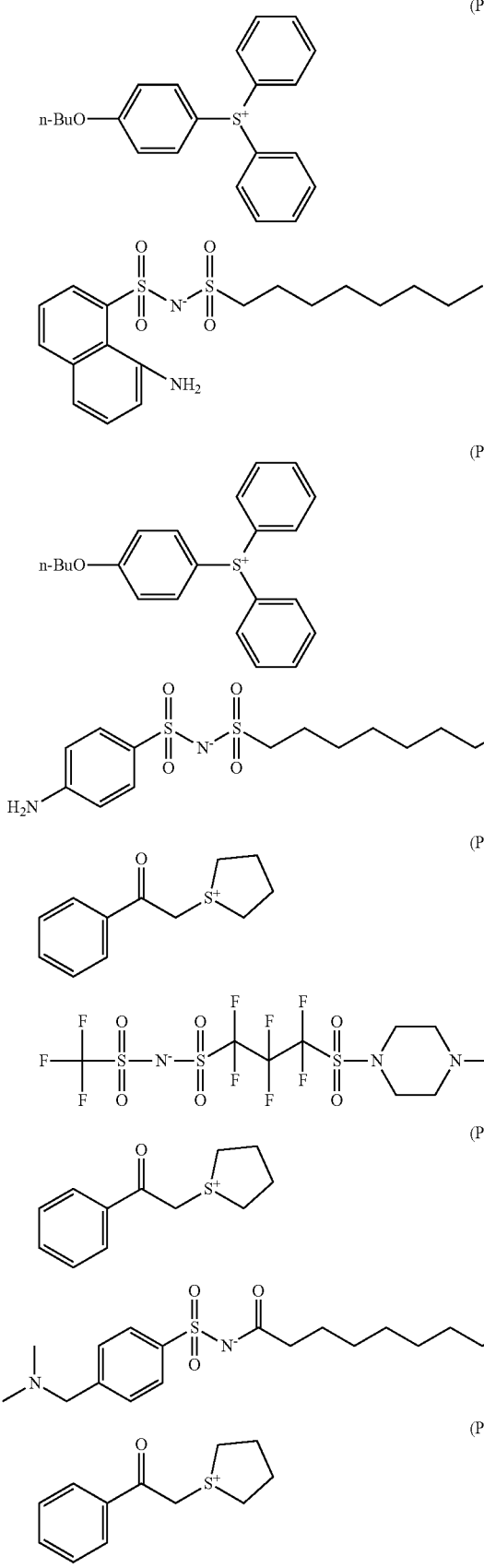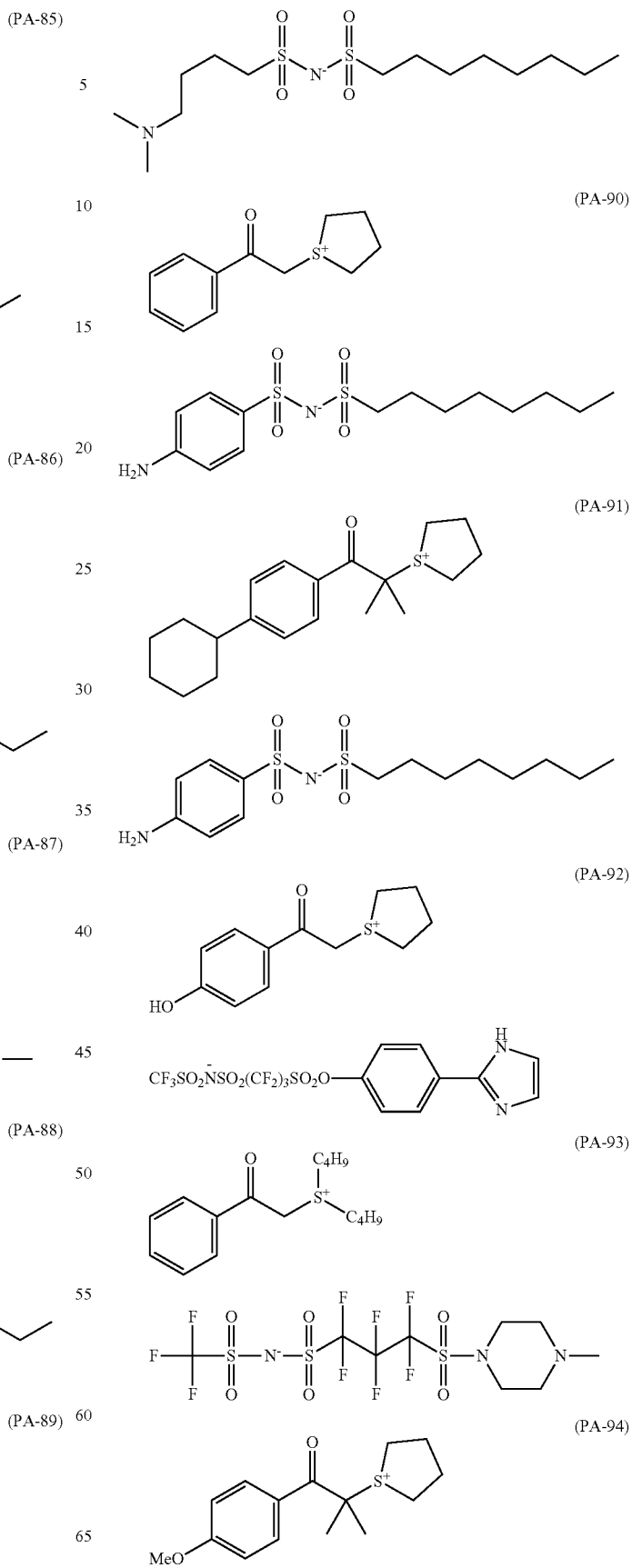

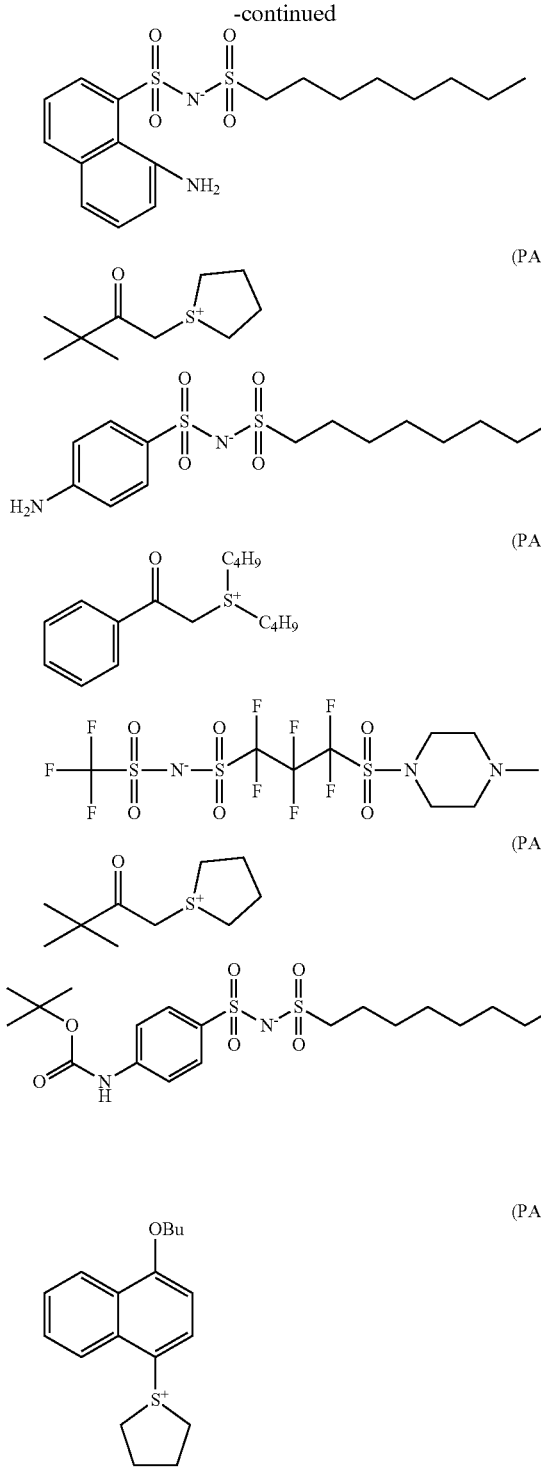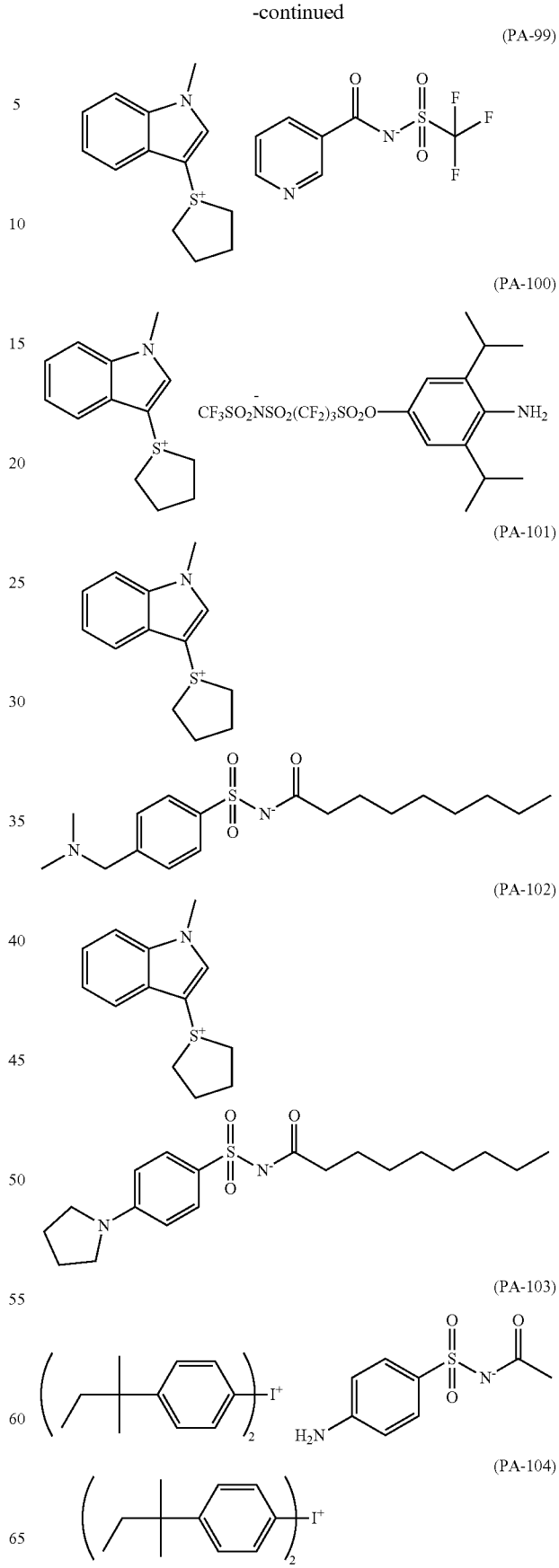

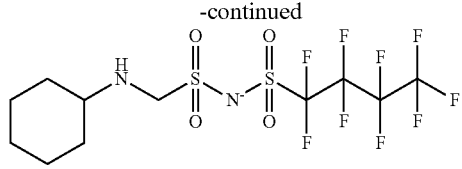
(PA-105)
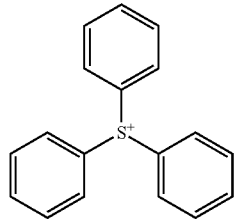
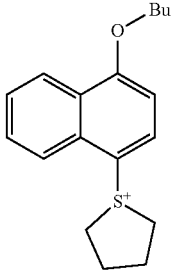
(PA-109)
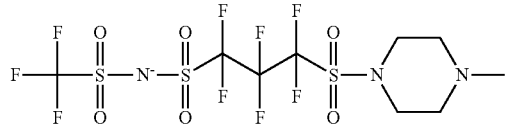
(PA-106)
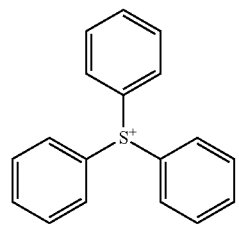
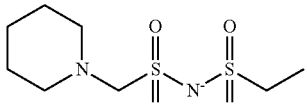
(PA-107)
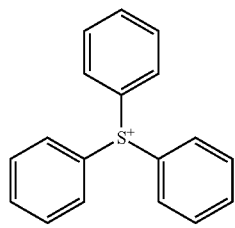
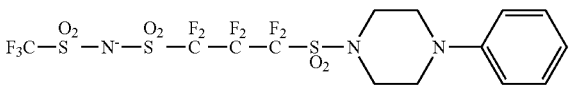
(PA-110)
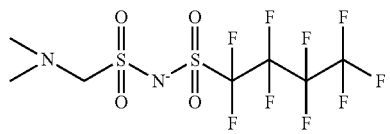
(PA-108)
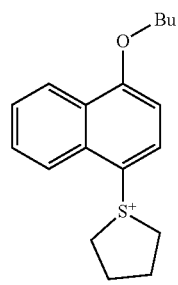
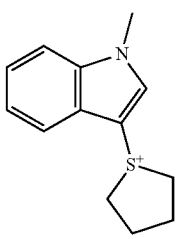
(PA-111)
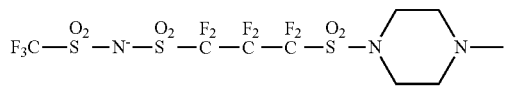
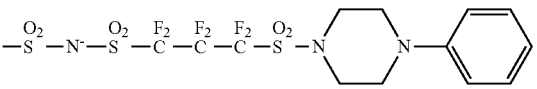
(PA-112)

(PA-113) 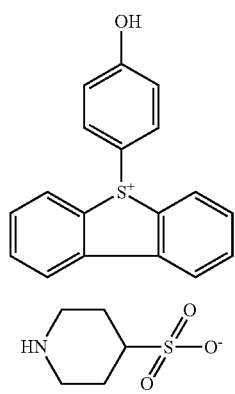
(PA-117) 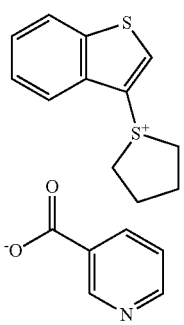
(PA-114) 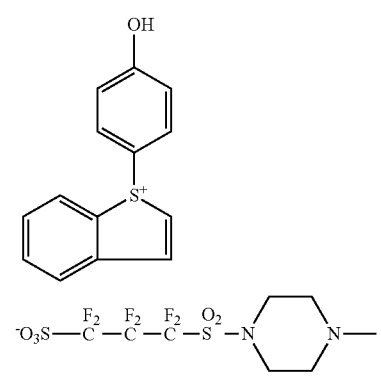
(PA-118) 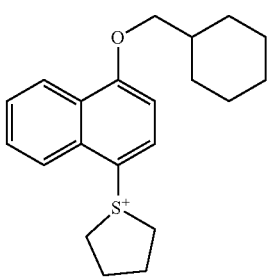
(PA-115) 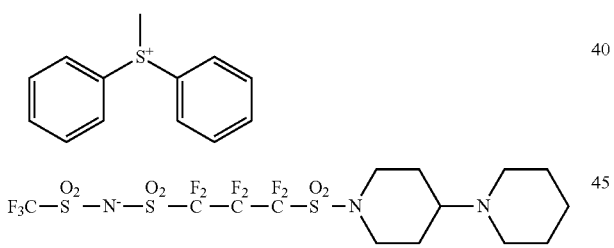
(PA-119) 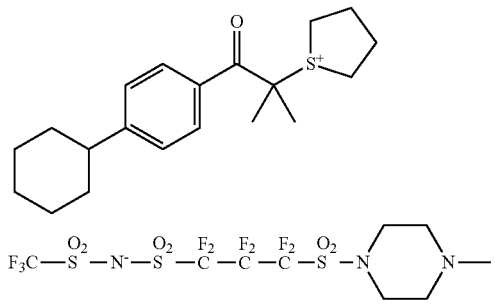
(PA-116) 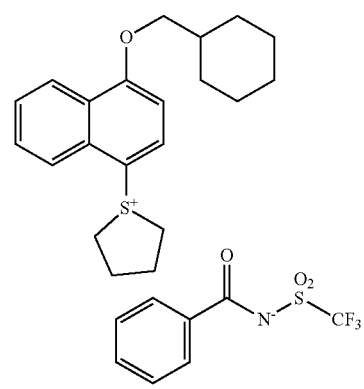
(PA-120) 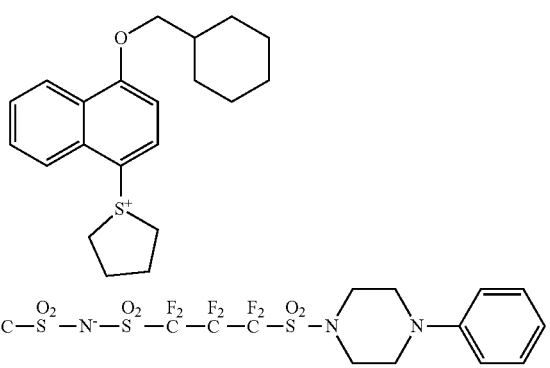

(PA-121)
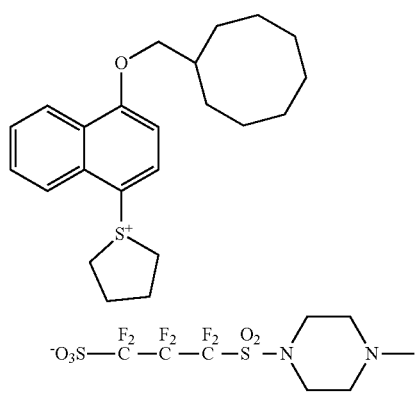
(PA-122)
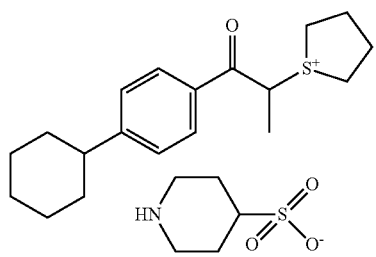
(PA-123)
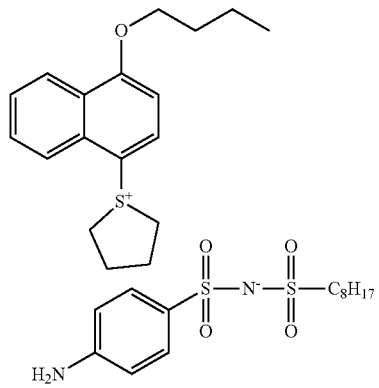
(PA-124)
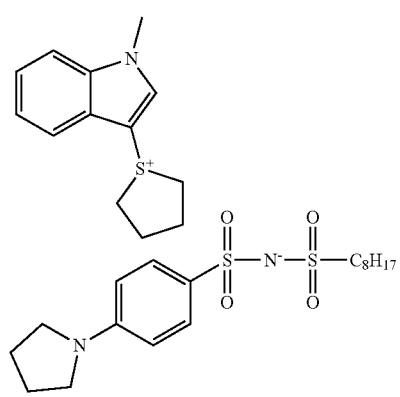
(PA-125)
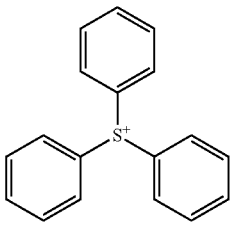
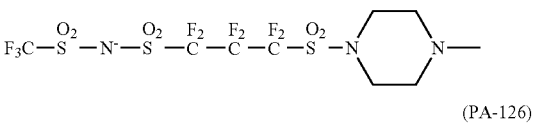
(PA-126)
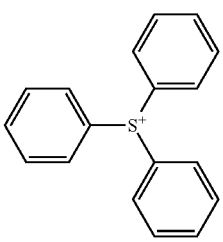
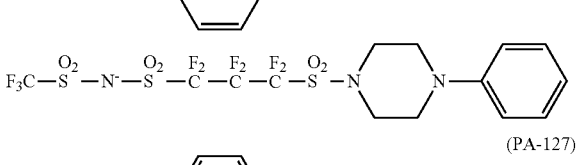
(PA-127)
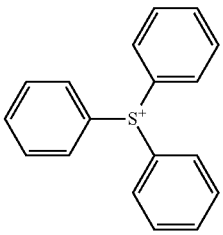
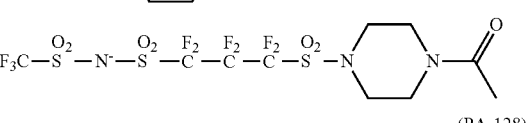
(PA-128)
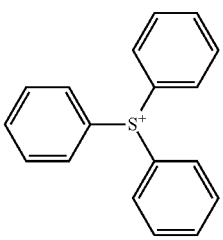
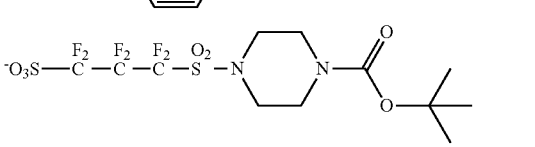
(PA-129)
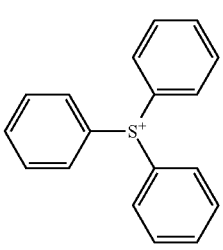

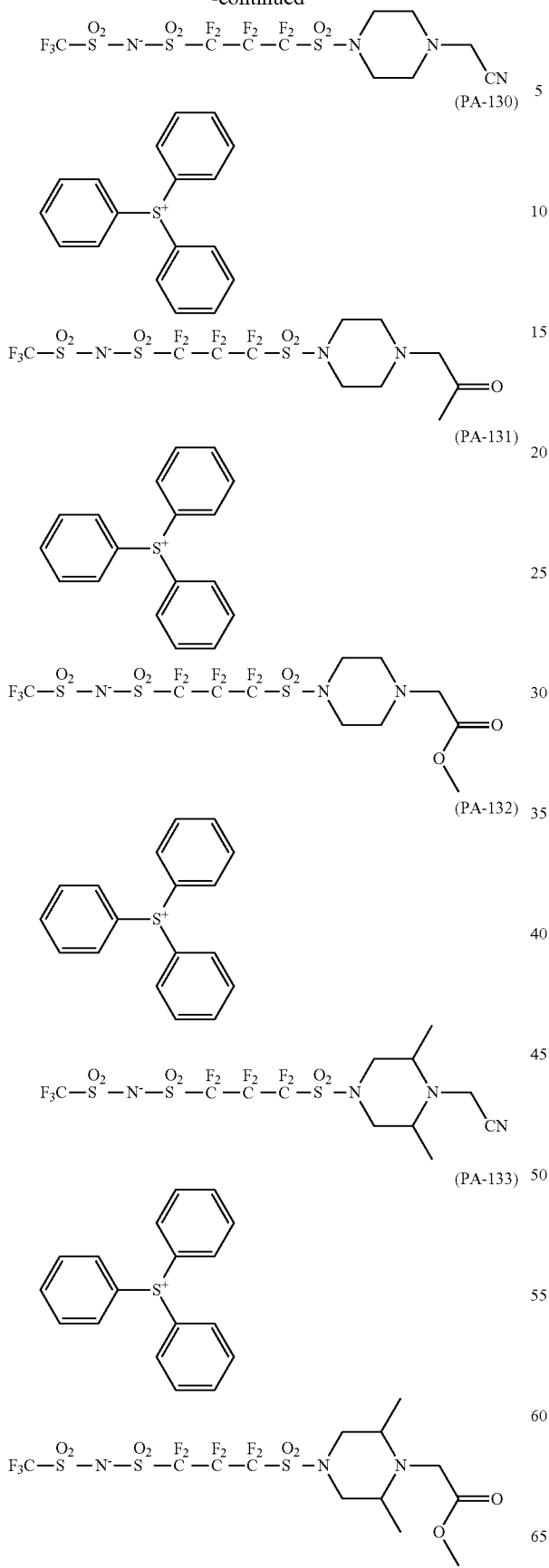
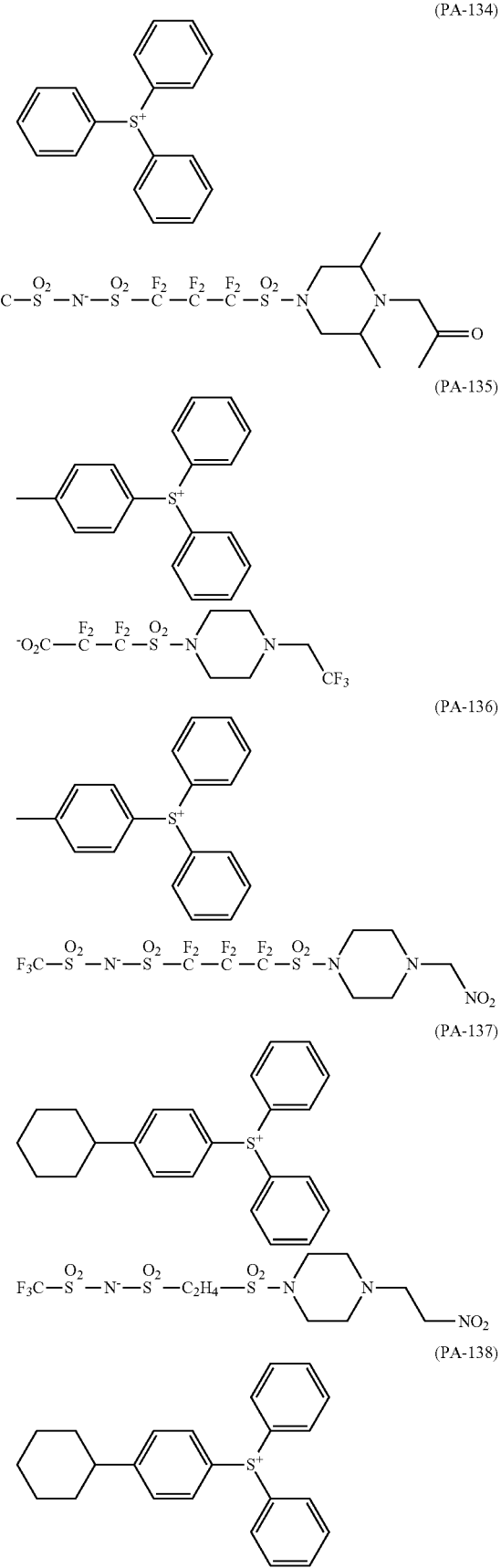

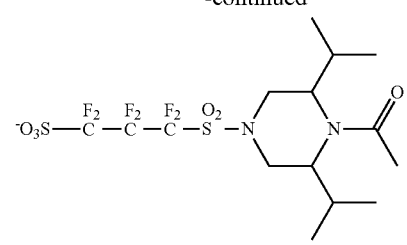
(PA-139)
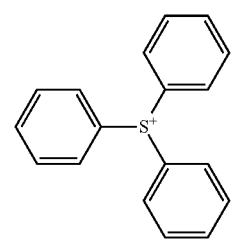
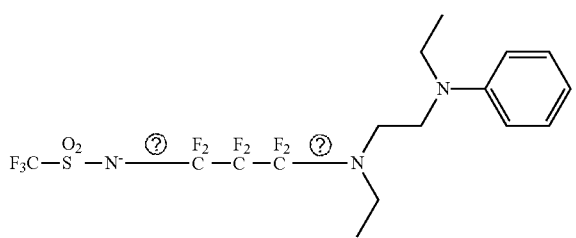
(PA-140)
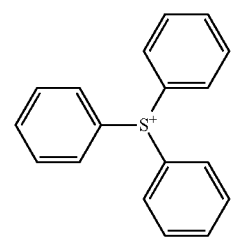
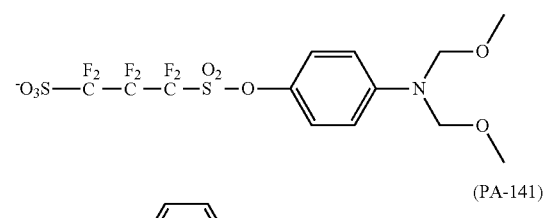
(PA-141)
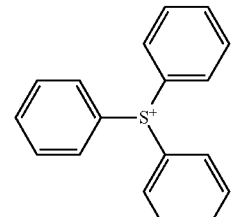
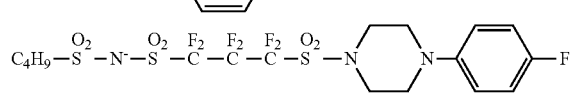
(PA-142)
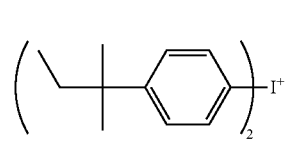
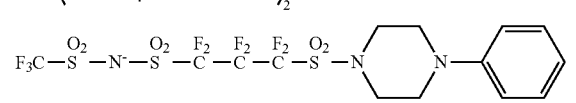
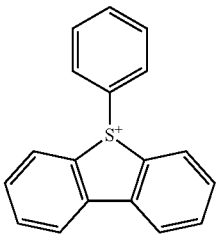
(PA-143)
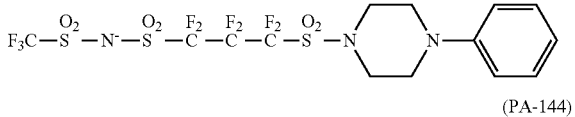
(PA-144)
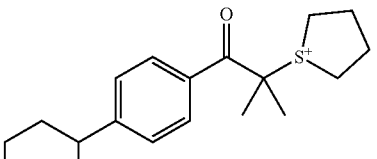
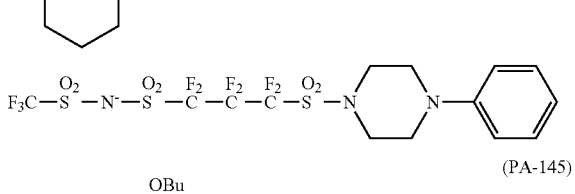
(PA-145)
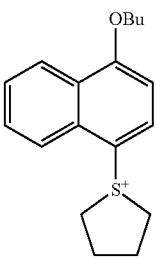
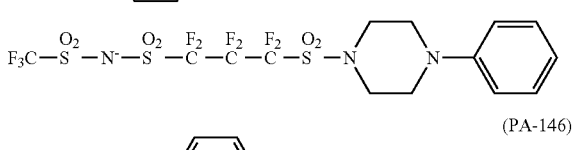
(PA-146)
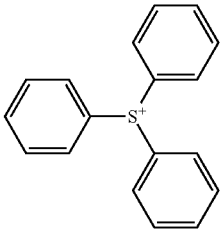
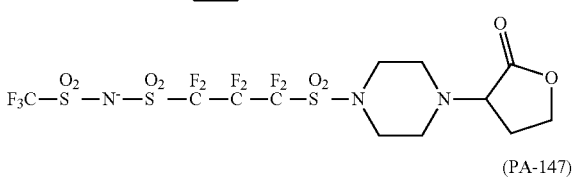
(PA-147)
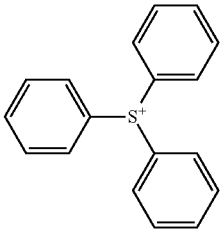

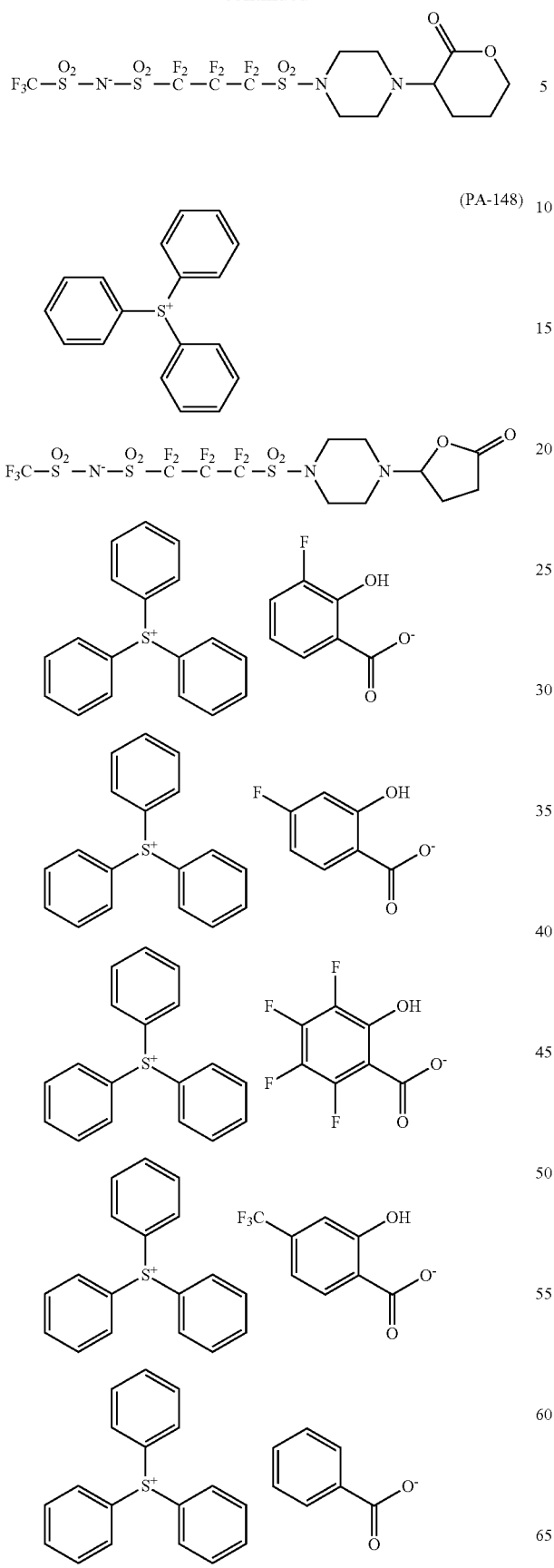

(PA-148)

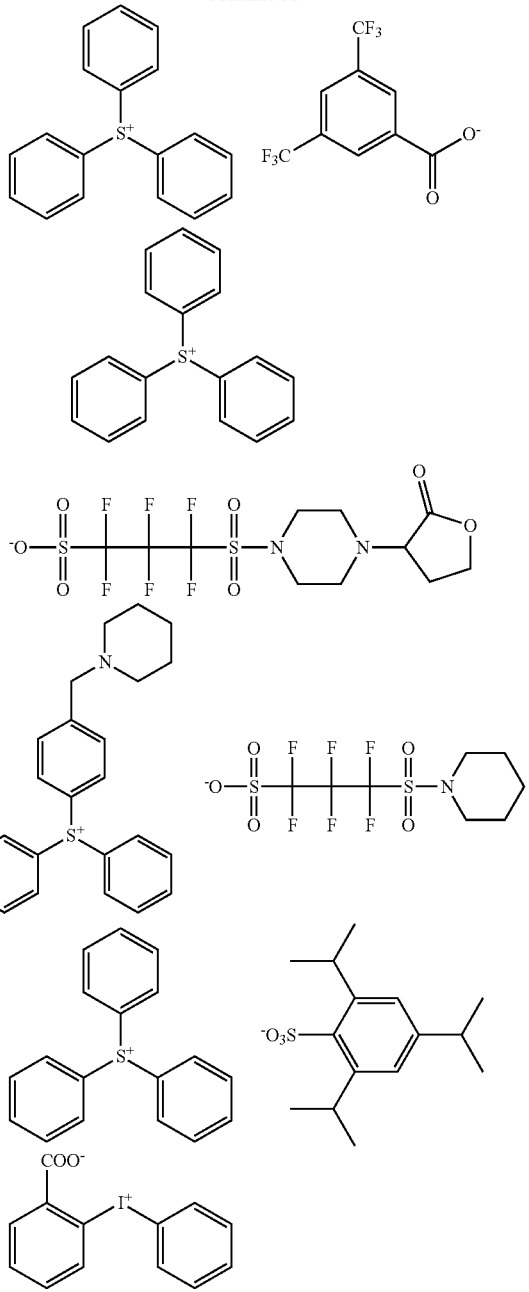

The compound Y can be synthesized according to a method in the related art.

For example, the compound Y can be easily synthesized from the compound represented by General Formula (d1), General Formula (d2), or General Formula (PA-I), or a lithium, sodium, or potassium salt thereof; a hydroxide, a bromide, or a chloride of iodonium or sulfonium; or the like, using a salt exchange method described in JP1999-501909A (JP-H11-501909A) or JP2003-246786A. In addition, the compound Y can also easily synthesized in accordance with the synthesis method described in JP1995-333851A (JP-H07-333851A).

Moreover, the compound that generates the acid represented by General Formula (PA-II) or (PA-III) can be easily synthesized by using a general sulfonic acid esterification reaction or sulfonamidation reaction. For example, the compound can be obtained by a method in which one of sulfonyl halide moieties of a bissulfonyl halide compound is selectively reacted with an amine, an alcohol, or the like including a partial structure represented by General Formula (PA-II) or (PA-III) to form a sulfonamide bond or a sulfonic acid ester bond, and then the other sulfonyl halide moiety is hydrolyzed, or a method in which a cyclic sulfonic anhydride is subjected to ring opening with an amine or alcohol including a partial structure represented by General Formula (PA-II). The amine or alcohol including the partial structure represented by General Formula (PA-II) or (PA-III) can be synthesized by a reacting an amine or alcohol with an anhydride such as (R'O$_2$C)$_2$O and (R'SO$_2$)$_2$O or an acid chloride compound such as R'O$_2$CCl and R'SO$_2$Cl under a basic condition (R' is a methyl group, an n-octyl group, a trifluoromethyl group, or the like). In particular, the amine or alcohol can be synthesized in accordance with Synthesis Examples and the like of JP2006-330098A.

As long as the compound Y is a basic compound or ammonium salt compound whose basicity is reduced upon irradiation with actinic rays or radiation, it may be an amphoteric ion which has an anion moiety and a cation moiety in one molecule and forms an inner salt, or may be a non-amphoteric ion.

As the compound Y which is the amphoteric ion, a basic compound whose basicity is reduced upon irradiation with actinic rays or radiation and represented by General Formula (IS) is preferable.

$$Ar_1-I^+-Ar_2-L_{IS}-COO^-  \quad (IS)$$

In General Formula (IS), $Ar_1$ represents an aryl group (preferably having 6 to 15 carbon atoms, and more preferably having 6 carbon atoms).

$Ar_2$ represents an arylene group (preferably having 6 to 15 carbon atoms, and more preferably having 6 carbon atoms).

$L_{IS}$ represents a single bond or a divalent linking group.

Examples of the divalent linking group include an ester group, an ether group, a carbonyl group, a thioether group, —SO$_2$—, —NR$^N$— (R$^N$ represents a hydrogen atom or an alkyl group), a divalent hydrocarbon group (preferably having 1 to 10 carbon atoms, with examples thereof including an alkylene group, an alkenylene group (for example, —CH=CH—), and an alkynylene group (for example, —C≡C—)), an arylene group (preferably having 6 to 16 carbon atoms), and a group formed by combining these groups.

$L_{IS}$ is preferably the single bond.

In addition, the bonding position of $L_{IS}$ to $Ar_2$ is preferably an ortho position with respect to I$^+$.

An and Are may further have a substituent.

A content of the compound Y with respect to the total solid content of the resist composition is preferably 0.5% by mass or more, more preferably 0.8% by mass or more, and still more preferably 1.3% by mass or more. Further, the content of the compound Y with respect to the total solid content of the resist composition is preferably 20% by mass or less, more preferably 15% by mass or less, and still more preferably 10% by mass or less.

<Photoacid Generator Z>

The resist composition of the embodiment of the present invention includes a photoacid generator Z. The photoacid generator Z is a compound that generates an acid upon exposure, which is different from the compound Y.

The photoacid generator Z may be in a form of a low molecular compound or a form incorporated into a part of a polymer. Further, a combination of the form of a low molecular compound and the form incorporated into a part of a polymer may also be used.

In a case where the photoacid generator Z is in the form of the low molecular compound, the molecular weight is preferably 3,000 or less, more preferably 2,000 or less, and still more preferably 1,000 or less.

In a case where the photoacid generator Z is included in a part of a polymer, it may be included in a part of the resin X or in a resin other than the resin X.

In the present invention, the photoacid generator Z is preferably in the form of the low molecular compound.

The photoacid generator Z is not particularly limited, but is preferably a compound that generates an organic acid.

Examples of the organic acid include sulfonic acid (such as aliphatic sulfonic acid, aromatic sulfonic acid, and camphorsulfonic acid), carboxylic acid (such as aliphatic carboxylic acid, aromatic carboxylic acid, and aralkyl carboxylic acid), and carbonylsulfonylimidic acid, bis(alkylsulfonyl)imidic acid, and tris(alkylsulfonyl)methide acid.

A volume of the acid generated from the photoacid generator Z is not particularly limited, but is preferably 240 Å$^3$ or more from the viewpoint that the acid generated upon exposure is suppressed from being diffused to the unexposed area and the LER performance of a pattern thus obtained is more excellent. Further, from the viewpoint of sensitivity or solubility in a coating solvent, the volume of the acid generated from the photoacid generator Z is preferably 1,500 Å$^3$ or less, more preferably 1,000 Å$^3$ or less, and still more preferably 700 Å$^3$ or less.

In other words, the resist composition of the embodiment of the present invention preferably includes the photoacid generator Z in which the volume of the generated acid is within the range.

In addition, in a case where the photoacid generator Z having a volume of the generated acid of 240 Å$^3$ or more (preferably 240 to 1,500 Å$^3$) and the photoacid generator Z having a volume of the generated acid of less than 240 Å$^3$ are used in combination, the content of the photoacid generator Z having a volume of the generated acid is 240 Å$^3$ or more (preferably 240 to 1,500 Å$^3$) is preferably 60% to 100% by mass, more preferably 75% to 100% by mass, and still more preferably 99% to 100% by mass, with respect to the total content of the photoacid generator Z in the resist composition.

A value of the volume is obtained using "WinMOPAC" manufactured by FUJITSU. In the calculation of a value of the volume, first, the chemical structure of an acid according to each example is input, the most stable steric conformation of each acid is then determined through a molecular field calculation using a molecular mechanics (MM) 3 method with the input chemical structure as an initial structure, and then, molecular orbital calculation is carried out on the most stable steric conformation using a parameterized model number (PM) 3 method, whereby an "accessible volume" of each acid can be calculated.

The structure of the acid generated from the photoacid generator Z is not particularly limited, but it is also preferable that an interaction between the acid generated from the photoacid generator Z and the resin X is strong from the viewpoint that the diffusion of the acid is suppressed and the resolution is improved. From this viewpoint, in a case where the acid generated from the photoacid generator Z is an organic acid, it is also preferable that the acid has, for example, an organic group such as a sulfonic acid group, a carboxylic acid group, a carbonylsulfonylimidic acid group, a bissulfonylimidic acid group, and a trisulfonylmethide acid group, and a polar group in addition the organic group.

Examples of the polar group include an ether group, an ester group, an amide group, an acyl group, a sulfo group, a sulfonyloxy group, a sulfonamide group, a thioether group, a thioester group, a urea group, a carbonate group, a carbamate group, a hydroxyl group, and a mercapto groups.

The number of the polar groups in the generated acid is not particularly limited, and is preferably one or more, and more preferably two or more. It should be noted that from the viewpoint of suppressing excessive development, the number of the polar groups is preferably less than 6, and more preferably less than 4.

A pka of the acid generated from the photoacid generator Z is preferably −15.00 or greater and less than −1.00, more preferably −15.00 to −1.50, still more preferably −13.00 to −2.00, and particularly preferably −10.00 to −2.40.

In a case where two or more photoacid generators Z are used, it is preferable that the pka of the acid generated from one or more (preferably two or more) photoacid generators Z satisfies the preferred range, and it is more preferable that the pka of the acid generated from all of the photoacid generators Z satisfies the above preferred range.

Moreover, the pka of the acid generated from the photoacid generator Z is preferably lower than the pka of the acid generated from the above-mentioned compound Y.

A difference between the pka of the acid generated from the compound Y and the pka of the acid generated by the photoacid generator Z (the pka of the acid generated from the compound Y— the pka of the acid generated from the photoacid generator Z) is preferably more than 0.00, more preferably 3.00 or greater, still more preferably 3.50 or greater, and particularly preferably 4.00 or greater.

The difference between the pka of the acid generating the compound Y and the pka of the acid generating the photoacid generator Z is preferably 15.00 or less, more preferably 10.00 or less, and more preferably 7.00 or less.

In addition, in a case where one or more of the compound Y and the photoacid generator Z are used in a plural number, it is preferable that one or more (preferably two or more) of the combinations of one kind of the compound Y and one kind of the photoacid generators satisfy the above-mentioned pka difference relationship, and it is more preferable that all of the combinations satisfy the above-mentioned pka difference relationship.

As the photoacid generator Z, for example, a photoacid generator Z that generates an acid exemplified below is preferable. Incidentally, in some of the examples, the calculated value of the volume is added (unit: Å$^3$).

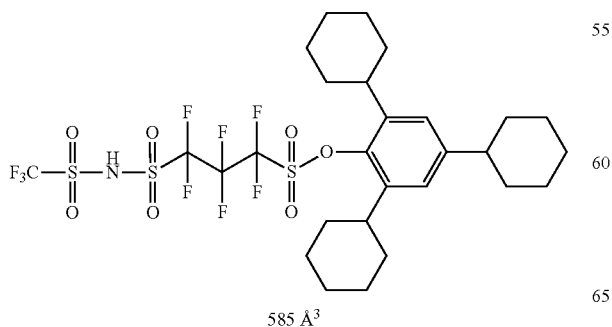

585 Å$^3$

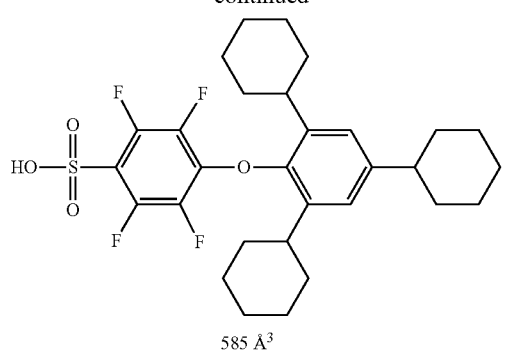

585 Å$^3$

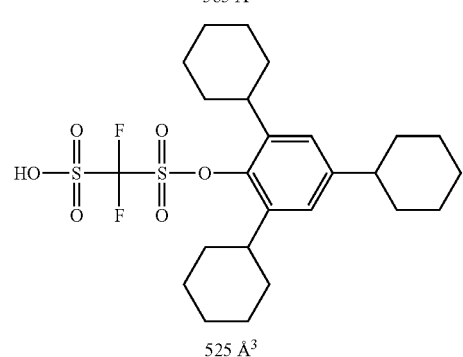

525 Å$^3$

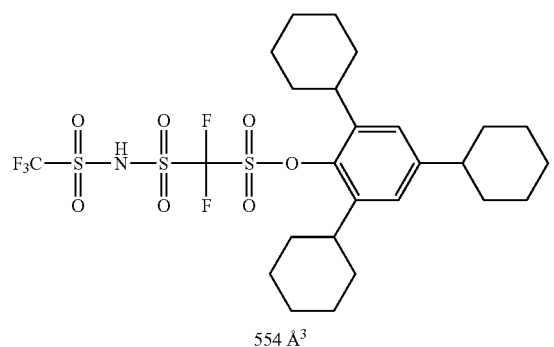

554 Å$^3$

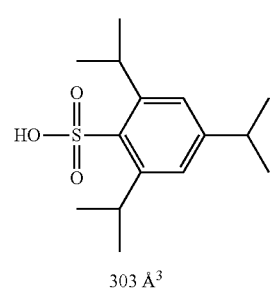

303 Å$^3$

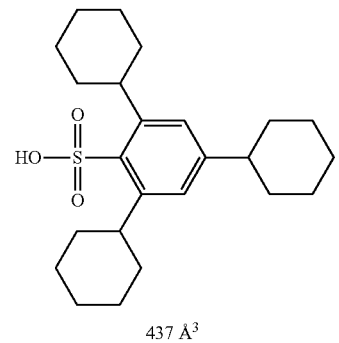

437 Å$^3$

-continued
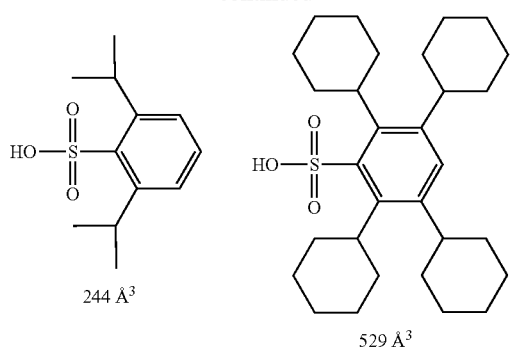
244 Å³   529 Å³
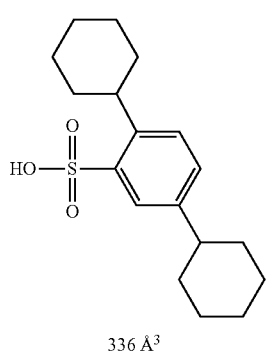
336 Å³
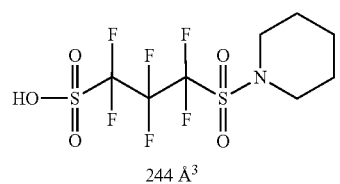
244 Å³
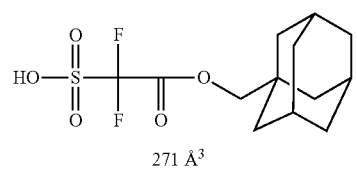
271 Å³
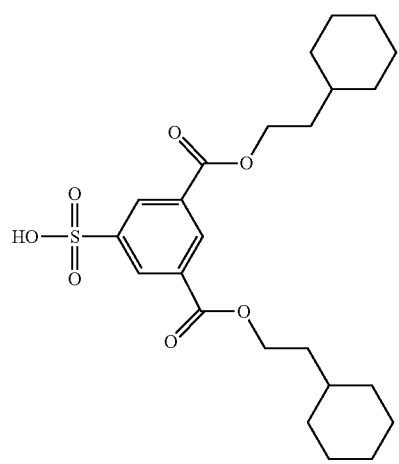
457 Å³
-continued
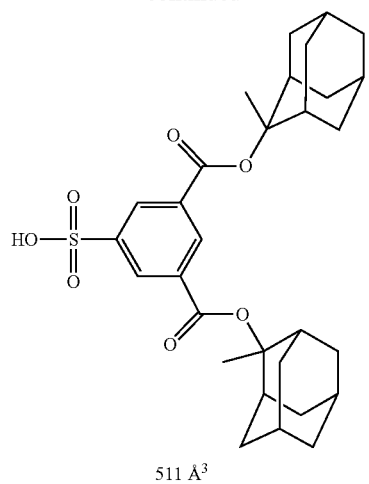
511 Å³
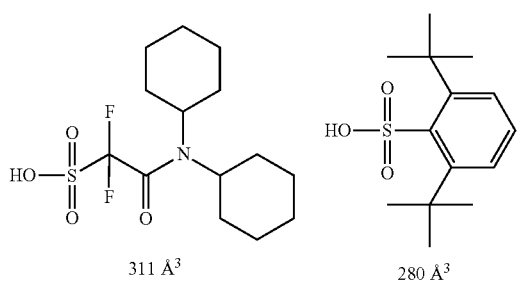
311 Å³   280 Å³
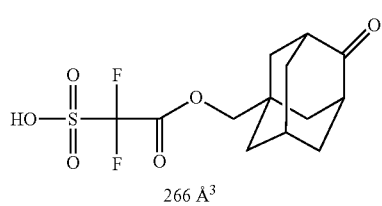
266 Å³
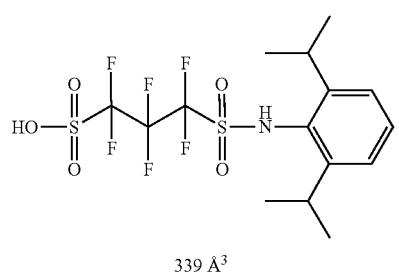
339 Å³
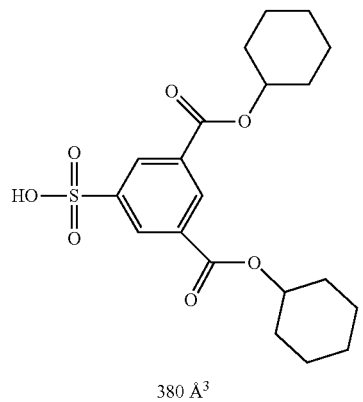
380 Å³

-continued
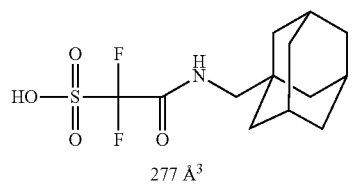
277 Å³
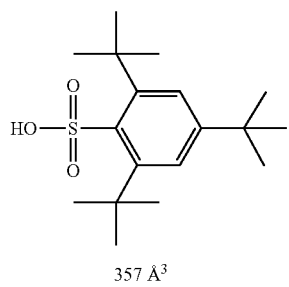
357 Å³
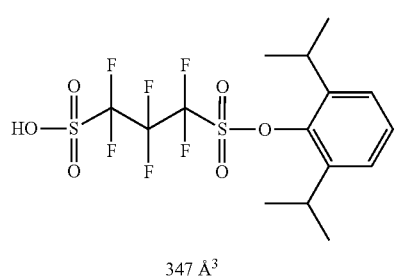
347 Å³
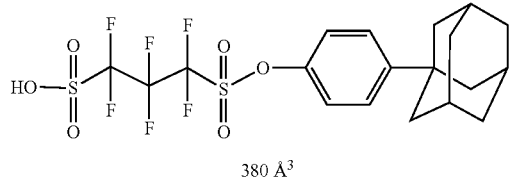
380 Å³
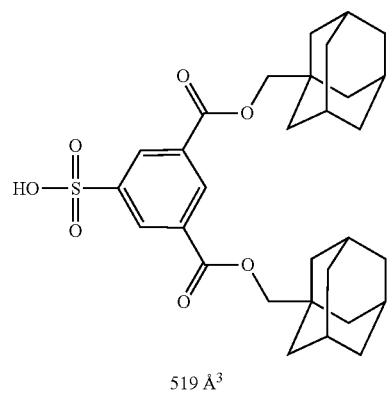
519 Å³
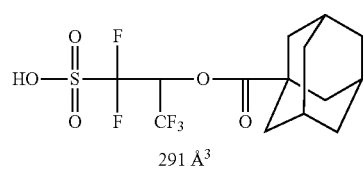
291 Å³
-continued
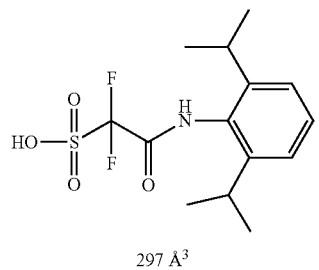
297 Å³
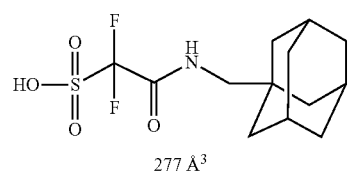
277 Å³
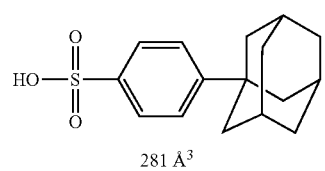
281 Å³
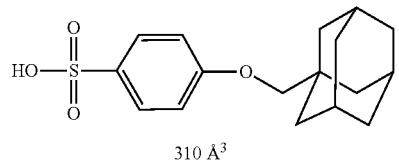
310 Å³
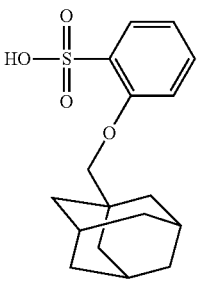
309 Å³
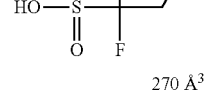
270 Å³
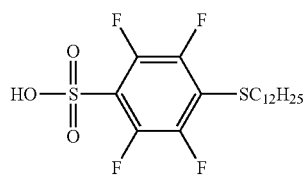
393 Å³
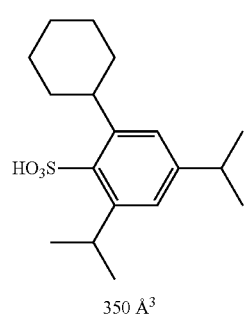
350 Å³

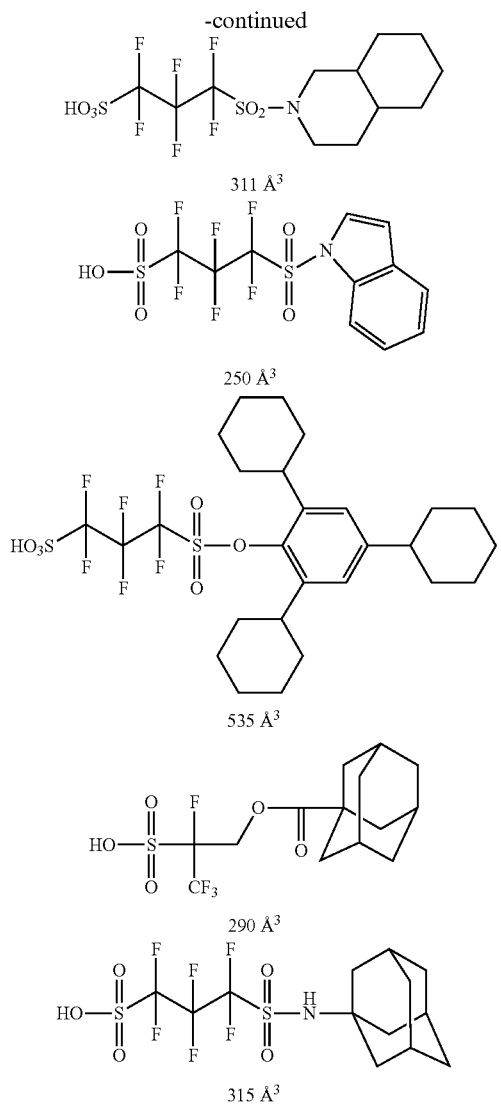

Among those, the photoacid generator Z is preferably a photoacid generator Z formed of an anion and a cation from the viewpoint that the effect of the present invention is more excellent.

For example, the photoacid generator Z is preferably a compound formed of a cation represented by General Formula (ZI) or (ZII) described in the description of the compound Y and an anion represented by $Z^-$.

More specifically, the photoacid generator Z is preferably a compound represented by General Formula (ZIz) or (ZIIz).

In General Formulae (ZIz) and (ZIIz), $R_{201}$ to $R_{205}$ have the same meanings as $R_{201}$ to $R_{205}$ in General Formulae (ZI) and (ZII), respectively.

$Z^-$ represents a non-nucleophilic anion (anion having an extremely low ability to cause a nucleophilic reaction).

Examples of the non-nucleophilic anion include a sulfonate anion (an aliphatic sulfonate anion, an aromatic sulfonate anion, a camphor sulfonate anion, and the like); a carboxylate anion (an aliphatic carboxylate anion, an aromatic carboxylate anion, an aralkyl carboxylate anion, and the like), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be either an alkyl group or a cycloalkyl group, and is preferably a linear or branched alkyl group having 1 to 30 carbon atoms or a cycloalkyl group having 3 to 30 carbon atoms.

As the aromatic ring group in the aromatic sulfonate anion and the aromatic carboxylate anion, an aryl group having 6 to 14 carbon atoms is preferable, and examples thereof include a phenyl group, a tolyl group, and a naphthyl group.

Specific examples of the substituent which may be contained in the alkyl group, the cycloalkyl group, or the aryl group mentioned above include a nitro group, a halogen atom such as a fluorine atom, a carboxyl group, a hydroxyl group, an amino group, a cyano group, and an alkoxy group (preferably having 1 to 15 carbon atoms), an alkyl group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), an alkylsulfonylaryloxy group (preferably having 7 to 20 carbon atoms), and a cycloalkylalkyloxyalkyloxy group (preferably having 8 to 20 carbon atoms).

In addition, the substituent may further have a substituent, if possible, and examples of the substituent that is further contained include a halogen atom such as a fluorine atom. That is, for example, the alkyl group as the substituent may be a fluoroalkyl group or a perfluoroalkyl group.

As the aralkyl group in the aralkyl carboxylate anion, an aralkyl group having 7 to 12 carbon atoms is preferable, and examples thereof include a benzyl group, a phenethyl group, a naphthylmethyl group, a naphthylethyl group, and a naphthylbutyl group.

Examples of the sulfonylimide anion include a saccharin anion.

As the alkyl group in the bis(alkylsulfonyl)imide anion and the tris(alkylsulfonyl)methide anion, an alkyl group having 1 to 5 carbon atoms is preferable. Examples of the substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and the fluorine atom or the alkyl group substituted with a fluorine atom is preferable.

In addition, the alkyl groups in the bis(alkylsulfonyl)imide anion may be bonded to each other to form a ring structure. Thus, the acid strength is increased.

Other examples of the non-nucleophilic anion include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom is preferable. Among those, a perfluoroaliphatic sulfonate anion (more preferably having 4 to 8 carbon atoms) or a fluorine atom-containing benzenesulfonate anion is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

Moreover, as the non-nucleophilic anion, an anion represented by General Formula (AN1) is also preferable.

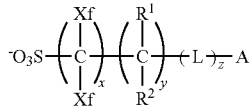

(AN1)

In the formula,

Xf's each independently represent a fluorine atom or an alkyl group substituted with at least one fluorine atom.

$R^1$ and $R^2$ each independently represent a hydrogen atom, a fluorine atom, or an alkyl group, and in a case where $R^1$'s and $R^2$'s are each present in plural number, $R^1$'s and $R^2$'s may be the same as or different from each other.

L represents a divalent linking group, and in a case where L's are present in plural number, L's may be the same as or different from each other.

A represents a cyclic organic group.

x represents an integer of 1 to 20, y represents an integer of 0 to 10, and z represents an integer of 0 to 10.

General Formula (AN 1) will be described in more detail.

In an alkyl group substituted with a fluorine atom in Xf, the alkyl group preferably has 1 to 10 carbon atoms, and more preferably has 1 to 4 carbon atoms. Further, as the alkyl group substituted with a fluorine atom of Xf, a perfluoroalkyl group is preferable.

As Xf, a fluorine atom or a perfluoroalkyl group having 1 to 4 carbon atoms is preferable. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom or $CF_3$ is preferable. In particular, it is preferable that both Xf's are fluorine atoms.

The alkyl group of each of $R^1$ and $R^2$ may contain a substituent (preferably a fluorine atom), and preferably has 1 to 4 carbon atoms. As the substituent, a perfluoroalkyl group having 1 to 4 carbon atoms is more preferable. Specific examples of the alkyl group of each of $R^1$ and $R^2$ having a substituent include $CF_3$, $C_2F_5$, $C_3F_7$, $C_4F9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

As $R^1$ and $R^2$, the fluorine atom or $CF_3$ is preferable.

x is preferably an integer of 1 to 10, and more preferably 1 to 5.

y is preferably an integer of 0 to 4, and more preferably 0.

z is preferably an integer of 0 to 5, more preferably an integer of 0 to 3.

The divalent linking group of L is not particularly limited and examples thereof include —COO—, —OCO—, —CO—, —O—, —S—, —SO—, —SO$_2$—, an alkylene group, a cycloalkylene group, an alkenylene group, and a linking group formed by combination of a plurality of these groups, and a linking group having a total number of carbon atoms of 12 or less is preferable. Among those, —COO—, —OCO—, —CO—, or —O— is preferable, and —COO— or —OCO— is more preferable.

The cyclic organic group of A is not particularly limited as long as it has a cyclic structure, and examples thereof include an alicyclic group, an aromatic ring group, and a heterocyclic group (including not only those having aromaticity but also those having no aromaticity).

The alicyclic group may be monocyclic or polycyclic and is preferably a monocyclic cycloalkyl group such as a cyclopentyl group, a cyclohexyl group, and a cyclotron group, or a polycyclic cycloalkyl group such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable in view that the diffusibility of the photoacid generator in the film in a baking step after exposure can be suppressed and mask error enhancement factor (MEEF) is further improved.

Examples of the aromatic ring group include a benzene ring, a naphthalene ring, a phenanthrene ring, and an anthracene ring.

Examples of the heterocyclic group include those derived from a furan ring, a thiophene ring, a benzofuran ring, a benzothiophene ring, a dibenzofuran ring, a dibenzothiophene ring, and a pyridine ring. Among those, a heterocyclic group derived from a furan ring, a thiophene ring, or a pyridine ring is preferable.

Moreover, examples of the cyclic organic group include a lactone structure, and specific examples thereof include the above-mentioned lactone structures represented by General Formula (LC1-1) to (LC1-22).

The cyclic organic group may have a substituent. The substituent may be an alkyl group (which may be linear, branched, or cyclic and preferably has 1 to 12 carbon atoms), a cycloalkyl group (which may be a monocycle or a polycycle may also be a spiro ring in a case where it is the polycycle, and preferably has 3 to 20 carbon atoms), an aryl group (preferably 6 to 14 carbon atoms), a hydroxyl group, an alkoxy group, an ester group, an amide group, a urethane group, a ureido group, a thioether group, a sulfonamide group, and a sulfonic acid ester group. Incidentally, the carbon constituting the cyclic organic group (the carbon contributing to ring formation) may be a carbonyl carbon.

Furthermore, the non-nucleophilic anion may be, for example, a trisulfone carbanion or a disulfonamide anion.

The trisulfone carbanion is, for example, an anion represented by $C^-(SO_2-R^p)_3$. Here, $R^p$ represents an alkyl group which may have a substituent, and is preferably a fluoroalkyl group, more preferably a perfluoroalkyl group, and still more preferably a trifluoromethyl group.

The disulfonamide anion is, for example, an anion represented by $N^-(SO_2-R^q)_2$. Here, $R^q$ represents an alkyl group which may have a substituent and is preferably a fluoroalkyl group, more preferably a perfluoroalkyl group. Two $R^q$'s may be bonded to each other to form a ring. The group formed by bonding two $R^q$'s to is preferably an alkylene group which may have a substituent, more preferably a fluoroalkylene group, and even more preferably a perfluoroalkylene group. The alkylene group preferably has 2 to 4 carbon atoms.

The photoacid generator Z may be an amphoteric ionic photoacid generator in which an inner salt is formed with both an anion moiety and a cation moiety in one molecule, or may be a non-amphoteric ionic photoacid generator.

With regard to the photoacid generator Z, reference can be made to paragraphs [0368] to [0377] of JP2014-041328A and paragraphs [0240] to [0262] of JP2013-228681A (corresponding to paragraph [0339] of US2015/0004533A), the contents of which are incorporated herein by reference.

The photoacid generator Z is exemplified below.

(z1)
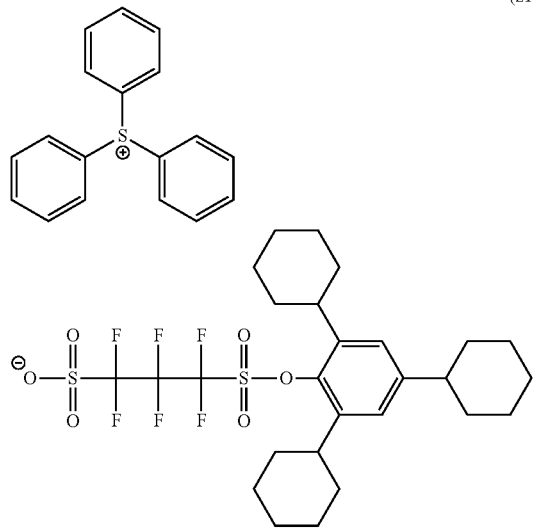

(z2)
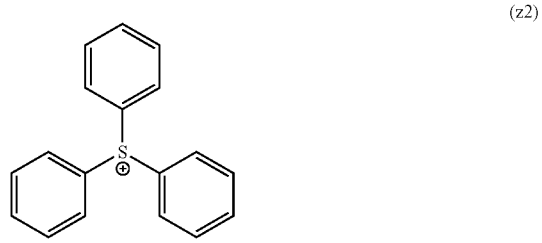

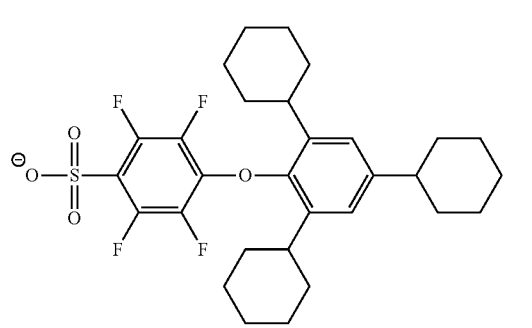

(z3)
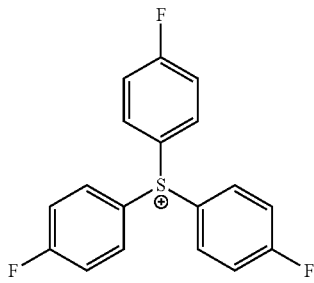

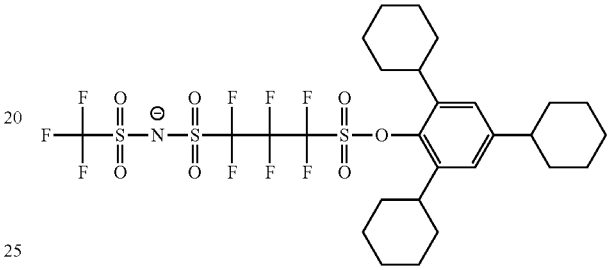

(z4)
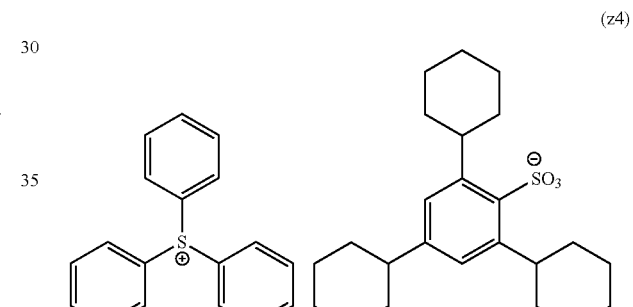

(z5)
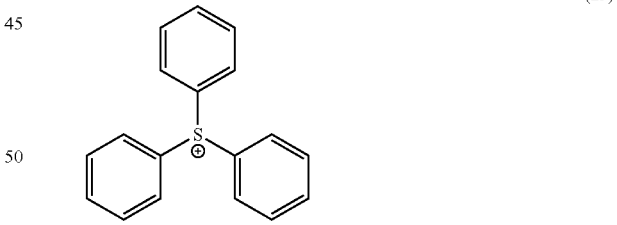

(z6)
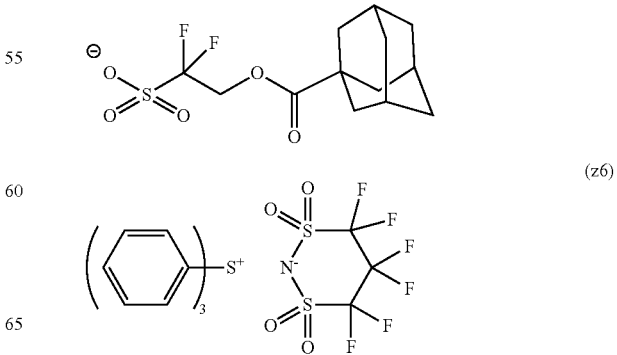

(z7) 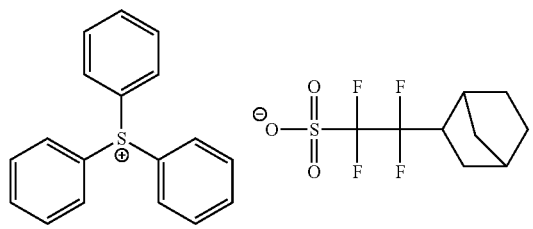
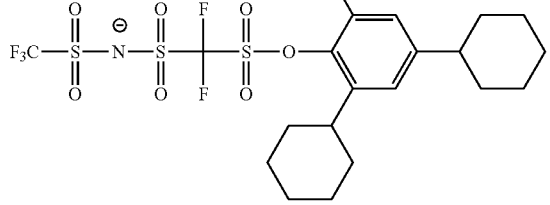
(z8) 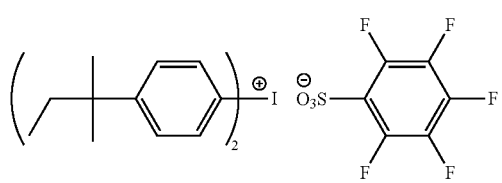
(z12) 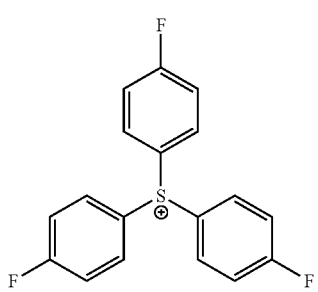
(z9) 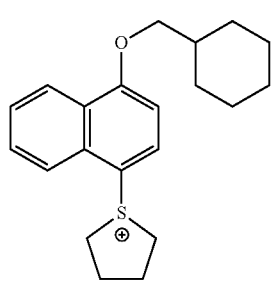
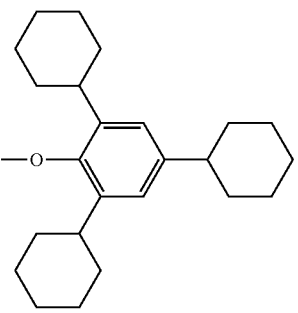
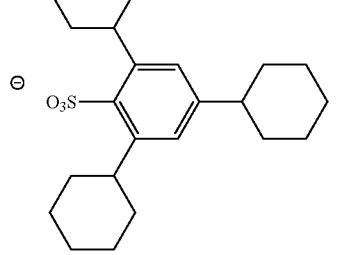
(z13) 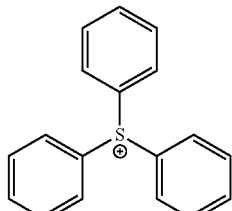
(z10) 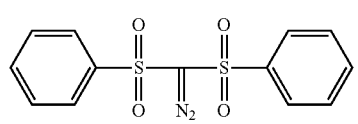
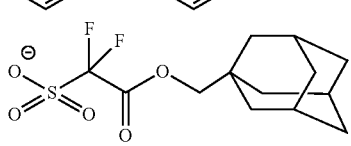
(z11) 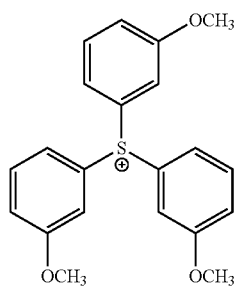
(z14) 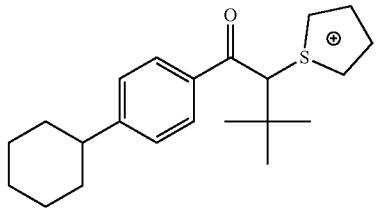

-continued
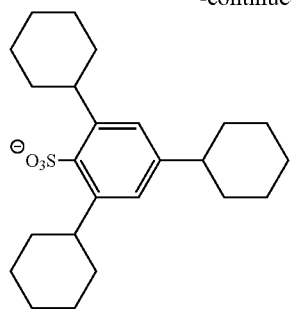
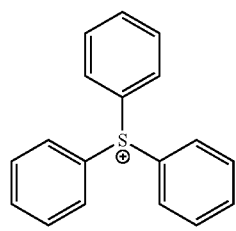
(z15)
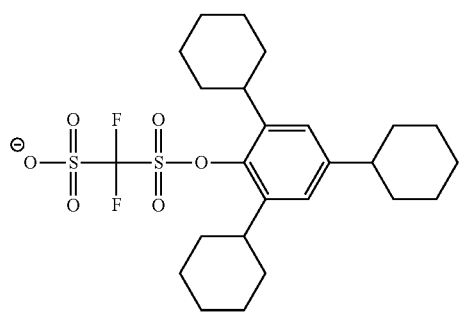
(z16)
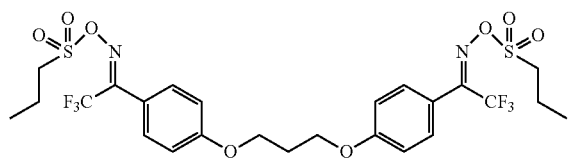
(z17)
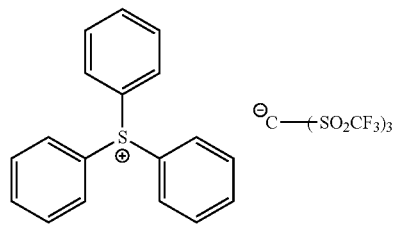
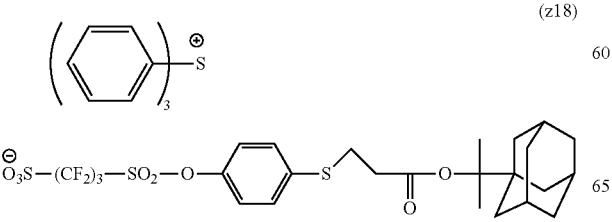
-continued
(z28)
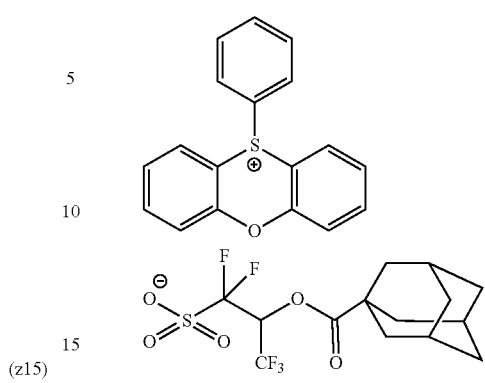
(z20)
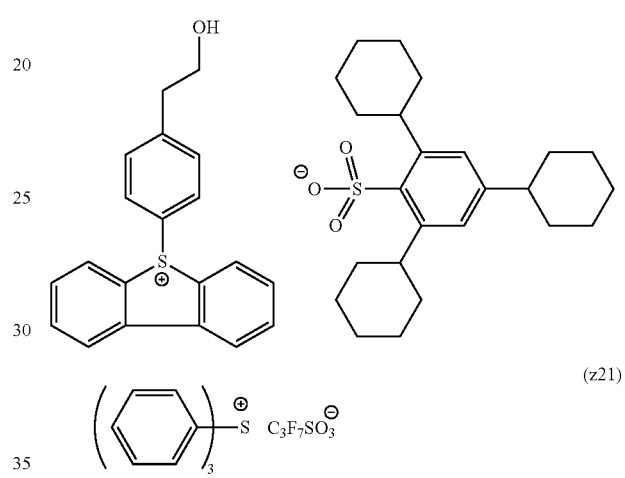
(z21)
(z22)
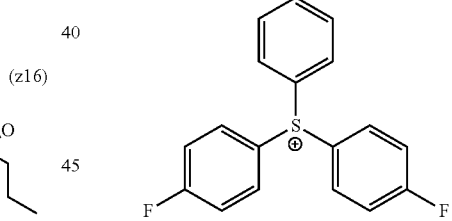
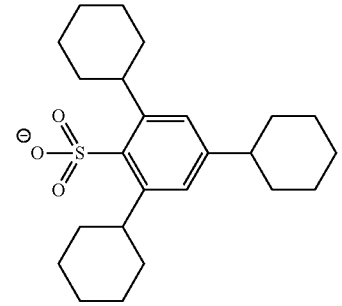
(z18)
(z23)
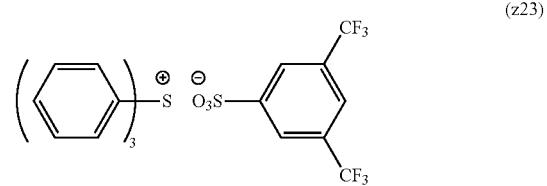

-continued
(z24)
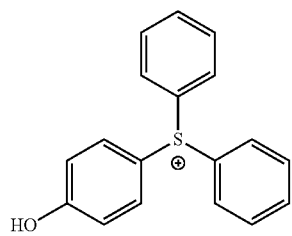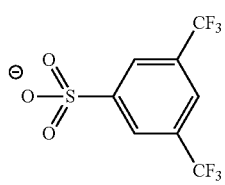
(z25)
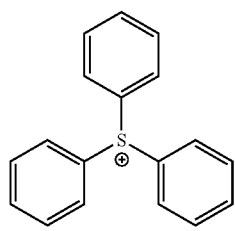
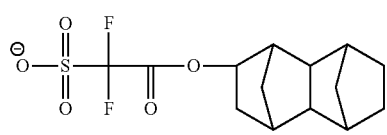
(z26)
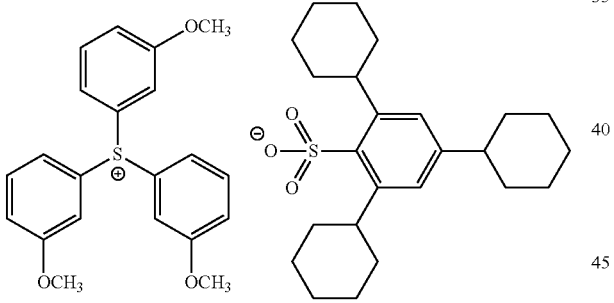
(z27)
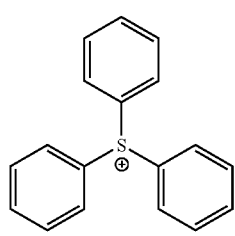
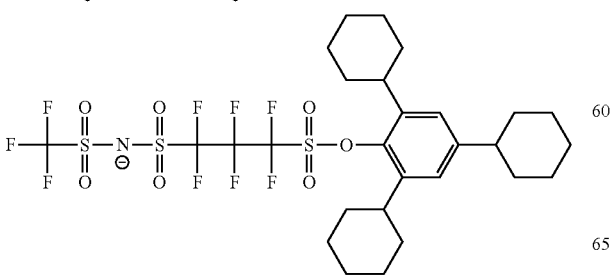
-continued
(z28)
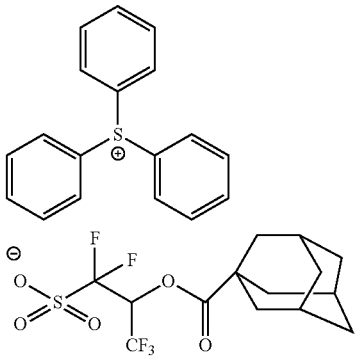
(z29)
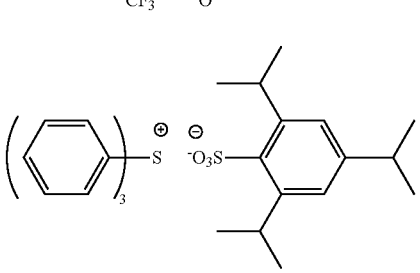
(z30)
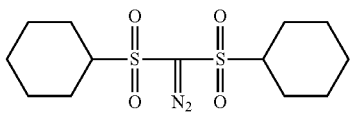
(z31)
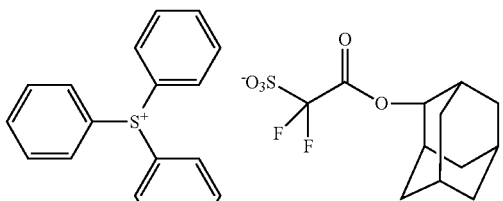
(z32)
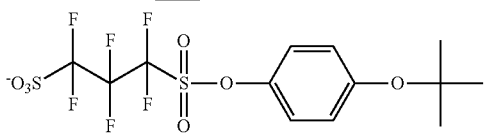
(z33)
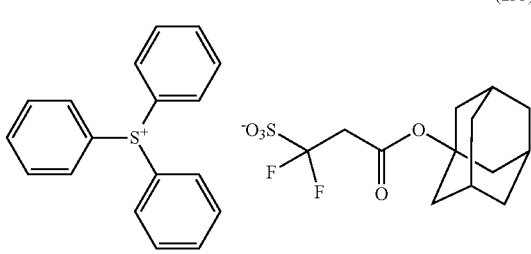

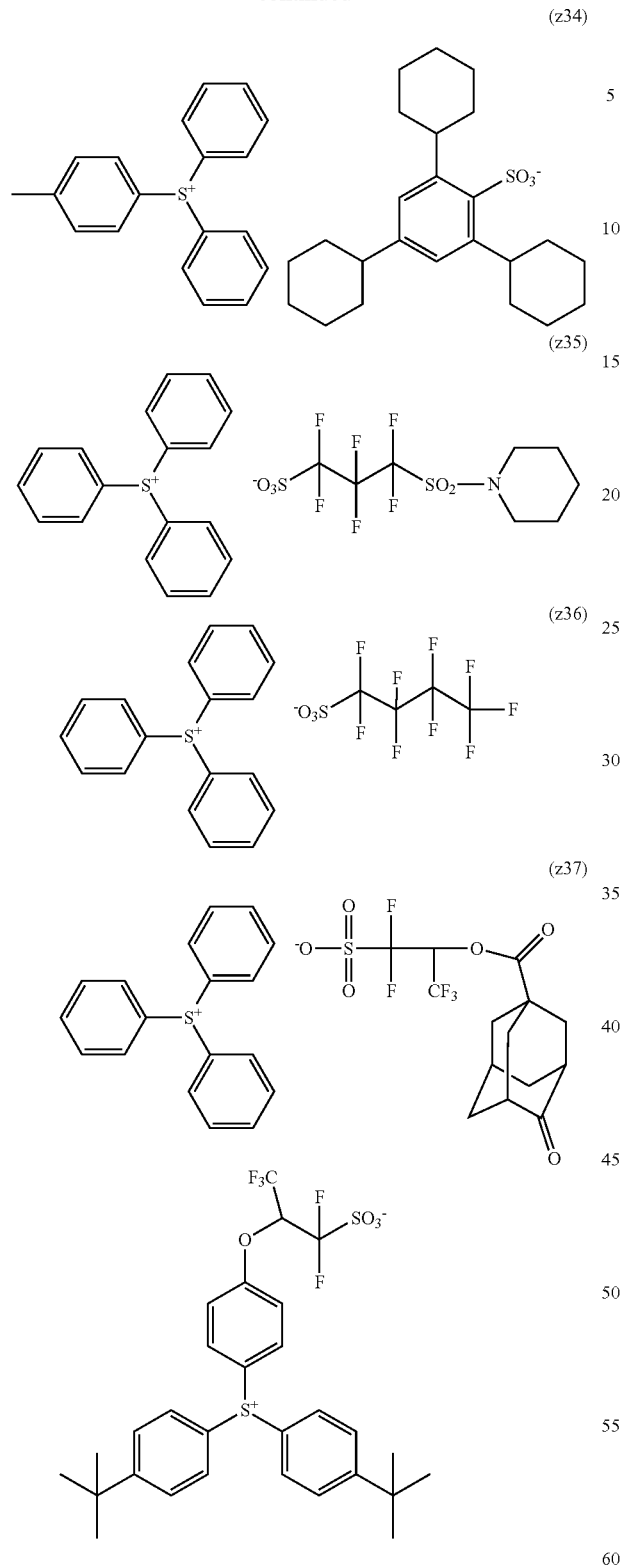
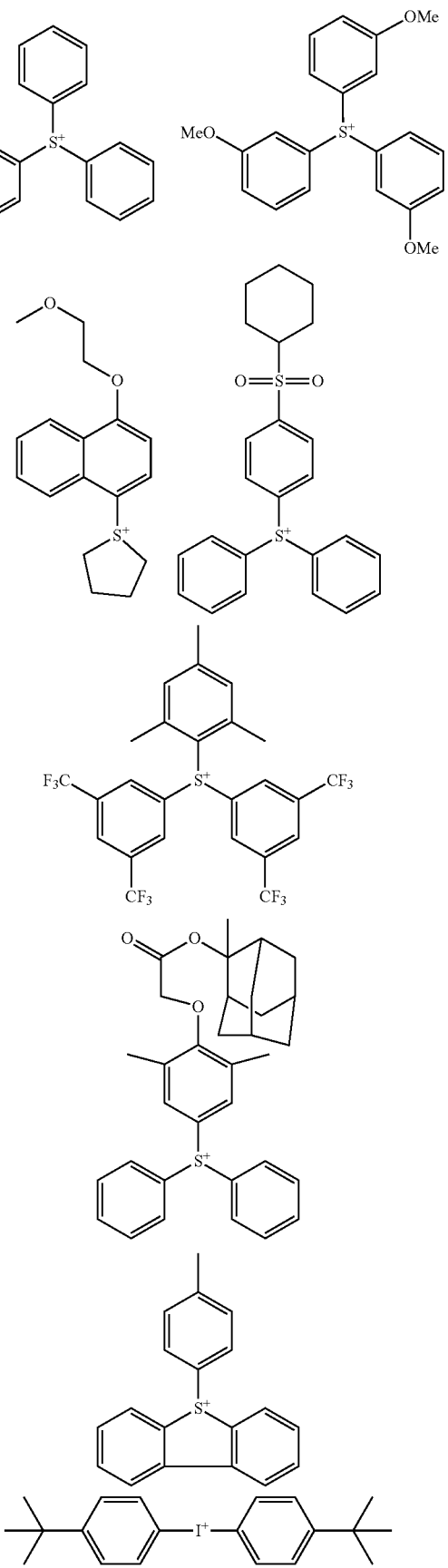
Furthermore, a photoacid generator Z in which the following anions and cations are appropriately combined is also preferable.
It should be noted that a combination in which a compound formed by combining the following anions and cations becomes a basic compound is excluded.

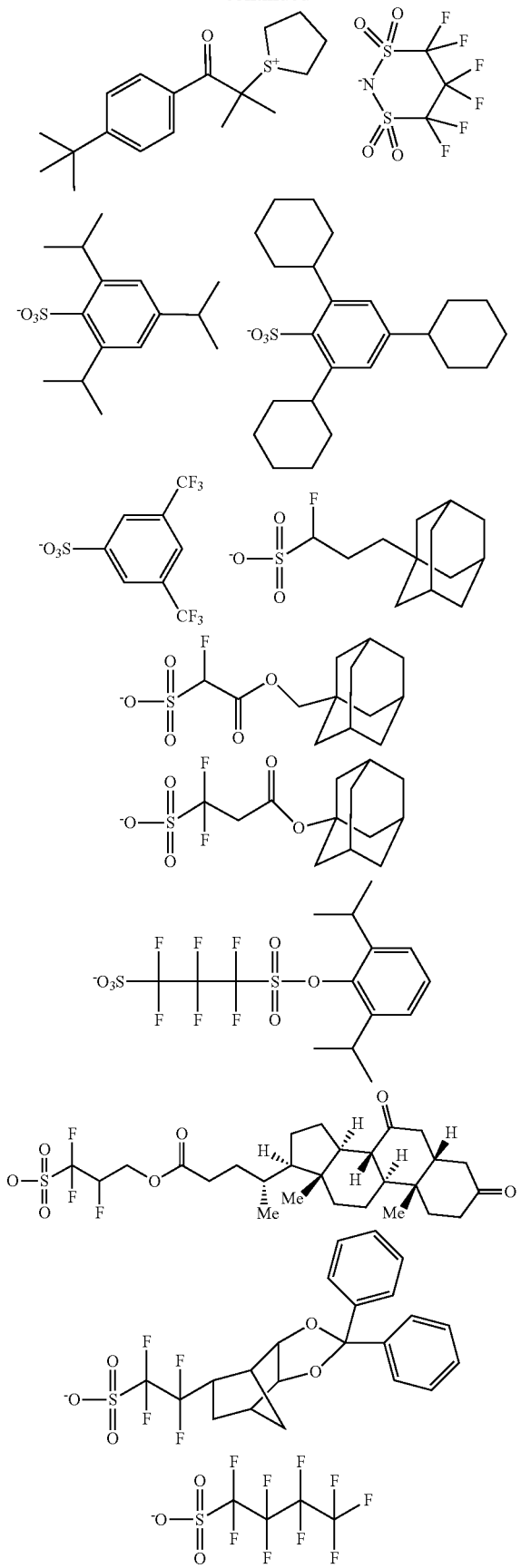

The content of the photoacid generator Z in the resist composition is not particularly limited, but is preferably 5% to 50% by mass, more preferably 10% to 40% by mass, still more preferably 10% to 35% by mass, and particularly preferably more than 10% by mass and less than 35% by mass, with respect to the total solid content of the composition.

The photoacid generator Z may be used alone or in combination of two or more kinds thereof, and it is preferable to use two kinds of the photoacid generators Z. In a case where two or more kinds of the photoacid generators Z are used, a total amount thereof is preferably within the range. In a case where two or more kinds of the photoacid generators Z are used, it is preferable that a volume of generated acid is 240 Å$^3$ or more (preferably 240 to 1,500 Å$^3$) for any of the photoacid generators used.

<Hydrophobic Resin>

The resist composition may include a hydrophobic resin different from the resin X, in addition to the resin X.

Although it is preferable that the hydrophobic resin is designed to be unevenly distributed on a surface of the resist film, it does not necessarily need to have a hydrophilic group in its molecule as different from the surfactant, and does not need to contribute to uniform mixing of polar materials and nonpolar materials.

Examples of the effect of addition of the hydrophobic resin include control of static and dynamic contact angles of a surface of the resist film with respect to water and suppression of out gas.

The hydrophobic resin preferably has any one or more of a "fluorine atom", a "silicon atom", and a "CH$_3$ partial structure which is contained in a side chain moiety of a resin" from the viewpoint of uneven distribution on the film surface layer, and more preferably has two or more kinds. Incidentally, the hydrophobic resin preferably has a hydrocarbon group having 5 or more carbon atoms. These groups may be contained in the main chain of the resin or may be substituted in the side chain.

In a case where hydrophobic resin includes a fluorine atom and/or a silicon atom, the fluorine atom and/or the silicon atom in the hydrophobic resin may be included in the main chain or the side chain of the resin.

In a case where the hydrophobic resin includes a fluorine atom, as a partial structure having a fluorine atom, an alkyl group having a fluorine atom, a cycloalkyl group having a fluorine atom, or an aryl group having a fluorine atom is preferable.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group such as a phenyl group and a naphthyl group, in which at least one hydrogen atom is substituted with a fluorine atom, and may further have a substituent other than a fluorine atom.

Examples of the repeating unit having a fluorine atom or a silicon atom include those exemplified in paragraph [0519] of US2012/0251948A1.

Moreover, it is also preferable that the hydrophobic resin includes a $CH_3$ partial structure in the side chain moiety, as described above.

Here, the $CH_3$ partial structure contained in a side chain moiety in the hydrophobic resin includes a $CH_3$ partial structure contained in an ethyl group, a propyl group, or the like.

On the other hand, a methyl group bonded directly to the main chain of the hydrophobic resin (for example, an a-methyl group in the repeating unit having a methacrylic acid structure) makes only a small contribution to uneven distribution on the surface of the hydrophobic resin due to the effect of the main chain, and it is therefore not included in the $CH_3$ partial structure in the present invention.

With regard to the hydrophobic resin, reference can be made to the description in paragraphs [0348] to [0415] of JP2014-010245A, the contents of which are incorporated herein by reference.

Furthermore, the resins described in JP2011-248019A, JP2010-175859A, and JP2012-032544A can also be preferably used, in addition to the resins described above, as the hydrophobic resin.

In a case where the resist composition includes a hydrophobic resin, a content of the hydrophobic resin is preferably 0.01% to 20% by mass, and more preferably 0.1% to 15% by mass, with respect to the total solid content of the composition.

<Surfactant>

The resist composition may include a surfactant. By incorporation of the surfactant, it is possible to form a pattern having more excellent adhesiveness and less development defects.

As the surfactant, fluorine-based and/or silicon-based surfactants are preferable.

Examples of the fluorine-based and/or silicon-based surfactants include the surfactants described in paragraph [0276] in US2008/0248425A. In addition, EFTOP, EF301, or EF303 (manufactured by Shin-Akita Chemical Co., Ltd.); FLUORAD FC430, 431, or 4430 (manufactured by Sumitomo 3M Inc.); MEGAFACE F171, F173, F176, F189, F113, F110, F177, F120, or R08 (manufactured by DIC Corp.); SURFLON S-382, SC101, 102, 103, 104, 105, or 106 (manufactured by Asahi Glass Co., Ltd.), TROYSOL S-366 (manufactured by Troy Chemical Corp.); GF-300 or GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); KH-20 (manufactured by Asahi Kasei Co., Ltd.); or FTX-204G, 208G, 218G, 230G, 204D, 208D, 212D, 218D, or 222D (manufactured by NEOS Co., Ltd.) may be used. In addition, a polysiloxane polymer KP-341 (manufactured by Shin-Etsu Chemical Co., Ltd.) can also be used as the silicon-based surfactant.

Moreover, in addition to the known surfactants as shown above, a surfactant may be synthesized using a fluoro-aliphatic compound manufactured using a telomerization method (also referred to as a telomer method) or an oligomerization method (also referred to as an oligomer method). Specifically, a polymer including a fluoro-aliphatic group derived from fluoro-aliphatic compound may be used as the surfactant. This fluoro-aliphatic compound can be synthesized, for example, by the method described in JP2002-090991A.

In addition, a surfactant other than the fluorine-based surfactant and/or the silicon-based surfactants described in paragraph [0280] of US2008/0248425A may be used.

These surfactants may be used alone or in combination of two or more kinds thereof.

In a case where the resist composition includes a surfactant, a content of the surfactant is preferably 0.0001% to 2% by mass, and more preferably 0.0005 to 1% by mass, with respect to the total solid content of the composition.

<Solvent>

The resist composition may include a solvent.

The solvent preferably includes (M1) propylene glycol monoalkyl ether carboxylate and (M2) at least one selected from the group consisting of propylene glycol monoalkyl ether, lactic acid ester, acetic acid ester, alkoxypropionic acid ester, chained ketone, cyclic ketone, lactone, and alkylene carbonate. Incidentally, this solvent may further include components other than the components (M1) and (M2).

The present inventors have found that in a case where such a solvent and the above-mentioned resin are used in combination, the coating properties of the composition are improved while a pattern having a small number of development defects can be formed. Although a reason therefor is not necessarily clear, the present inventors have considered the that since such the solvent has a good balance among the solubility, the boiling point, and the viscosity of the above-mentioned resin, unevenness in the film thickness of a composition film, generation of precipitates during spin coating, and the like can be suppressed.

As the component (M1), at least one selected from the group consisting of propylene glycol monomethyl ether acetate (PGMEA), propylene glycol monomethyl ether propionate, and propylene glycol monoethyl ether acetate is preferable, and the propylene glycol monomethyl ether acetate (PGMEA) is more preferable.

As the component (M2), the following ones are preferable.

As the propylene glycol monoalkyl ether, propylene glycol monomethyl ether (PGME), and propylene glycol monoethyl ether are preferable.

As the lactic acid ester, ethyl lactate, butyl lactate, or propyl lactate is preferable. As the acetic acid ester, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

In addition, butyl butyrate is also preferable.

As the alkoxypropionic acid ester, methyl 3-methoxypropionate (MMP) or ethyl 3-ethoxypropionate (EEP) is preferable.

As the chained ketone, 1-octanone, 2-octanone, 1-nonanone, 2-nonanone, acetone, 2-heptanone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methyl cyclohexanone, isophorone, or cyclohexanone is preferable.

As the lactone, γ-butyrolactone is preferable.

As the alkylene carbonate, propylene carbonate is preferable.

As the component (M2), propylene glycol monomethyl ether (PGME), ethyl lactate, ethyl 3-ethoxypropionate, methyl amyl ketone, cyclohexanone, butyl acetate, pentyl acetate, g-butyrolactone, or propylene carbonate is more preferable.

In addition to the components, an ester-based solvent having 7 or more carbon atoms (preferably 7 to 14 carbon atoms, more preferably 7 to 12 carbon atoms, and still more preferably 7 to 10 carbon atoms), and having 2 or less heteroatoms is preferably used.

Preferred examples of the ester-based solvents having 7 or more carbon atoms and 2 or less heteroatoms include amyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is preferable.

As the component (M2), those having a flash point (hereinafter also referred to as fp) of 37° C. or higher are preferable. As such a component (M2), propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), γ-butyrolactone (fp: 101° C.), or propylene carbonate (fp: 132° C.) is preferable. Among these, propylene glycol monoethyl ether, ethyl lactate, pentyl acetate, or cyclohexanone is more preferable, and propylene glycol monoethyl ether or ethyl lactate is still more preferable.

In addition, the "flash point" as mentioned herein means the value described in a reagent catalog of Tokyo Chemical Industry Co., Ltd. or Sigma-Aldrich Co. LLC.

The solvent preferably includes the component (M1). The solvent is more preferably formed of substantially only the component (M1) or is a mixed solvent of the component (M1) and other components. In the latter case, the solvent still more preferably includes both the component (M1) and the component (M2).

The mass ratio (M1/M2) between the component (M1) and the component (M2) is preferably in the range of "100/0" to "15/85", more preferably in the range of "100/0" to "40/60", and still more preferably in the range of "100/0" to "60/40". That is, it is preferable that the solvent is formed of only the component (M1) or includes both the component (M1) and the component (M2), and a mass ratio thereof are as follows. That is, in the latter case, the mass ratio of the component (M1) to the component (M2) is preferably 15/85 or greater, more preferably 40/60 or greater, and still more preferably 60/40 or greater. By employing such a configuration, it is possible to further reduce the number of development defects.

Moreover, in a case where the solvent includes both the component (M1) and the component (M2), the mass ratio of the component (M1) to the component (M2) is, for example, 99/1 or less.

As described above, the solvent may further include components other than the components (M1) and (M2). In this case, a content of the components other than the components (M1) and (M2) is preferably within a range of 5% to 30% by mass with respect to the total mass of the solvent.

The content of the solvent in the resist composition is preferably determined so that the solid content concentration is 0.5% to 30% by mass, and more preferably 1% to 20% by mass. In this case, the coating properties of the resist composition can be further improved.

<Other Additives>

The resist composition may further include a dissolution inhibiting compound, a dye, a plasticizer, a photosensitizer, a light absorber, and/or a compound that promotes solubility in a developer (for example, a phenol compound having a molecular weight of 1,000 or less, or an alicyclic or aliphatic compound including a carboxyl group).

The resist composition may further include a dissolution inhibiting compound. Here, the "dissolution inhibiting compound" is a compound having a molecular weight of 3,000 or less, whose solubility in an organic developer decreases through decomposition by the action of an acid.

[Resist Film and Pattern Forming Method]

Hereinafter, the resist film of the embodiment of the present invention and the pattern forming method of the embodiment of the present invention will be described.

The procedure of the pattern forming method using the resist composition is not particularly limited, but preferably includes the following steps:

Step 1: Step of forming a resist film using a resist composition (resist film forming step)

Step 2: Step of exposing the resist film (exposing step)

Step 3: Step of developing the exposed resist film using a developer (developing step)

Hereinafter, the procedure of each of the steps will be described in detail.

Although aspects using an alkali developer will be described below, an embodiment in which a pattern is formed using an organic solvent as a developer may be used.

<Step 1: Resist Film Forming Step>

Step 1 is a step of forming a resist film on a substrate with the resist composition.

The definition of the resist composition is as described above.

Through the description of this step, the resist film of the embodiment of the present invention will also be described.

Examples of a method in which a resist film is formed with the resist composition include a method in which the resist composition of the embodiment of the present invention is applied onto a substrate.

In addition, it is preferable that the resist composition before the application is filtered through a filter, as desired. A pore size of the filter is preferably 0.1 μm or less, more preferably 0.05 μm or less, and still more preferably 0.03 μm or less. Further, the filter is preferably a polytetrafluoroethylene-made, polyethylene-made, or nylon-made filter.

The resist composition is applied onto a substrate (for example, a silicon- or silicon dioxide-coated substrate) as used for the manufacture of an integrated circuit element, by an appropriate application method such as a method using a spinner, a coater, or the like. The spin application using a spinner is preferable as the application method. A rotation speed upon the spin application using a spinner is preferably 1,000 to 3,000 rpm.

After the application of the resist composition, the substrate may be dried to form a resist film. In addition, various base films (an inorganic film, an organic film, an antireflection film, and the like) may be formed on the underlayer of the resist film, as desired.

Examples of the drying method include a method of performing drying by heating. The heating can usually be performed using a means comprised in a typical exposure and/or developing machine, and may be performed using a hot plate or the like. The heating temperature is preferably 80° C. to 150° C., more preferably 80° C. to 140° C., and still more preferably 80° C. to 130° C. The heating time is preferably 30 to 1,000 seconds, more preferably 60 to 800 seconds, and still more preferably 60 to 600 seconds.

A film thickness of the resist film is not particularly limited, but from the viewpoint that a more accurate fine pattern can be formed, the film thickness is preferably 10 to 100 nm, more preferably 10 to 65 nm, and still more preferably 15 to 50 nm.

Moreover, a topcoat may be formed on the upper layer of the resist film using a topcoat composition.

It is preferable that the topcoat composition is not mixed with the resist film and can be uniformly applied onto the upper layer of the resist film.

In addition, it is preferable that the resist film is dried before forming the topcoat. Subsequently, a topcoat composition can be applied onto the obtained resist film by the same means as for the method for forming the resist film, and further dried to form a topcoat.

A film thickness of the topcoat is preferably 10 to 200 nm, more preferably 20 to 100 nm, and still more preferably 40 to 80 nm.

The topcoat is not particularly limited, a topcoat known in the related art can be formed by the methods known in the related art, and a topcoat can be formed in accordance with, for example, the description in paragraphs [0072] to [0082] of JP2014-059543A.

It is preferable that a topcoat including a basic compound as described in JP2013-061648A, for example, is formed on a resist film. Specific examples of the basic compound which can be included in the topcoat include the basic compounds which may be included in the resist composition of the embodiment of the present invention.

In addition, the topcoat preferably includes a compound including at least one of a group or bond selected from the group consisting of an ether bond, a thioether bond, a hydroxyl group, a thiol group, a carbonyl bond, and an ester bond.

<Step 2: Exposing Step>

Step 2 is a step of exposing the resist film.

Examples of the exposing method include a method in which the resist film thus formed is irradiated with actinic rays or radiation through a predetermined mask.

In the pattern forming method of the embodiment of the present invention, the exposure is preferably performed using an electron beam (EB) or extreme ultraviolet (EUV).

After exposure, it is preferable to perform baking (heating) before performing development. The reaction of the exposed area is accelerated by baking, and the sensitivity and the pattern shape are further improved.

The heating temperature is preferably 80° C. to 150° C., more preferably 80° C. to 140° C., and still more preferably 80° C. to 130° C.

The heating time is preferably 10 to 1,000 seconds, more preferably 10 to 180 seconds, and still more preferably 30 to 120 seconds.

Heating may be performed using a means comprised in an exposure device and/or a development device, or may also be performed using a hot plate or the like.

This step is also called post-exposure bake.

<Step 3: Developing Step>

Step 3 is a step of developing the exposed resist film using an alkali developer to form a pattern.

Examples of the developing method include a method in which a substrate is dipped in a tank filled with a developer for a certain period of time (a dip method), a method in which a developer is heaped up to the surface of a substrate by surface tension and developed by maintaining for a certain period of time (a puddle method), a method in which a developer is sprayed on the surface of a substrate (a spray method), and a method in which a developer is continuously discharged on a substrate rotated at a constant rate while scanning a developer discharging nozzle at a constant rate (a dynamic dispense method).

In addition, a step of stopping development while replacing the solvent with another solvent may be performed after the step of performing development.

The developing time is not particularly limited as long as it is a period of time where the resin in the unexposed area is sufficiently dissolved, and the developing time is preferably 10 to 300 seconds, and more preferably 20 to 120 seconds.

The temperature of the developer is preferably 0° C. to 50° C., and more preferably 15° C. to 35° C.

As the alkali developer, an aqueous alkali solution including an alkali is preferably used. The type of the aqueous alkali solution is not particularly limited, but examples of the aqueous alkali solution include aqueous alkali solutions of quaternary ammonium salts typified by tetramethylammonium hydroxide, an inorganic alkali, primary amines, secondary amines, tertiary amines, alcohol amines, cyclic amines, or the like. Among those, the aqueous solutions of the quaternary ammonium salts typified by tetramethylammonium hydroxide (TMAH) are preferable as the alkali developer. To the alkali developer may be added an appropriate amount of alcohols and/or a surfactant, or the like. The alkali concentration of the alkali developer is usually 0.1% to 20% by mass. In addition, the pH of the alkali developer is usually 10.0 to 15.0.

<Other Steps>

The pattern forming method preferably includes a step of performing washing using a rinsing liquid after Step 3.

Examples of the rinsing liquid used in the rinsing step after the step of performing development with an alkali developer include pure water. In addition, an appropriate amount of a surfactant may be added to pure water.

An appropriate amount of the surfactant may be added to the rinsing liquid.

A method for the rinsing step is not particularly limited, but examples thereof include a method in which a rinsing liquid is continuously discharged on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method).

Furthermore, the pattern forming method of the embodiment of the present invention may include a baking step (post-baking) after the rinsing step. By the present step, the developer and the rinsing liquid that remain between the patterns and inside the pattern are removed by baking. Furthermore, an effect that the pattern is annealed to improve the surface roughness of a pattern is obtained by the present step. The baking step after the rinsing step is usually performed at a heating temperature of 40° C. to 250° C. (preferably 90° C. to 200° C.), usually for 10 seconds to 3 minutes (preferably for 30 seconds to 120 seconds).

Moreover, an etching treatment of a substrate may be carried out using the formed pattern as a mask. That is, the substrate (or the underlayer film and the substrate) may be processed using the pattern formed in Step 3 as a mask, thereby forming a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern formed in Step 3 as a mask is preferable.

The dry etching may be either one-stage etching or multi-stage etching. In a case where the etching is etching including a plurality of stages, the etchings at the respective stages may be the same treatment or different treatments.

For etching, any of known methods can be used, and various conditions and the like are appropriately determined according to the type of a substrate, usage, and the like. Etching can be carried out, for example, in accordance with The International Society for Optical Engineering (Proc. of SPIE), Vol. 6924, 692420 (2008), JP2009-267112A, and the like. In addition, etching can also be carried out in accordance with "Chapter 4 Etching" in "Semiconductor Process Text Book, 4th Ed., published in 2007, publisher: SEMI Japan".

Among those, as the dry etching, oxygen plasma etching is preferable.

It is preferable that various materials (for example, a solvent, a developer, a rinsing liquid, a composition for forming an antireflection film, and a composition for forming a topcoat) used in the resist composition of the embodiment of the present invention and the pattern forming method of the embodiment of the present invention do not include impurities such as metals. A content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Pb, Ti, V, W, and Zn.

Examples of a method for removing impurities such as metals from the various materials include filtration using a filter. With regard to the filter pore diameter, the pore size is preferably less than 100 nm, more preferably 10 nm or less, and still more preferably 5 nm or less. As the filter, a polytetrafluoroethylene-made, polyethylene-made, or nylon-made filter is preferable. The filter may be constituted with a composite material formed by combining the filter material with an ion exchange medium. As the filter, a filter which had been washed with an organic solvent in advance may be used. In the step of filtration using a filter, a plurality of kinds of filters may be connected in series or in parallel, and used. In a case of using the plurality of kinds of filters, a combination of filters having different pore diameters and/or materials may be used. In addition, various materials may be filtered plural times, and the step of filtering plural times may be a circulatory filtration step.

In the production of the resist composition, it is preferable that after dissolving a resin and the respective components such as a photoacid generator in a solvent, circulatory filtration is performed using a plurality of filters with different materials. For example, it is preferable to connect a polyethylene-made filter with a pore diameter of 50 nm, a nylon-made filter with a pore diameter of 10 nm, and a polyethylene-made filter with a pore diameter of 3 nm in permuted connection, and then perform circulatory filtration ten times or more. A smaller pressure difference among the filters is preferable, and the pressure difference is generally 0.1 MPa or less, preferably 0.05 MPa or less, and more preferably 0.01 MPa or less. A smaller pressure difference between the filter and the charging nozzle is also preferable, and the pressure difference is generally 0.5 MPa or less, preferably 0.2 MPa or less, and more preferably 0.1 MPa or less.

A part or all of an apparatus used in a step for producing raw materials (a resin, a photoacid generator, and the like) (a step for synthesizing the raw materials, or the like) of the resist composition is preferably subjected to a glass lining treatment since the content of metal impurities in the resist composition is reduced to a small amount (for example, on the order of ppt by mass). Such a method is described, for example, in the Chemical Daily on Dec. 21, 2017.

It is preferable to subject the inside of a device for producing the resist composition to gas replacement with inert gas such as nitrogen. In this manner, it is possible to suppress active gas such as oxygen from being dissolved in the composition.

After being filtered by a filter, the resist composition is charged into a clean container. It is preferable that the resist composition charged in the container is subjected to cold storage. In this manner, performance degradation over time is suppressed. A shorter period of time between completion of the charge of the composition into the container and initiation of refrigeration storage is preferable, and it is generally up to 24 hours, preferably up to 16 hours, more preferably up to 12 hours, and still more preferably up to 10 hours. The storage temperature is preferably 0° C. to 15° C., more preferably 0° C. to 10° C., and still more preferably 0° C. to 5° C.

Moreover, examples of a method for reducing the impurities such as a metal included in various materials include a method of selecting raw materials having a low content of metals as raw materials constituting various materials, a method of subjecting raw materials constituting various materials to filtration using a filter, and a method of performing distillation under the condition with the contamination suppressed as much as possible by, for example, lining the inside of a device with TEFLON (registered trademark).

In addition to filtration using a filter, removal of impurities by an adsorbing material may be performed, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used. It is necessary to prevent the incorporation of metal impurities in the production process in order to reduce the impurities such as metals included in the various materials. Sufficient removal of metal impurities from a production device can be confirmed by measuring the content of metal components included in a washing liquid used to wash the production device. The content of the metal components included in the washing liquid after the use is preferably 100 parts per trillion (ppt) by mass or less, more preferably 10 ppt by mass or less, and still more preferably 1 ppt by mass or less.

An electrically conductive compound may be added to an organic treatment liquid such as a rinsing liquid in order to prevent failure of chemical liquid pipe and various parts (a filter, an O-ring, a tube, or the like) due to electrostatic charge, and subsequently generated electrostatic discharge. The electrically conductive compound is not particularly limited and examples thereof include methanol. The addition amount is not particularly limited, but from the viewpoint that preferred development characteristics or rinsing characteristics are maintained, the addition amount is preferably 10% by mass or less, and more preferably 5% by mass or less.

For the chemical liquid pipe, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or a fluorine resin (a polytetrafluoroethylene or perfluoroalkoxy resin, or the like) that has been subjected to an antistatic treatment can be used.

A method for improving the surface roughness of a pattern may be applied to a pattern formed by the method of the embodiment of the present invention. Examples of the method for improving the surface roughness of the pattern include the method of treating a pattern by plasma of a hydrogen-containing gas disclosed in WO2014/002808A1. Additional examples of the method include known methods as described in JP2004-235468A, US2010/0020297A, JP2008-083384A, and Proc. of SPIE Vol. 8328 83280N-1 "EUV Resist Curing Technique for LWR Reduction and Etch Selectivity Enhancement".

In a case where a pattern formed is in the form of a line, an aspect ratio determined by dividing a height of the pattern with a line width is preferably 2.5 or less, more preferably 2.1 or less, and still more preferably 1.7 or less.

In a case where a pattern formed is in the form of a trench (groove) pattern or a contact hole pattern, an aspect ratio determined by dividing a height of the pattern with the trench width or the hole diameter is preferably 4.0 or less, more preferably 3.5 or less, and still more preferably 3.0 or less.

The pattern forming method of the embodiment of the present invention can also be used for guide pattern formation in a directed self-assembly (DSA) (see, for example, ACS Nano Vol. 4, No. 8, Pages 4815-4823).

In addition, a pattern formed by the method can be used as a core material (core) of the spacer process disclosed in, for example, JP1991-270227A (JP-H03-270227A) and JP2013-164509A.

[Method for Manufacturing Electronic Device]

Moreover, the present invention further relates to a method for manufacturing an electronic device, the method including the above-described pattern forming method.

The electronic device of an embodiment of the present invention is suitably mounted on electric or electronic equipment (for example, home electronics, office automation (OA), media-related equipment, optical equipment, and telecommunication equipment).

[Method for Producing Mask Blank with Resist Film and Photomask]

The present invention also relates to a mask blank with a resist film, which includes a mask blank and a resist film disposed on the mask blank.

In addition, the present invention relates to a method for producing a photomask, including a step of exposing such a mask blank with a resist film and a step of developing the exposed mask blank with a resist film using a developer.

In a case where a pattern is formed on a photomask blank for producing a photomask, examples of a transparent substrate include a transparent substrate such as quartz and calcium fluoride. In general, a functional film such as a light-shielding film, an antireflection film, a phase shift film, and additionally, an etching stopper film, and an n-etch mask film, as necessary, are laminated on the substrate. As a material of the functional film, a film containing a transition metal such as silicon or chromium, molybdenum, zirconium, tantalum, tungsten, titanium, or niobium is laminated. Examples of the material for the outermost layer include silicon or a material containing silicon and/or oxygen and/or nitrogen as a main constituent material, and silicon containing a material containing a transition metal as a main constituent material. A compound material, at least one selected from transition metals (especially chromium, molybdenum, zirconium, tantalum, tungsten, titanium, or niobium, etc.); and at least one element selected from oxygen, nitrogen, or carbon as the transition metal. A transition metal compound material having the above-mentioned material as a main constituent material is exemplified.

The light-shielding film may have a single-layer structure, but preferably has a multilayer structure in which a plurality of materials are repeatedly applied. In the case of a multilayer structure, the thickness of a film per layer is not particularly limited, but is preferably 5 nm to 100 nm, and more preferably 10 nm to 80 nm. A thickness of the entire light-shielding film is not particularly limited, but is preferably 5 nm to 200 nm, and more preferably 10 nm to 150 nm.

As a method of obtaining a mask blank with a resist film by disposing a resist film on a photomask blank, reference can be made to the above-mentioned method as Step 1 (resist film forming step) in the procedure of the pattern forming method. For example, in Step 1 (resist film forming step), a method in which a substrate on which a resist composition is to be applied is used as a mask blank is mentioned.

As a method of performing the step of exposing the mask blank with a resist film, reference can be made to the method described above as Step 2 (exposing step).

As a method of carrying out the step of developing the exposed mask blank with a resist film using a developer, reference can be made to the method described above as Step 3 (developing step) can be referred to.

Examples

Hereinafter, the present invention will be described in more detail with reference to Examples, but the present invention is not limited thereto.

[Resist Composition]

An actinic ray-sensitive or radiation-sensitive resin composition (resist composition) was prepared using the following components.

<Resin>

(Synthesis Example 1: Synthesis of Resin P-1)

30.0 g, 40.0 g, and 30.0 g of monomers corresponding to the respective repeating units (M-1/M-6/M-25), in order from the left, of the resin P-1, and a polymerization initiator V-601 (manufactured by Wako Pure Chemical Industries, Ltd.) (3.17 g) were dissolved in cyclohexanone (356 g). A solution thus obtained was used as a monomer solution.

Cyclohexanone (191.0 g) was charged into a reaction vessel and the monomer solution was added dropwise to the reaction vessel which had been adjusted to 85° C. over 4 hours in a nitrogen gas atmosphere. The obtained reaction solution was stirred at 85° C. for 2 hours in a reaction vessel and then left to be cooled to room temperature.

The cooled reaction solution was added dropwise to a mixed liquid of methanol and water (methanol/water=5/5 (mass ratio)) over 20 minutes, and the precipitated powder was collected by filtration. The obtained powder was dried to obtain a resin P-1 (31.6 g).

The compositional ratio (mass ratio) of the repeating units determined by NMR (nuclear magnetic resonance) was 30/40/30. The weight-average molecular weight of the resin P-1 by GPC was 8,000 in terms of standard polystyrene, and the dispersity (Mw/Mn) was 1.6.

Other resins were synthesized by the same procedure or a known procedure.

The repeating units used for the resins P-1 to P-13 are shown below. Further, the compositional ratio (mass ratio), the weight-average molecular weight (Mw), and the dispersity of the respective resins are shown in the following table. The compositional ratios correspond to the respective repeating units in order from the left.

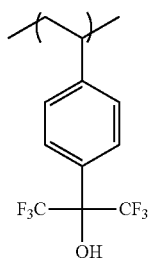

M-1

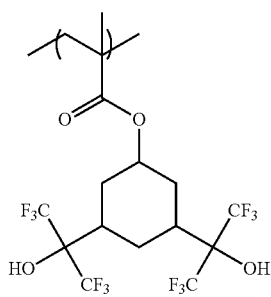

M-2

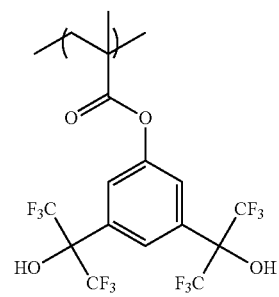

M-3

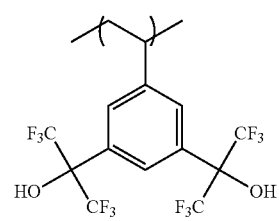

M-4

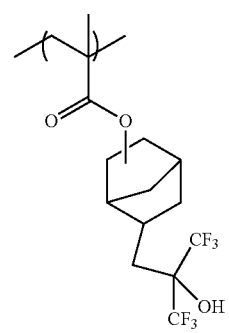

M-5

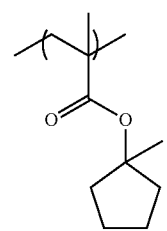

M-6

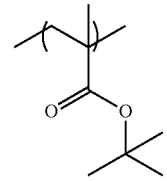

M-7

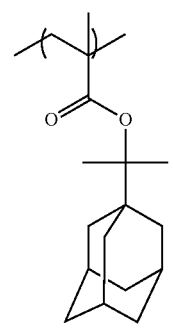

M-8

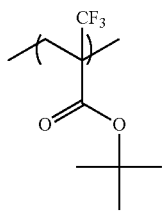 M-9
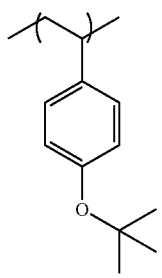 M-10
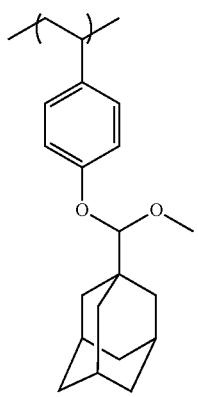 M-11
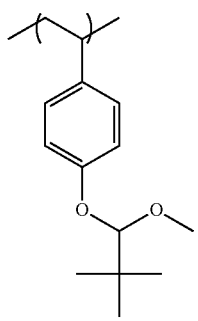 M-12
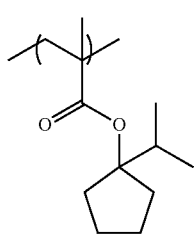 M-13
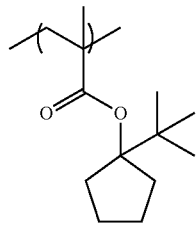 M-14
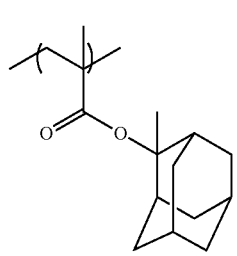 M-15
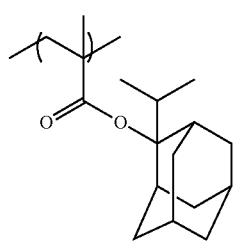 M-16
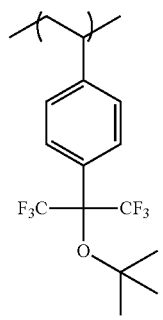 M-17
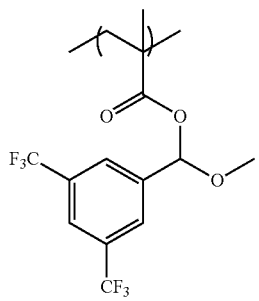 M-18

-continued
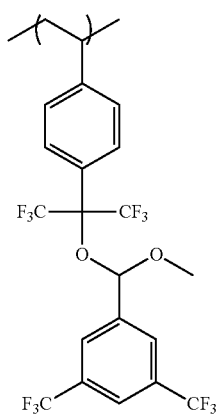
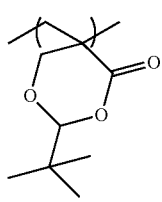
M-20
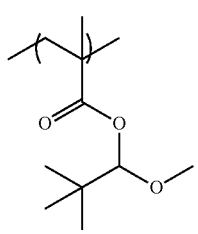
M-21
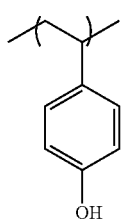
M-22
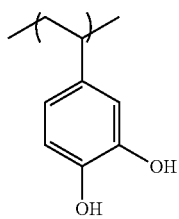
M-23
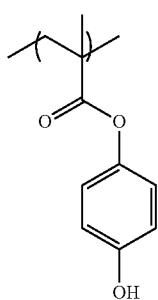
M-24
-continued
M-19
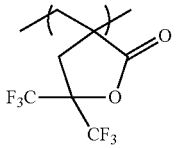
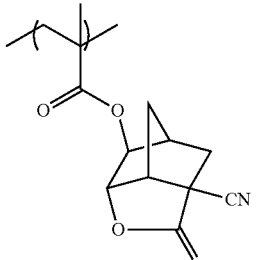
M-25
M-26
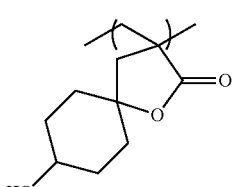
M-27
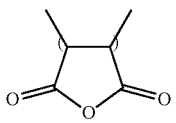
M-28
M-29
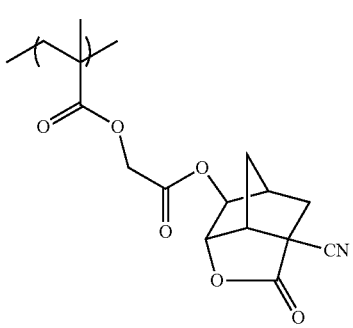
M-30
M-31
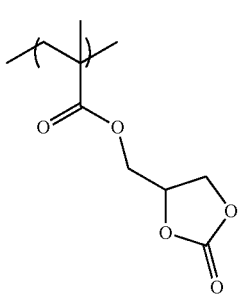

-continued

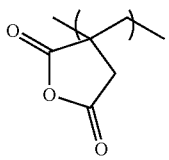
M-32

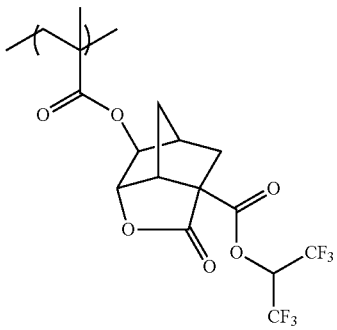
M-33

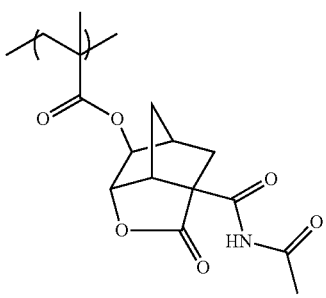
M-34

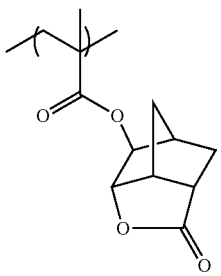
M-35

<Compound Y or Basic Substance>

A compound Y (a basic compound or ammonium salt compound whose basicity is reduced upon irradiation with actinic rays or radiation) and a basic substance which does not correspond to the compound Y used in Examples are shown below.

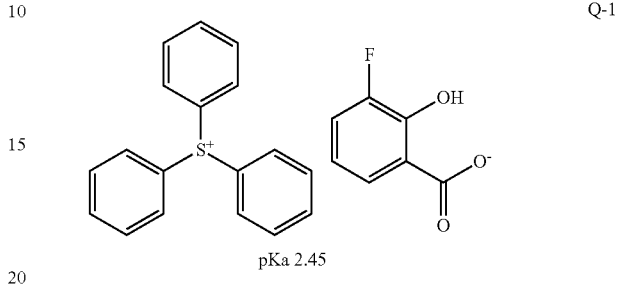
Q-1 pKa 2.45

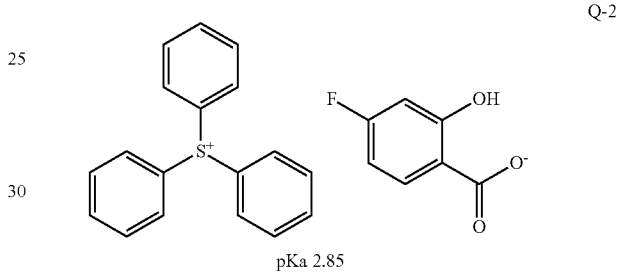
Q-2 pKa 2.85

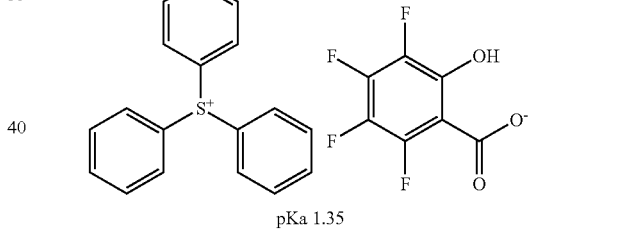
Q-3 pKa 1.35

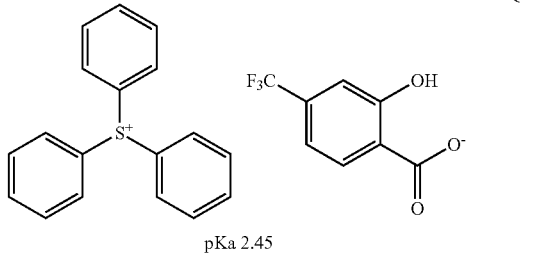
Q-4 pKa 2.45

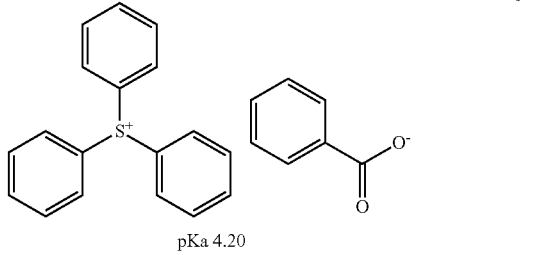
Q-5 pKa 4.20

TABLE 1

| | Compositional (mass ratio) | Weight-average molecular weight | Dispersity |
|---|---|---|---|
| P-1 | M-1/M-6/M-25 = 30/40/30 | 8,000 | 1.6 |
| P-2 | M-2/M-7/M-19/M-26 = 40/20/10/30 | 8,000 | 1.5 |
| P-3 | M-3/M-8/M-22/M-27 = 30/30/10/30 | 4,000 | 1.4 |
| P-4 | M-4/M-9/M-23/M-28 = 30/40/10/20 | 6,000 | 1.4 |
| P-5 | M-5/M-10/M-24/M-29 = 30/30/10/30 | 8,000 | 1.3 |
| P-6 | M-3/M-11/M-30 = 40/30/30 | 12,000 | 1.4 |
| P-7 | M-2/M-12/M-31 = 30/40/30 | 4,000 | 1.4 |
| P-8 | M-2/M-13/M-21/M-32 = 30/30/30/10 | 6,000 | 1.4 |
| P-9 | M-4/M-14/M-15/M-33 = 30/20/20/30 | 8,000 | 1.5 |
| P-10 | M-3/M-16/M-17/M-34 = 30/20/20/30 | 12,000 | 1.3 |
| P-11 | M-1/M-18/M-20/M-26/M-25 = 30/20/20/10/20 | 6,000 | 1.7 |
| P-12 | M-22/M-7/M-26 = 30/40/30 | 8,000 | 1.6 |
| P-13 | M-2/M-7/M-35 = 40/30/30 | 8,000 | 1.5 |

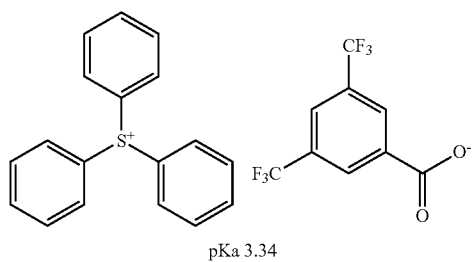
(Q-6)

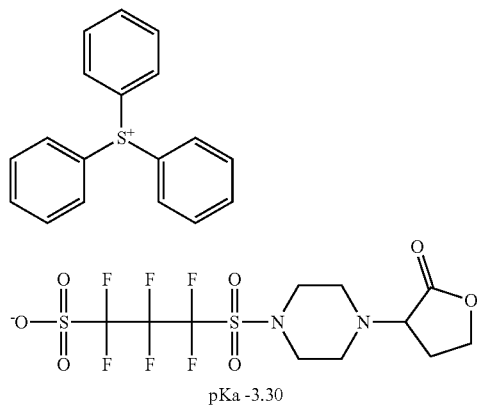
(Q-7)

(Q-8)

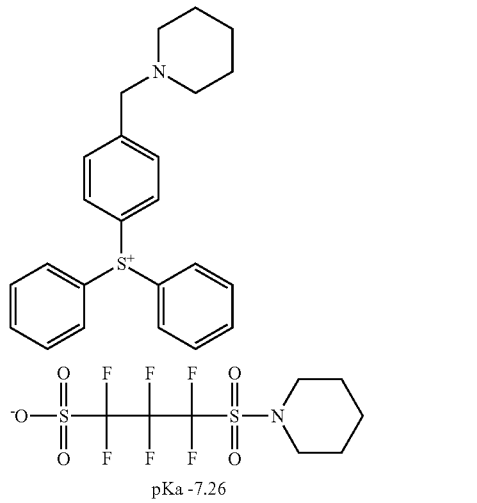
(Q-9)

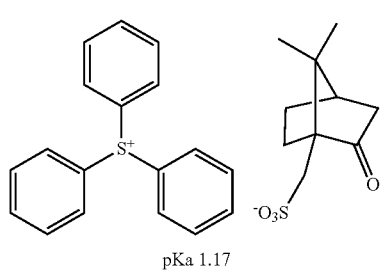
(Q-10)

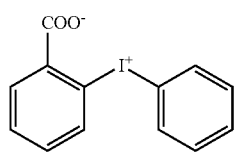

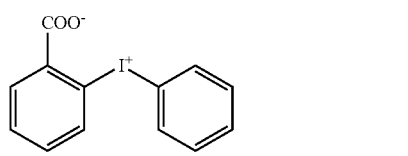

(Q-11)

(Q-12)

(Q-13)

(Q-14)

In the list, the pka of each of Q-1 to Q-10 and Q-14 is a pka for a conjugate acid (an acid generated upon exposure), which was calculated using "Software V11.02 (1994-2013 ACD/Labs)" (trade name, Advanced Chemistry Development).

In the list, the pka of each of Q-11 to Q-13 is a pka of the whole compounds calculated by the same method.

In addition, for Q-10, the pka could not be calculated.

<Photoacid Generator>

As the photoacid generator, a photoacid generator formed of a combination of a cation and an anion shown below was used. It should be noted that in the following list, PAG-Cation 10 is an amphoteric ion having a cation moiety and an anion moiety in one molecule, and acts alone as a photoacid generator.

(Cation)

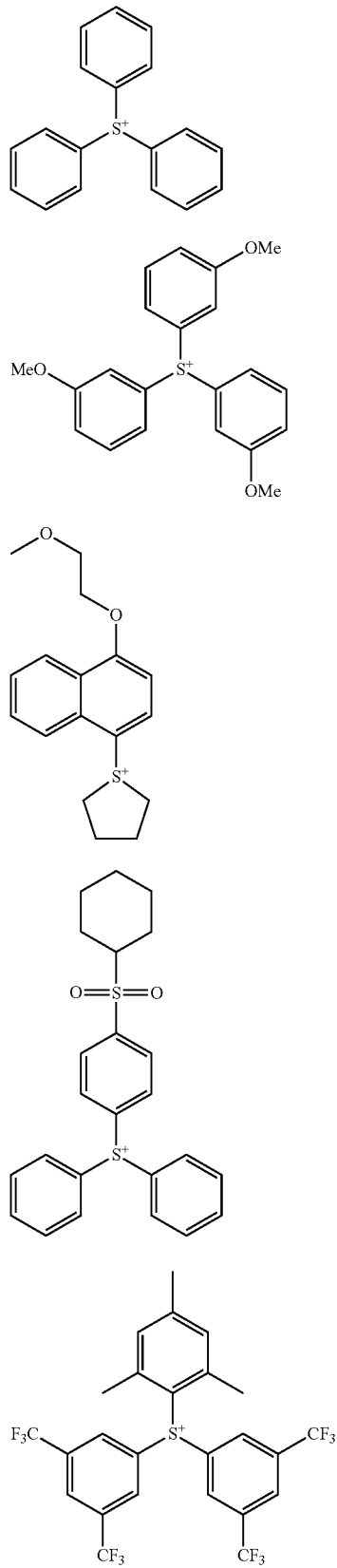

PAG-Cation1

PAG-Cation2

PAG-Cation3

PAG-Cation4

PAG-Cation5

PAG-Cation6
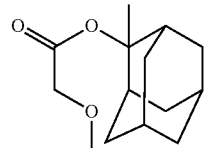

PAG-Cation7
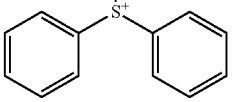

PAG-Cation8
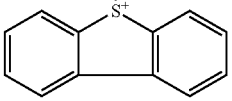

PAG-Cation9

PAG-Cation10
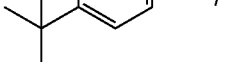

(Anion)

The volume described in the following list indicates the pka and volume of an acid generated from the photoacid generator. The pka and the volume of the acid were calculated by the methods described in the specification.

Incidentally, the volume of the acid generated upon exposure of the above-mentioned PAG-Cation 10 was 298 Å$^3$.

In addition, the pka of the acid generated upon exposure of the PAG-Cation 10 could not be calculated.

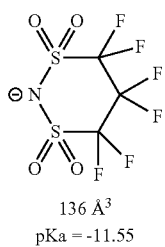
136 Å³
pKa = -11.55
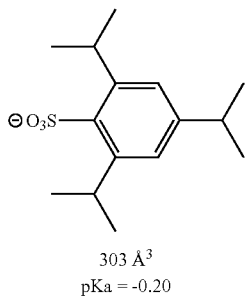
303 Å³
pKa = -0.20
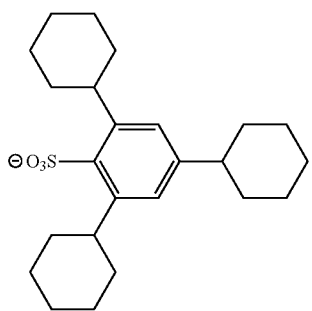
437 Å³
pKa = -0.22
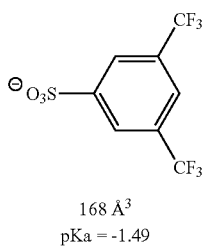
168 Å³
pKa = -1.49
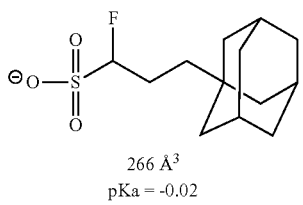
266 Å³
pKa = -0.02
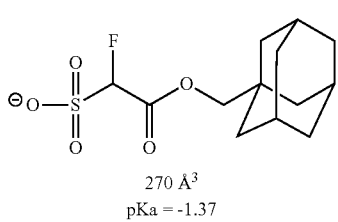
270 Å³
pKa = -1.37
-continued
PAG-Anion-7
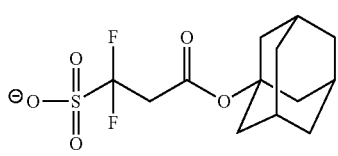
271 Å³
pKa = -2.43
PAG-Anion-8
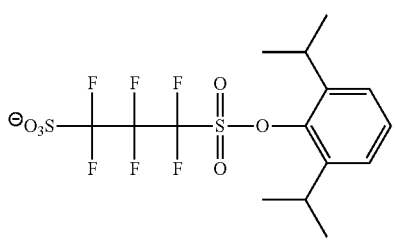
347 Å³
pKa = -3.40
PAG-Anion-9
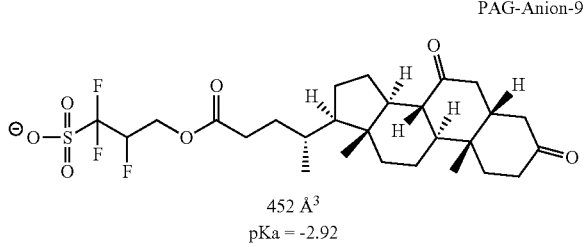
452 Å³
pKa = -2.92
PAG-Anion-10
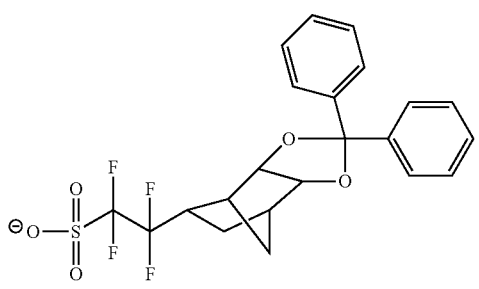
354 Å³
pKa = -2.80
PAG-Anion-11
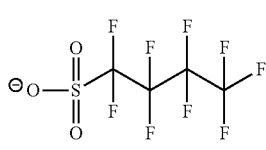
135 Å³
pKa = -3.57
PAG-Anion-12
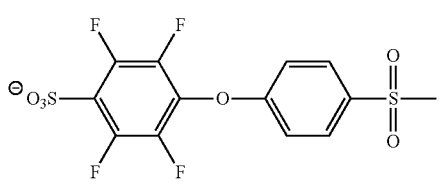
257 Å³
pKa = 0.24
PAG-Anion-1
PAG-Anion-2
PAG-Anion-3
PAG-Anion-4
PAG-Anion-5
PAG-Anion-6

-continued

PAG-Anion-13

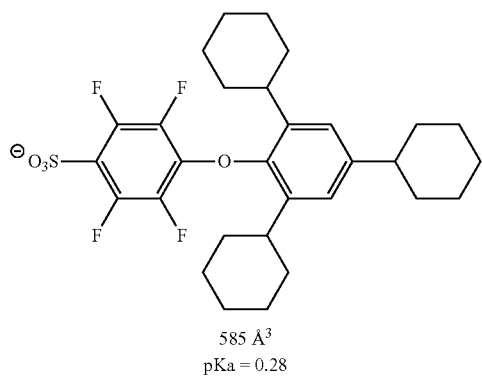

585 Å³
pKa = 0.28

PAG-Anion-14

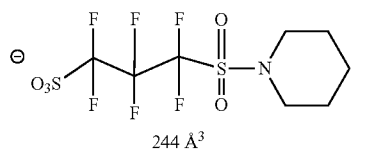

244 Å³
pKa = -3.27

PAG-Anion-15

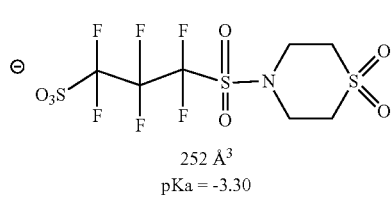

252 Å³
pKa = -3.30

PAG-Anion-16

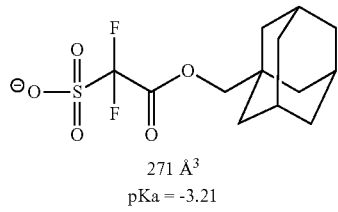

271 Å³
pKa = -3.21

<Hydrophobic Resin>

The numerical values in the following formula represent the mass ratios (% by mass) of the respective repeating units.

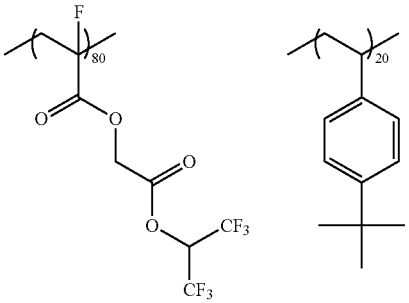

ADP-1

Mw = 14,000
Mw/Mn = 1.7

<Surfactant>

W-1: MEGAFACE F176 (manufactured by DIC Corporation; fluorine-based) W-2: MEGAFACE R08 (manufactured by DIC Corporation; fluorine and silicon-based)

<Solvent>

SL-1: Propylene glycol monomethyl ether acetate (PGMEA)
SL-2: Propylene glycol monomethyl ether (PGME)
SL-3: Ethyl lactate
SL-4: γ-Butyrolactone
SL-5: Cyclohexanone <Preparation of Composition>

The respective components were mixed at the solid content concentrations and compositions shown in the following table, and the mixtures were filtered through a polyethylene filter having a pore size of 0.03 μm to prepare each of resist compositions.

The contents (% by mass) of the respective components described in the following columns of "Resin", the column of "Compound Y or basic substance", the column of "Photoacid generator", the column of "Hydrophobic resin", and the column of "Surfactant" indicate the ratios of the respective components with respect to the total solid content. A description in the column of "Solvent" indicates the mass ratio of the content of each solvent.

TABLE 2

| | Concentration of solid components (% by mass) | Resin Type | Resin Content (% by mass) | Compound Y or basic substance Type | Compound Y or basic substance Content (% by mass) | Photoacid generator 1 Cation | Photoacid generator 1 Anion | Photoacid generator 1 Content (% by mass) | Photoacid generator 2 Cation | Photoacid generator 2 Anion | Photoacid generator 2 Content (% by mass) | Hydrophobic resin (% by mass) | Surfactant (% by mass) | Solvent (% by mass) |
|---|---|---|---|---|---|---|---|---|---|---|---|---|---|---|
| R-1 | 1.4 | P-1 | 74.0 | Q-10 | 1.0 | PAG-Cation 1 | PAG-Anion 1 | 15.0 | PAG-Cation 1 | PAG-Anion 12 | 10.0 | | | SL-1/SL-2/SL-3 = 30/20/50 |
| R-2 | 1.6 | P-2 | 79.2 | Q-9 | 0.8 | PAG-Cation 8 | PAG-Anion 4 | 20.0 | | | | | | SL-1/SL-3 = 60/40 |
| R-3 | 1.2 | P-3 | 83.8 | Q-1 | 1.2 | PAG-Cation 2 | PAG-Anion 13 | 15.0 | | | | | | SL-1/SL-2 = 60/40 |
| R-4 | 1.3 | P-4 | 71.9 | Q-4 | 2.1 | PAG-Cation 3 | PAG-Anion 14 | 26.0 | | | | | | SL-1/SL-2 = 90/10 |
| R-5 | 1.6 | P-5 | 80.0 | Q-5 | 4.0 | PAG-Cation 4 | PAG-Anion 8 | 8.0 | PAG-Cation 4 | PAG-Anion 6 | 8.0 | | | SL-1 = 100 |
| R-6 | 1.6 | P-6 | 74.7 | Q-6 | 5.0 | PAG-Cation 5 | PAG-Anion 8 | 20.0 | | | | | W-1(0.3) | SL-3 = 100 |
| R-7 | 1.4 | P-7 | 80.7 | Q-3 | 1.3 | PAG-Cation 7 | PAG-Anion 13 | 13.0 | PAG-Cation 7 | PAG-Anion 5 | 3.0 | ADP-1(20) | | SL-1 = 100 |
| R-8 | 1.4 | P-8 | 69.5 | Q-5 | 9.0 | PAG-Cation 1 | PAG-Anion 3 | 12.0 | PAG-Cation 1 | PAG-Anion 7 | 9.0 | | W-2(0.5) | SL-1/SL-3 = 80/20 |
| R-9 | 1.6 | P-9 | 84.3 | Q-3 | 1.7 | PAG-Cation 6 | PAG-Anion 9 | 14.0 | | | | | | SL-1/SL-3 = 80/20 |
| R-10 | 1.5 | P-10 | 86.6 | Q-4 | 1.4 | PAG-Cation 8 | PAG-Anion 9 | 12.0 | | | | | | SL-1/SL-3 = 90/10 |
| R-11 | 1.4 | P-11 | 77.6 | Q-4 | 2.4 | PAG-Cation 4 | PAG-Anion 10 | 20.0 | | | | | | SL-1/SL-2/SL-3 = 30/20/50 |
| R-12 | 1.6 | P-1 | 80.0 | Q-2 | 6.0 | PAG-Cation 9 | PAG-Anion 15 | 14.0 | | | | | | SL-1/SL-2/SL-3 = 60/20/20 |
| R-13 | 1.6 | P-2 | 72.0 | Q-8 | 8.0 | PAG-Cation 1 | PAG-Anion 2 | 12.0 | PAG-Cation 1 | PAG-Anion 11 | 9.0 | ADP-1(1.5) | | SL-1/SL-2 = 70/30 |
| R-14 | 1.4 | P-3 | 75.3 | Q-3 | 3.2 | PAG-Cation 10 | — | 20.0 | | | | | | SL-1/SL-3/SL-4 = 30/60/10 |
| R-15 | 1.3 | P-4 | 76.0 | Q-7 | 6.0 | PAG-Cation 1 | PAG-Anion 16 | 18.0 | | | | | | SL-1/SL-3/SL-5 = 30/40/30 |
| R-16 | 1.4 | P-12 | 74.0 | Q-11 | 1.0 | PAG-Cation 1 | PAG-Anion 15 | 25.0 | | | | | | SL-1/SL-2/SL-3 = 30/20/50 |
| R-17 | 1.4 | P-13 | 74.0 | Q-12 | 1.0 | PAG-Cation 1 | PAG-Anion 15 | 25.0 | | | | | | SL-1/SL-2/SL-3 = 30/20/50 |
| R-18 | 1.4 | P-13 | 74.0 | Q-13 | 1.0 | PAG-Cation 1 | PAG-Anion 15 | 25.0 | | | | | | SL-1/SL-2/SL-3 = 30/20/50 |
| R-19 | 1.4 | P-13 | 74.0 | Q-14 | 1.0 | PAG-Cation 1 | PAG-Anion 15 | 25.0 | | | | | | SL-1/SL-2/SL-3 = 30/20/50 |

[Pattern Formation]

A pattern was formed using the resist composition. In the formation of the pattern, a developer and a rinsing liquid, and an underlayer film described below were used.

<Developer and Rinsing Liquid>

D-1: 3.00%-by-mass Aqueous tetramethylammonium hydroxide solution

D-2: 2.38%-by-mass Aqueous tetramethylammonium hydroxide solution

Thereafter, after baking (post-exposure baking; PEB) under the condition shown in the column of "PEB/Development condition" of Table 3 shown below, the substrate was puddle-developed with a developer shown in Table 3 for 30 seconds and puddle-rinsed with a rinsing liquid shown in Table 3. Thereafter, the silicon wafer was rotated at a rotation speed of 4,000 rpm for 30 seconds and further baked at 90° C. for 60 seconds to obtain a line-and-space pattern having a pitch of 40 nm and a line width of 20 nm (space width of 20 nm).

TABLE 3

| | Resist composition | Under- layer film | Film thickness (nm) | Bake | PEB | Developer | Rinsing liquid |
|---|---|---|---|---|---|---|---|
| | | | Conditions for resist film formation and application | | Conditions for PEB/development | | |
| Example 1 | R-1 | UL-1 | 30 | 100° C./60 sec | 120° C./60 sec | D-2 | D-6 |
| Example 2 | R-2 | UL-1 | 35 | 120° C./60 sec | 90° C./60 sec | D-2 | D-6 |
| Example 3 | R-3 | UL-1 | 25 | 100° C./60 sec | 90° C./60 sec | D-2 | D-7 |
| Example 4 | R-4 | UL-1 | 30 | 90° C./60 sec | 105° C./30 sec | D-4 | D-6 |
| Example 5 | R-5 | UL-2 | 35 | 100° C./60 sec | 100° C./50 sec | D-2 | D-6 |
| Example 6 | R-6 | UL-2 | 30 | 100° C./45 sec | 120° C./60 sec | D-1 | D-6 |
| Example 7 | R-7 | UL-1 | 35 | 120° C./60 sec | 120° C./60 sec | D-2 | D-6 |
| Example 8 | R-8 | UL-1 | 30 | 100° C./60 sec | 110° C./60 sec | D-2 | D-7 |
| Example 9 | R-9 | UL-1 | 35 | 90° C./60 sec | 100° C./60 sec | D-2 | D-6 |
| Example 10 | R-10 | UL-1 | 35 | 100° C./60 sec | 120° C./45 sec | D-3 | D-7 |
| Example 11 | R-11 | UL-1 | 30 | 100° C./60 sec | 100° C./60 sec | D-2 | D-6 |
| Example 12 | R-12 | UL-2 | 35 | 120° C./60 sec | 100° C./60 sec | D-2 | D-7 |
| Example 13 | R-13 | UL-2 | 30 | 100° C./50 sec | 120° C./60 sec | D-5 | D-6 |
| Example 14 | R-14 | UL-1 | 30 | 90° C./60 sec | 90° C./60 sec | D-2 | D-6 |
| Example 15 | R-15 | UL-1 | 25 | 100° C./60 sec | 105° C./60 sec | D-2 | D-6 |
| Comparative Example 1 | R-16 | UL-1 | 40 | 100° C./60 sec | 100° C./60 sec | D-2 | D-7 |
| Comparative Example 2 | R-17 | UL-1 | 35 | 120° C./60 sec | 90° C./60 sec | D-2 | D-6 |
| Comparative Example 3 | R-18 | UL-2 | 30 | 100° C./60 sec | 110° C./60 sec | D-2 | D-6 |
| Comparative Example 4 | R-19 | UL-1 | 30 | 90° C./60 sec | 105° C./60 sec | D-2 | D-6 |

D-3: 1.50%-by-mass Aqueous tetramethylammonium hydroxide solution

D-4: 1.00%-by-mass Aqueous tetramethylammonium hydroxide solution

D-5: 0.80%-by-mass Aqueous tetramethylammonium hydroxide solution

D-6: Pure water

D-7: FIRM Extreme 10 (manufactured by AZEM)

<Underlayer Film>

UL-1: AL412 (manufactured by Brewer Science)

UL-2: {SHB-A940} (manufactured by Shin-Etsu Chemical Co., Ltd.)

<Pattern Forming Method>

A resist composition described in Table 3 was applied onto a silicon wafer (12 inches) on which an underlayer film described in Table 3 shown later had been formed, and a coating film thus obtained was heated under a baking condition described in the column of "Condition for resist film formation and application" in Table 3 to form a resist film having a film thickness described in Table 3, thereby obtaining a silicon wafer having the resist film.

The silicon wafer having the resist film thus obtained was subjected to pattern irradiation using an EUV exposure device (manufactured by Exitech Ltd., Micro Exposure Tool, NA 0.3, Quadrupole, an outer sigma of 0.68, and an inner sigma of 0.36). Further, a mask with a line size=20 nm and a line:space=1:1 was used as a reticle.

[Evaluation]

The following evaluations shown below were carried out using the resist film and the pattern, each obtained by the methods.

<Sensitivity>

The line width of the line-and-space pattern formed was measured while changing the exposure dose, and the exposure dose (optimal exposure dose) at a time of the line width reaching 20 nm was determined and was defined as a sensitivity (mJ/cm$^2$). The smaller the value, the higher the sensitivity of the resist film and the better the performance.

<LER (LER performance)>

With regard to the observation of the line-and-space resist pattern resolved at the optimal exposure dose in the sensitivity evaluation, the pattern was observed from an upper part thereof using a critical scanning electron microscope (SEM (CG-4100 manufactured by Hitachi High-Technologies Corporation)), and at this time, a distance from a center of the pattern to the edge was measured at any points (100 points), and a measurement variation thereof was evaluated by 3σ. A smaller value thereof indicates better LER performance.

<Collapse Performance (Pattern Collapse Suppressing Property)>

While the exposure dose was changed, the line width of the line-and-space pattern formed was measured. At this time, a minimum line width with which the pattern was resolved without collapse over 10 mm² was defined as a collapse line width. A smaller value thereof indicates a wider margin of the pattern collapse and a better pattern collapse suppressing property.

The results are shown in the table below.

In the table, the column of "n of unit A" shows a value of n in a case where a repeating unit corresponding to the repeating unit A in the resin X used in each resist composition is applied to General Formula (I).

The column of "Alicyclic group" shows whether J is an alicyclic group or not in a case where a repeating unit corresponding to the repeating unit A in the resin X used in each resist composition is applied to General Formula (I). A means that the requirement is satisfied and B means that the requirement is not satisfied.

The column of "Unit C" shows which of the repeating units c1 to c4 corresponds to the repeating unit C in the resin X used in each resist composition.

The column of "II-1, 11-2" shows whether the repeating unit c1 is General Formula (II-1) or (II-2) in a case where the repeating unit C has the repeating unit c1. A means that the requirement is satisfied and B means that the requirement is not satisfied.

The column of "Total % by mass of units A to C" shows the total content of repeating units corresponding to the repeating units A to C in the resin X used in each resist composition, with respect to the total mass of the resin X.

The column of "pka of acid generated" shows the pka of an acid (conjugate acid) generated upon exposure of the compound Y used in the resist composition of each Example.

The column of "Volume of acid generated" shows the volume of an acid generated from each photoacid generator used for each resist composition.

The columns of "pka Difference" in the columns of "Photoacid generator 1" and "Photoacid generator 2" each show a difference in pka between an acid generated by the compound Y and an acid generated by each photoacid generator.

The column of "Collapse" shows the evaluation result of the pattern collapse suppressing property.

TABLE 4

| | Type | Concentration of solid components (% by mass) | Resin n of unit A | Resin Alicyclic group | Resin Unit C | Resin II-1, II-2 | Resin Total % by mass of units A to C | Resin Dispersity | Compound Y or basic substance pka of acid generated | Photoacid generator 1 Volume of acid generated (Å³) | Photoacid generator 1 pka | Photoacid generator 1 pka Difference | Photoacid generator 2 Volume of acid generated (Å³) | Photoacid generator 2 pka | Photoacid generator 2 pka Difference | Sensitivity (mJ/cm²) | LER (nm) | Collapse (nm) |
|---|---|---|---|---|---|---|---|---|---|---|---|---|---|---|---|---|---|---|
| Example 1 | R-1 | 1.4 | 1 | B | c2 | — | 100 | 1.6 | Unmeasurable | 136 | −11.55 | — | 257 | 0.24 | — | 10.4 | 4.1 | 18 |
| Example 2 | R-2 | 1.6 | 2 | A | c1 | A | 100 | 1.5 | 1.17 | 168 | −1.49 | 2.66 | | | | 10.3 | 3.6 | 15 |
| Example 3 | R-3 | 1.2 | 2 | B | c2 | — | 90 | 1.4 | 2.45 | 585 | 0.28 | 2.17 | | | | 15.2 | 3.5 | 16 |
| Example 4 | R-4 | 1.3 | 2 | B | c4 | — | 90 | 1.4 | 2.45 | 244 | −3.27 | 5.72 | | | | 15.2 | 3.1 | 16 |
| Example 5 | R-5 | 1.6 | 1 | A | c2 | A | 90 | 1.3 | 4.20 | 347 | −3.40 | 7.60 | 270 | −1.37 | 5.57 | 15.2 | 3.0 | 17 |
| Example 6 | R-6 | 1.4 | 2 | B | c2 | — | 100 | 1.4 | 3.34 | 347 | −3.40 | 6.74 | | | | 10.3 | 3.1 | 16 |
| Example 7 | R-7 | 1.4 | 2 | A | c3 | A | 100 | 1.4 | 1.35 | 585 | 0.28 | 1.07 | 266 | −0.02 | 1.37 | 10.4 | 3.4 | 15 |
| Example 8 | R-8 | 1.4 | 2 | A | c4 | — | 100 | 1.4 | 4.20 | 437 | −0.22 | 4.42 | 271 | −2.43 | 6.63 | 10.6 | 3.0 | 15 |
| Example 9 | R-9 | 1.6 | 2 | B | c1 | — | 100 | 1.5 | 1.35 | 452 | −2.92 | 4.27 | | | | 10.4 | 3.1 | 16 |
| Example 10 | R-10 | 1.5 | 2 | B | c1 | B | 100 | 1.3 | 2.45 | 452 | −2.92 | 5.37 | | | | 10.7 | 3.1 | 16 |
| Example 11 | R-11 | 1.4 | 1 | B | c1/c2 | B | 100 | 1.7 | 2.45 | 354 | −2.80 | 5.25 | | | | 10.2 | 3.1 | 18 |
| Example 12 | R-12 | 1.6 | 1 | B | c2 | A | 100 | 1.6 | 2.85 | 252 | −3.30 | 6.15 | | | | 10.5 | 3.1 | 18 |
| Example 13 | R-13 | 1.6 | 2 | A | c1 | — | 100 | 1.5 | −7.26 | 303 | −0.20 | −7.06 | 135 | −3.57 | −3.69 | 10.3 | 4.1 | 15 |
| Example 14 | R-14 | 1.4 | 2 | B | c2 | A | 90 | 1.4 | 1.35 | 298 | Unmeasurable | — | | | | 15.3 | 3.5 | 16 |
| Example 15 | R-15 | 1.3 | 2 | B | c4 | — | 90 | 1.4 | −3.30 | 271 | −3.21 | −0.09 | | | | 16.2 | 4.1 | 16 |
| Example 16 | R-16 | 1.4 | — | — | — | — | — | 1.6 | — | 244 | −3.30 | — | | | | 38.0 | 4.4 | 20 |
| Comparative Example 1 | R-17 | 1.4 | — | — | — | — | — | 1.5 | — | 244 | −3.30 | — | | | | 20.0 | 4.5 | 21 |
| Comparative Example 2 | R-18 | 1.4 | — | — | — | — | — | 1.5 | — | 244 | −3.30 | — | | | | 19.6 | 4.6 | 22 |
| Comparative Example 3 | R-19 | 1.4 | — | — | — | — | — | 1.5 | 4.20 | 244 | −3.30 | 7.50 | | | | 19.8 | 4.8 | 21 |
| Comparative Example 4 | | | | | | | | | | | | | | | | | | |

From the results shown in the table, it was confirmed that in a case where the value of n in the repeating unit A was 2 or greater, the pattern collapse during pattern formation could be further suppressed (Comparison of Examples 1, 5, 11, and 12 vs. others Examples).

It was confirmed that in a case where J in the repeating unit A was an alicyclic group, the pattern collapse during pattern formation could be further suppressed (comparison of Examples 2, 7, 8, and 13 vs. Examples 3, 4, 6, 9, 10, 14, and 15 (comparison between Examples in which the value of n in the repeating unit A was 2 or greater). Comparison of Example 5 vs. Examples 1, 11, and 12 (comparison between Examples in which the value of n in repeating unit A was 1).

It was confirmed that in a case where the resin X has a repeating unit represented by General Formula (II-1) or (II-2), the sensitivity of the resist film was more excellent (comparison of Examples 2, 6, 11, and 13 vs. other Examples).

It was confirmed that in a case where the total content of the repeating units A to C in the resin X with respect to the total mass of the resin X was more than 90% by mass, the sensitivity of the resist film was more excellent (comparison of Examples 3 to 5, 14, and 15 vs. other Examples).

It was confirmed that in a case where the dispersity of the resin X was 1.0 to 1.5, pattern collapse during pattern formation could be further suppressed (comparison of Examples 1, 11, and 12 vs. other Examples).

It was confirmed that in a case where the compound Y generates an acid with a pka of 1.00 to 4.50 upon irradiation with actinic rays or radiation, the LER performance of the obtained pattern was more excellent (comparison of Examples 2 to 12, and 14 vs. other Examples).

It was confirmed that in a case where the difference between the pka of an acid generated by the compound Y and the pka of an acid generated by the photoacid generator Z was 3.00 or greater, the LER performance of a pattern thus obtained was more excellent (comparison of Examples 4 to 6 and 8 to 12 vs. other Examples).

It was confirmed that in a case where the content of the photoacid generator Z whose volume of generated acid was 240 Å$^3$ or more was 60% to 100% by mass with respect to the total mass of the photoacid generator Z in the actinic ray-sensitive or radiation-sensitive resin composition, it was confirmed that the LER performance of a pattern thus obtained was more excellent (comparison of Example 2 vs. Examples 3 to 12 and 14 (comparison between Examples in which a pka difference between the acid generated from the compound Y and the acid generated from the photoacid generator was 3.00 or greater)).

In a case where the resist composition includes two or more kinds of the photoacid generators Z, it was confirmed that the obtained pattern had better LER performance (the results of Examples 5 and 8; comparison of Example 7 vs. Examples 2, 3, and 14 (comparison between Examples in which the pka of the acid generated from the compound Y was 1 or more, and a pka difference between the acid generated from the compound Y and the acid generated from the photoacid generator was less than 3.00)).

What is claimed is:

1. An actinic ray-sensitive or radiation-sensitive resin composition comprising:
   a resin X having a repeating unit A represented by General Formula (I), a repeating unit B having an acid-decomposable group, and a repeating unit C selected from the group consisting of a repeating unit c1 represented by General Formula (II), a repeating unit c2 represented by General Formula (III), a repeating unit c3 having a carbonate ring group, and a repeating unit c4 having an anhydride ring group;
   a compound Y which is a basic compound or ammonium salt compound whose basicity is reduced upon irradiation with actinic rays or radiation; and
   a photoacid generator Z which is a compound other than the compound Y,

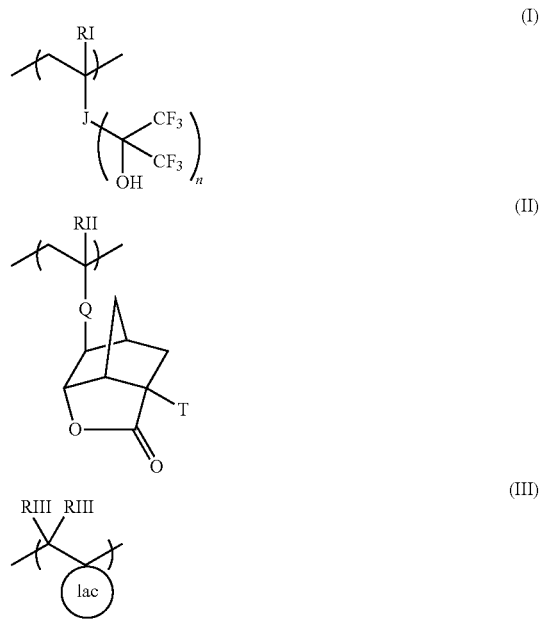

in General Formula (I), RI represents a hydrogen atom or a monovalent organic group, n represents an integer of 1 or greater, and J represents a (n+1)-valent linking group, in General Formula (II), RII represents a hydrogen atom or a monovalent organic group, Q represents a divalent linking group, and T represents a monovalent organic group, and in General Formula (III), RIII's each independently represent a hydrogen atom or a substituent, and lac represents a lactone ring group, and wherein the content of the resin X is 50% to 99.9% by mass with respect to the total solids content of the actinic ray-sensitive or radiation-sensitive resist composition.

2. The actinic ray-sensitive or radiation-sensitive resin composition according to claim 1,
   wherein n represents an integer of 2 or greater.

3. The actinic ray-sensitive or radiation-sensitive resin composition according to claim 1,
   wherein J represents an (n+1)-valent group having an alicyclic group.

4. The actinic ray-sensitive or radiation-sensitive resin composition according to claim 1,
   wherein the repeating unit A is a repeating unit represented by General Formula (I-a),

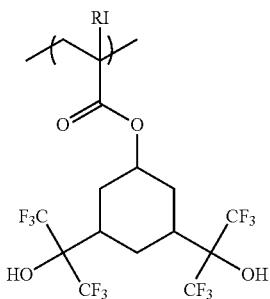

(I-a)

in General Formula (I-a), RI represents a hydrogen atom or a monovalent organic group.

5. The actinic ray-sensitive or radiation-sensitive resin composition according to claim 1,
wherein a content of the repeating unit A is 20% by mass or more with respect to a total mass of the resin X.

6. The actinic ray-sensitive or radiation-sensitive resin composition according to claim 1,
wherein the repeating unit B has a group represented by any of General Formulae (B-a) to (B-c),

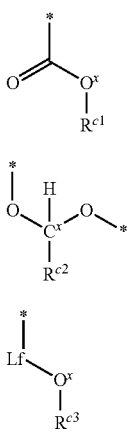

in General Formula (B-a), $O^x$ represents an oxygen atom, $R^{c1}$ represents a substituent in which the atom directly bonded to $O^x$ is a tertiary carbon atom, and
* represents a bonding position,
in General Formula (B-b), $C^x$ represents a carbon atom, $R^{c2}$ represents a substituent in which the atom directly bonded to $C^x$ is a tertiary carbon atom, and
* represents a bonding position, and
in General Formula (B-c), $O^x$ represents an oxygen atom, $R^{c3}$ represents a substituent in which the atom directly bonded to $O^x$ is a tertiary carbon atom,
Lf represents an aromatic ring group or a perfluoroalkylene group, and
* represents a bonding position.

7. The actinic ray-sensitive or radiation-sensitive resin composition according to claim 1,
wherein T represents a group represented by any of General Formula (II-a) to (II-c),

*—CN (II-a)

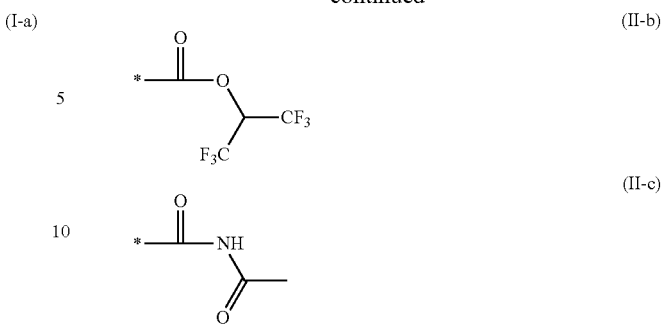

in General Formulae (II-a) to (II-c), * represents a bonding position.

8. The actinic ray-sensitive or radiation-sensitive resin composition according to claim 1,
wherein the resin X has a repeating unit selected from the group consisting of a repeating unit represented by General Formula (II-1) and a repeating unit represented by General Formula (II-2),

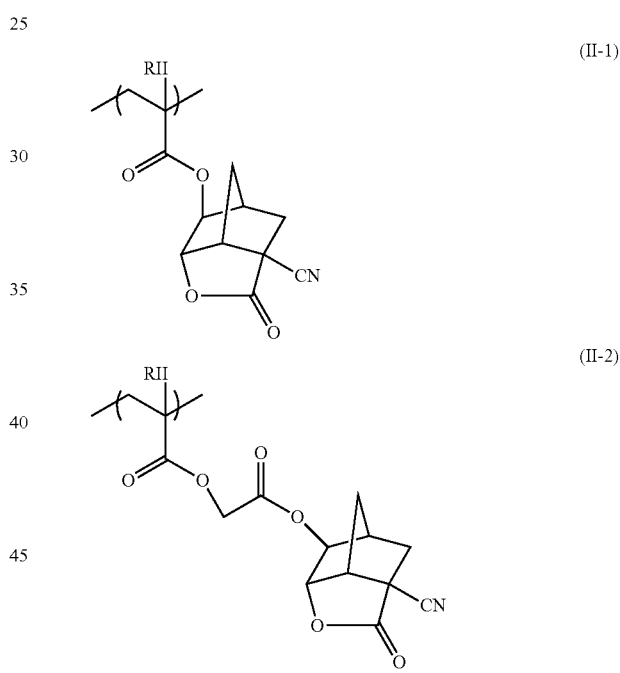

in General Formulae (II-1) and (II-2), RII represents a hydrogen atom or a monovalent organic group.

9. The actinic ray-sensitive or radiation-sensitive resin composition according to claim 1,
wherein the resin X has a dispersity of 1.0 to 1.5.

10. The actinic ray-sensitive or radiation-sensitive resin composition according to claim 1,
wherein a total content of the repeating unit A, the repeating unit B, and the repeating unit C is more than 90% by mass with respect to a total mass of the resin X.

11. The actinic ray-sensitive or radiation-sensitive resin composition according to claim 1,
wherein the compound Y generates an acid with a pka of 1.00 to 4.50 upon irradiation with actinic rays or radiation.

12. The actinic ray-sensitive or radiation-sensitive resin composition according to claim 1,
wherein the actinic ray-sensitive or radiation-sensitive resin composition comprises two or more kinds of the photoacid generators Z.

13. The actinic ray-sensitive or radiation-sensitive resin composition according to claim 1,
wherein a content of the photoacid generator Z whose volume of the generated acid is 240 $Å^3$ or more is 60% to 100% by mass with respect to a total mass of the photoacid generator Z in the actinic ray-sensitive or radiation-sensitive resin composition.

14. The actinic ray-sensitive or radiation-sensitive resin composition according to claim 1,
wherein the compound Y generates an acid upon irradiation with actinic rays or radiation, and
a difference between a pka of an acid generated by the compound Y and a pka of an acid generated by the photoacid generator Z is 3.00 or greater.

15. A resist film formed using the actinic ray-sensitive or radiation-sensitive resin composition according to claim 1.

16. The resist film according to claim 15,
wherein the resist film has a film thickness of 10 to 100 nm.

17. A pattern forming method comprising:
a step of forming a resist film using the actinic ray-sensitive or radiation-sensitive resin composition according to claim 1;
a step of exposing the resist film; and
a step of developing the exposed resist film using a developer.

18. The pattern forming method according to claim 17,
wherein the exposure is performed using electron beams or extreme ultraviolet rays.

19. A mask blank with a resist film, comprising:
a mask blank; and
the resist film according to claim 15 disposed on the mask blank.

20. A method for producing a photomask, comprising:
a step of exposing the mask blank with a resist film according to claim 19; and
a step of developing the exposed mask blank with a resist film using a developer.

21. A method for manufacturing an electronic device, comprising the pattern forming method according to claim 17.

* * * * *